(12) United States Patent
Choi et al.

(10) Patent No.: US 12,492,191 B2
(45) Date of Patent: Dec. 9, 2025

(54) ORGANIC LIGHT EMITTING DEVICE

(71) Applicant: LG CHEM, LTD., Seoul (KR)

(72) Inventors: Minwoo Choi, Daejeon (KR); Jaeeun Kim, Daejeon (KR); Minseung Chun, Daejeon (KR); Jungha Lee, jDaejeon (KR); Hyeon Soo Jeon, Daejeon (KR); Sang Young Jeon, Daejeon (KR)

(73) Assignee: LG CHEM, LTD., Seoul (KR)

( * ) Notice: Subject to any disclaimer, the term of this patent is extended or adjusted under 35 U.S.C. 154(b) by 974 days.

(21) Appl. No.: 17/619,682

(22) PCT Filed: Oct. 16, 2020

(86) PCT No.: PCT/KR2020/014140
§ 371 (c)(1),
(2) Date: Dec. 16, 2021

(87) PCT Pub. No.: WO2021/075895
PCT Pub. Date: Apr. 22, 2021

(65) Prior Publication Data
US 2022/0389018 A1    Dec. 8, 2022

(30) Foreign Application Priority Data

Oct. 18, 2019 (KR) .......................... 10-2019-0129952
Oct. 16, 2020 (KR) .......................... 10-2020-0133931

(51) Int. Cl.
*C07D 405/04* (2006.01)
*C07D 403/10* (2006.01)
(Continued)

(52) U.S. Cl.
CPC ......... *C07D 405/04* (2013.01); *C07D 403/10* (2013.01); *C07D 409/04* (2013.01);
(Continued)

(58) Field of Classification Search
CPC ........ H10K 50/11; H10K 50/15; H10K 50/16; H10K 85/622; H10K 85/654; H10K 85/6572
See application file for complete search history.

(56) References Cited

U.S. PATENT DOCUMENTS 9,040,962 B2 * 5/2015 Adamovich ....... H10K 85/6574
257/E51.001
2004/0251816 A1    12/2004 Leo et al.
(Continued)

FOREIGN PATENT DOCUMENTS

CN    106554771    4/2017
CN    109564982    4/2019
(Continued)

OTHER PUBLICATIONS

Computer-generated English-language translation of KR-2019-0081970-A.*

(Continued)

*Primary Examiner* — Vu A Nguyen
(74) *Attorney, Agent, or Firm* — Bryan Cave Leighton Paisner LLP

(57) ABSTRACT

Provided is an organic light emitting device comprising an anode, a hole transport layer, a light emitting layer, an electron transport layer, and a cathode, wherein the light (Continued)

emitting layer comprises a compound of Chemical Formula 1 and a compound of Chemical Formula 2:

<Chemical Formula 1>

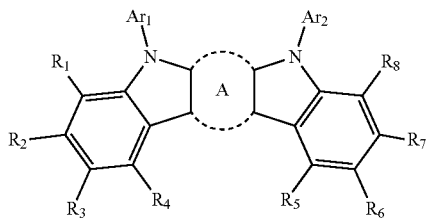

<Chemical Formula 2>

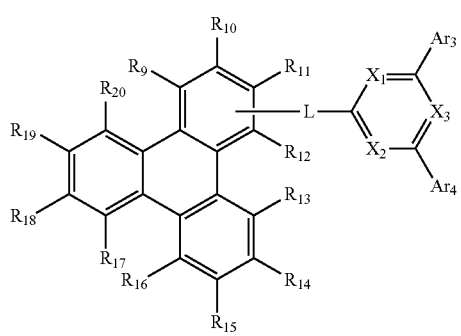

wherein:
A is a benzene ring;
$Ar_1$ and $Ar_2$ are independently a substituted or unsubstituted $C_{6-60}$ aryl or $C_{2-60}$ heteroaryl containing one or more of N, O and S;
$X_1$ to $X_3$ are independently N or CH, provided that at least one of them is N;
L is a substituted or unsubstituted $C_{2-60}$ heteroarylene or a $C_{6-60}$ arylene substituted with a $C_{2-20}$ heteroaryl, the heteroarylene or heteroaryl containing one or more of N, O and S; and
$Ar_3$ and $Ar_4$ are independently a substituted or unsubstituted $C_{6-60}$ aryl or $C_{2-60}$ heteroaryl containing one or more of N, O and S.

11 Claims, 1 Drawing Sheet

(51) Int. Cl.
*C07D 409/04* (2006.01)
*C07D 487/04* (2006.01)
*H10K 85/60* (2023.01)

(52) U.S. Cl.
CPC .......... *C07D 487/04* (2013.01); *H10K 85/622* (2023.02); *H10K 85/654* (2023.02); *H10K 85/6572* (2023.02); *H10K 85/6574* (2023.02); *H10K 85/6576* (2023.02); *C07B 2200/05* (2013.01)

(56) References Cited

U.S. PATENT DOCUMENTS

| | | |
|---|---|---|
| 2017/0098778 A1 | 4/2017 | Oh et al. |
| 2017/0346025 A1 | 11/2017 | Hwang et al. |
| 2019/0198776 A1 | 6/2019 | Jo et al. |
| 2019/0214571 A1 | 7/2019 | Huh et al. |
| 2021/0070706 A1 | 3/2021 | Lee et al. |
| 2022/0340550 A1 * | 10/2022 | Yang et al. .......... C07D 405/14 |

FOREIGN PATENT DOCUMENTS

| | | | | |
|---|---|---|---|---|
| CN | 109988160 | | 7/2019 | |
| CN | 110272422 | | 9/2019 | |
| KR | 10-2000-0051826 | | 8/2000 | |
| KR | 10-2017-0037276 | | 4/2017 | |
| KR | 10-2017-0134035 | | 12/2017 | |
| KR | 10-2018-0111558 | | 10/2018 | |
| KR | 10-2019-0005522 | | 1/2019 | |
| KR | 10-1948709 | | 2/2019 | |
| KR | 10-2019-0079348 | | 7/2019 | |
| KR | 10-2019-0081970 | | 7/2019 | |
| KR | 2019-0081970 A | * | 7/2019 | .......... C07D 405/14 |
| KR | 10-2019-0118403 | | 10/2019 | |
| WO | 2003-012890 A2 | | 2/2003 | |
| WO | WO-2016108596 A2 | * | 7/2016 | .......... C07D 405/04 |

OTHER PUBLICATIONS

Machine-generated English-language translation of WO-2016108596-A2.*

* cited by examiner

【FIG. 1】
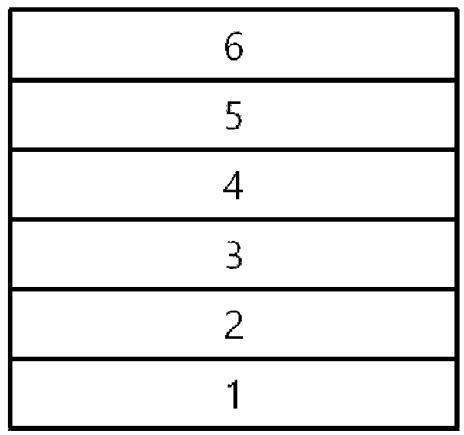
【FIG. 2】
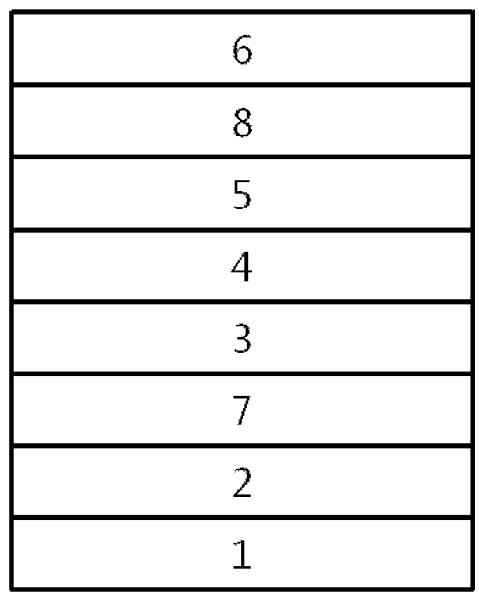

ORGANIC LIGHT EMITTING DEVICE

CROSS-REFERENCE TO RELATED APPLICATION(S)

This application is a National Stage Application of International Application No. PCT/KR2020/014140 filed on Oct. 16, 2020, which claims the benefit of Korean Patent Application No. 10-2019-0129952 filed on Oct. 18, 2019 and Korean Patent Application No. 10-2020-0133931 filed on Oct. 16, 2020 in the Korean Intellectual Property Office, the disclosures of which are incorporated herein by reference in their entirety.

TECHNICAL FIELD

The present disclosure relates to an organic light emitting device.

BACKGROUND

In general, an organic light emitting phenomenon refers to a phenomenon where electric energy is converted into light energy by using an organic material. The organic light emitting device using the organic light emitting phenomenon has characteristics such as a wide viewing angle, an excellent contrast, a fast response time, an excellent luminance, driving voltage and response speed, and thus many studies have proceeded.

The organic light emitting device generally has a structure which comprises an anode, a cathode, and an organic material layer interposed between the anode and the cathode. The organic material layer frequently has a multilayered structure that comprises different materials in order to enhance efficiency and stability of the organic light emitting device, and for example, the organic material layer can be formed of a hole injection layer, a hole transport layer, a light emitting layer, an electron transport layer, an electron injection layer and the like. In the structure of the organic light emitting device, if a voltage is applied between two electrodes, the holes are injected from an anode into the organic material layer and the electrons are injected from the cathode into the organic material layer, and when the injected holes and electrons meet each other, an exciton is formed, and light is emitted when the exciton falls to a ground state again.

There is a continuous need to develop new materials for organic materials used in the organic light emitting device as described above.

PRIOR ART LITERATURE (Patent Literature 1) Korean Unexamined Patent Publication No. 10-2000-0051826

BRIEF DESCRIPTION

Technical Problem

The present disclosure relates to an organic light emitting device having improved driving voltage, efficiency and lifetime.

Technical Solution

The present disclosure provides an organic light emitting device comprising: an anode, a hole injection layer, a hole transport layer, a light emitting layer, and a cathode, wherein the light emitting layer comprises a compound of the following Chemical Formula 1, and a compound of the following Chemical Formula 2:

<Chemical Formula 1>

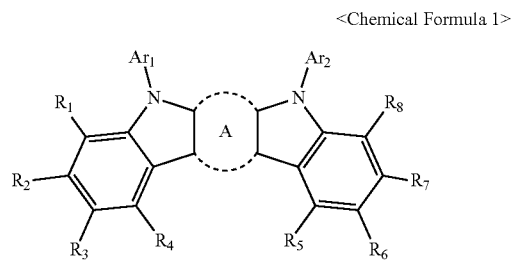

wherein in Chemical Formula 1:
A is a benzene ring fused with two adjacent pentagonal rings;
$R_1$ to $R_8$ are each independently hydrogen, deuterium, a substituted or unsubstituted $C_{1-60}$ alkyl, a substituted or unsubstituted $C_{6-60}$ aryl, or a substituted or unsubstituted $C_{2-60}$ heteroaryl containing any one or more heteroatoms selected from the group consisting of N, O and S;
$Ar_1$ and $Ar_2$ are each independently a substituted or unsubstituted $C_{6-60}$ aryl or a substituted or unsubstituted $C_{2-60}$ heteroaryl containing any one or more heteroatoms selected from the group consisting of N, O and S;

<Chemical Formula 2>

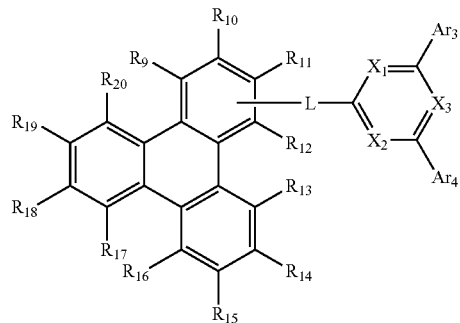

wherein in Chemical Formula 2:
$X_1$ to $X_3$ are each independently N or CH, provided that at least one of them is N;
L is a substituted or unsubstituted $C_{2-60}$ heteroarylene containing any one or more heteroatoms selected from the group consisting of N, O and S, or a $C_{6-60}$ arylene substituted with a $C_{2-20}$ heteroaryl containing any one or more heteroatoms selected from the group consisting of N, O and S;
$Ar_3$ and $Ar_4$ are each independently a substituted or unsubstituted $C_{6-60}$ aryl or a substituted or unsubstituted $C_{2-60}$ heteroaryl containing any one or more heteroatoms selected from the group consisting of N, O and S;
any one of $R_9$ to $R_{12}$ is a bond with L, and the remaining $R_9$ to $R_{12}$ other than a bond with L are each independently hydrogen, deuterium, a substituted or unsubstituted $C_{1-60}$ alkyl, a substituted or unsubstituted $C_{6-60}$ aryl, or a substituted or unsubstituted $C_{2-60}$ heteroaryl containing any one or more heteroatoms selected from the group consisting of N, O and S; and $R_{13}$ to $R_{20}$ are each independently hydrogen, deuterium, a substituted or unsubstituted $C_{1-60}$ alkyl, a substituted or unsubstituted $C_{6-60}$ aryl, or a substituted or unsubstituted $C_{2-60}$ heteroaryl containing any one or more heteroatoms selected from the group consisting of N, O and S.

Advantageous Effects

The organic light emitting device according to the present disclosure simultaneously contains a compound having excellent hole transport characteristics and a compound having excellent electron transport characteristics in the light emitting layer, thereby capable of securing excellent current efficiency and lifetime characteristics and improving power efficiency.

BRIEF DESCRIPTION OF THE DRAWINGS

FIG. 1 shows an example of an organic light emitting device comprising a substrate 1, an anode 2, a hole transport layer 3, a light emitting layer 4, an electron transport layer 5, and a cathode 6.

FIG. 2 shows an example of an organic light emitting device comprising a substrate 1, an anode 2, a hole injection layer 7, a hole transport layer 3, a light emitting layer 4, an electron transport layer 5, an electron injection layer 8 and a cathode 6.

DETAILED DESCRIPTION

Hereinafter, embodiments of the present disclosure will be described in more detail to assist in the understanding of the invention.

Definition of Terms

As used herein, the notation ⤳ or ⁞ means a bond linked to another substituent group.

As used herein, the term "substituted or unsubstituted" means being unsubstituted or substituted with one or more substituents selected from the group consisting of deuterium, a halogen group, a cyano group, a nitro group, a hydroxy group, a carbonyl group, an ester group, an imide group, an amino group, a phosphine oxide group, an alkoxy group, an aryloxy group, an alkylthioxy group, an arylthioxy group, an alkylsulfoxy group, an arylsulfoxy group, a silyl group, a boron group, an alkyl group, a cycloalkyl group, an alkenyl group, an aryl group, an aralkyl group, an aralkenyl group, an alkylaryl group, an alkylamine group, an aralkylamine group, a heteroarylamine group, an arylamine group, an arylphosphine group, or a heteroaryl containing at least one of N, O and S atoms, or being unsubstituted or substituted with a substituent to which two or more substituents of the above-exemplified substituents are connected. For example, "a substituent in which two or more substituents are connected" can be a biphenyl group. Namely, a biphenyl group can be an aryl group, or it can also be interpreted as a substituent in which two phenyl groups are connected.

In the present disclosure, the carbon number of a carbonyl group is not particularly limited, but is preferably 1 to 40.

Specifically, the carbonyl group can be a compound having the following structural formulas, but is not limited thereto:

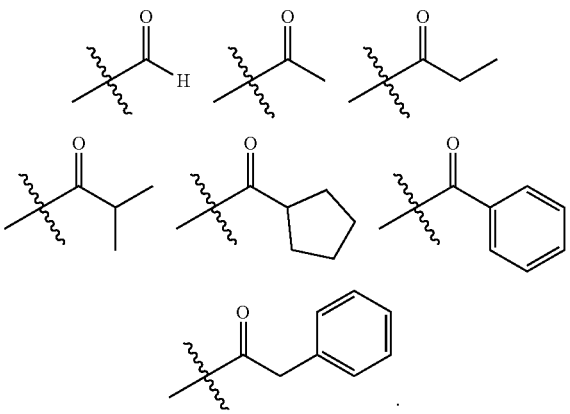

In the present disclosure, an ester group can have a structure in which oxygen of the ester group can be substituted by a straight-chain, branched, or cyclic alkyl group having 1 to 25 carbon atoms, or an aryl group having 6 to 25 carbon atoms. Specifically, the ester group can be a compound having the following structural formulas, but is not limited thereto:

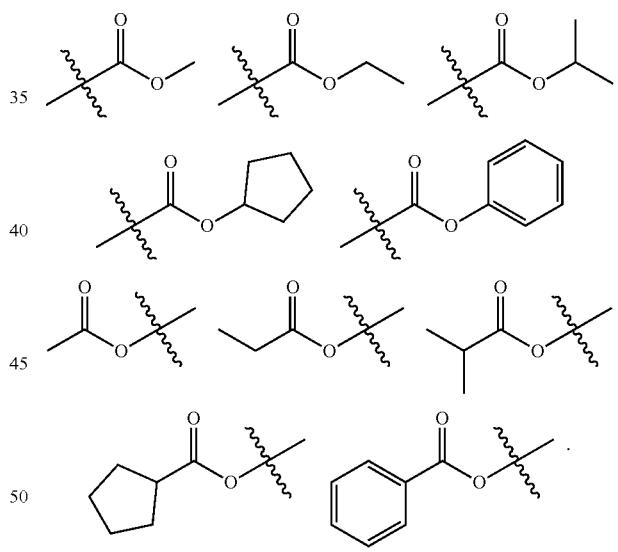

In the present disclosure, the carbon number of an imide group is not particularly limited, but is preferably 1 to 25. Specifically, the imide group can be a compound having the following structural formulas, but is not limited thereto:

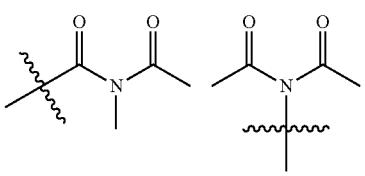

-continued

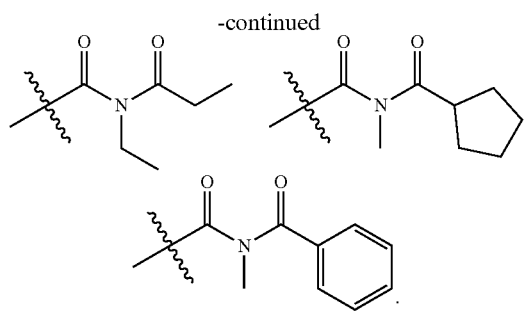

In the present disclosure, a silyl group specifically includes a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group and the like, but is not limited thereto.

In the present disclosure, a boron group specifically includes a trimethylboron group, a triethylboron group, a t-butyldimethylboron group, a triphenylboron group, and a phenylboron group, but is not limited thereto.

In the present disclosure, examples of a halogen group include fluorine, chlorine, bromine, or iodine.

In the present disclosure, the alkyl group can be straight-chain or branched-chain, and the carbon number thereof is not particularly limited, but is preferably 1 to 40. According to one embodiment, the carbon number of the alkyl group is 1 to 20. According to another embodiment, the carbon number of the alkyl group is 1 to 10. According to another embodiment, the carbon number of the alkyl group is 1 to 6. Specific examples of the alkyl group include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethylpropyl, isohexyl, 2-methylpentyl, 4-methylhexyl, 5-methylhexyl, and the like, but are not limited thereto.

In the present disclosure, the alkenyl group can be straight-chain or branched-chain, and the carbon number thereof is not particularly limited, but is preferably 2 to 40. According to one embodiment, the carbon number of the alkenyl group is 2 to 20. According to another embodiment, the carbon number of the alkenyl group is 2 to 10. According to still another embodiment, the carbon number of the alkenyl group is 2 to 6. Specific examples thereof include vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, a stilbenyl group, a styrenyl group, and the like, but are not limited thereto.

In the present disclosure, a cycloalkyl group is not particularly limited, but the carbon number thereof is preferably 3 to 60. According to one embodiment, the carbon number of the cycloalkyl group is 3 to 30. According to another embodiment, the carbon number of the cycloalkyl group is 3 to 20. According to still another embodiment, the carbon number of the cycloalkyl group is 3 to 6. Specific examples thereof include cyclopropyl, cyclobutyl, cyclopentyl, 3-methylcyclopentyl, 2,3-dimethylcyclopentyl, cyclohexyl, 3-methylcyclohexyl, 4-methyl-cyclohexyl, 2,3-dimethylcyclohexyl, 3,4,5-trimethylcyclohexyl, 4-tert-butylcyclohexyl, cycloheptyl, cyclooctyl, and the like, but are not limited thereto.

In the present disclosure, an aryl group is not particularly limited, but the carbon number thereof is preferably 6 to 60, and it can be a monocyclic aryl group or a polycyclic aryl group. According to one embodiment, the carbon number of the aryl group is 6 to 30. According to one embodiment, the carbon number of the aryl group is 6 to 20. The aryl group can be a phenyl group, a biphenyl group, a terphenyl group or the like as the monocyclic aryl group, but is not limited thereto. The polycyclic aryl group includes a naphthyl group, an anthracenyl group, a phenanthrenyl group, a pyrenyl group, a perylenyl group, a chrysenyl group, a fluorenyl group, and the like, but is not limited thereto.

In the present disclosure, the fluorenyl group can be substituted, and two substituents can be linked with each other to form a spiro structure. In the case where the fluorenyl group is substituted,

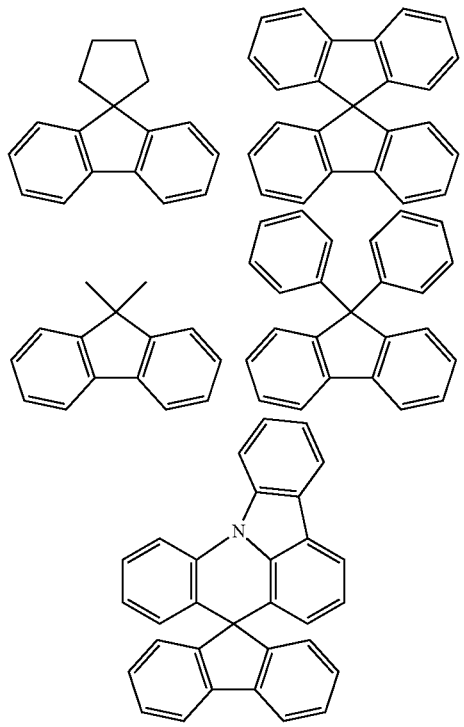

and the like can be formed. However, the structure is not limited thereto.

In the present disclosure, a heteroaryl is a heteroaryl containing one or more of O, N, Si and S as a heteroatom, and the carbon number thereof is not particularly limited, but is preferably 2 to 60. Examples of the heteroaryl include xanthene, thioxanthene, a thiophene group, a furan group, a pyrrole group, an imidazole group, a thiazole group, an oxazol group, an oxadiazol group, a triazol group, a pyridyl group, a bipyridyl group, a pyrimidyl group, a triazine group, an acridyl group, a pyridazine group, a pyrazinyl group, a quinolinyl group, a quinazoline group, a quinoxalinyl group, a phthalazinyl group, a pyridopyrimidinyl group, a pyridopyrazinyl group, a pyrazinopyrazinyl group, an isoquinoline group, an indole group, a carbazole group, a benzoxazole group, a benzoimidazole group, a benzothiazol group, a benzocarbazole group, a benzothiophene group, a dibenzothiophene group, a benzofuranyl group, a phenanthroline group, an isoxazolyl group, a thiadiazolyl group, a phenothiazinyl group, a dibenzofuranyl group, and the like, but are not limited thereto.

In the present disclosure, the aryl group in the aralkyl group, the aralkenyl group, the alkylaryl group, the arylamine group and the arylsilyl group is the same as the aforementioned examples of the aryl group. In the present disclosure, the alkyl group in the aralkyl group, the alkylaryl group and the alkylamine group is the same as the aforementioned examples of the alkyl group. In the present disclosure, the heteroaryl in the heteroarylamine can be applied to the aforementioned description of the heteroaryl. In the present disclosure, the alkenyl group in the aralkenyl group is the same as the aforementioned examples of the alkenyl group. In the present disclosure, the aforementioned description of the aryl group can be applied except that the arylene is a divalent group. In the present disclosure, the aforementioned description of the heteroaryl group can be applied except that the heteroarylene is a divalent group. In the present disclosure, the aforementioned description of the aryl group or cycloalkyl group can be applied except that the hydrocarbon ring is not a monovalent group but formed by combining two substituent groups. In the present disclosure, the aforementioned description of the heteroaryl can be applied, except that the heterocycle is not a monovalent group but formed by combining two substituent groups.

Anode and Cathode

An organic light emitting device according to the present disclosure includes an anode and a cathode.

As the anode material, generally, a material having a large work function is preferably used so that holes can be smoothly injected into the organic material layer. Specific examples of the anode material include metals such as vanadium, chrome, copper, zinc, and gold, or an alloy thereof; metal oxides such as zinc oxides, indium oxides, indium tin oxides (ITO), and indium zinc oxides (IZO); a combination of metals and oxides, such as ZnO:Al or $SNO_2$:Sb; conductive compounds such as poly(3-methylthiophene), poly[3,4-(ethylene-1,2-dioxy)thiophene]-(PEDOT), polypyrrole, and polyaniline, and the like, but are not limited thereto.

As the cathode material, generally, a material having a small work function is preferably used so that electrons can be easily injected into the organic material layer. Specific examples of the cathode material include metals such as magnesium, calcium, sodium, potassium, titanium, indium, yttrium, lithium, gadolinium, aluminum, silver, tin, and lead, or an alloy thereof; a multilayered structure material such as LiF/Al or $LiO_2$/Al, and the like, but are not limited thereto.

Hole Injection Layer

The organic light emitting device according to the present disclosure can include a hole injection layer between the anode and the hole transport layer, if necessary.

The hole injection layer is a layer injecting holes from an electrode, and the hole injection material is preferably a compound which has a capability of transporting the holes, a hole injection effect in the anode and an excellent hole injection effect to the light emitting layer or the light emitting material, prevents movement of an exciton generated in the light emitting layer to the electron injection layer or the electron injection material, and has an excellent thin film forming ability. It is preferable that a HOMO (highest occupied molecular orbital) of the hole injection material is between the work function of the anode material and a HOMO of a peripheral organic material layer. Specific examples of the hole injection material include metal porphyrine, oligothiophene, an arylamine-based organic material, a hexanitrilehexaazatriphenylene-based organic material, a quinacridone-based organic material, a perylene-based organic material, anthraquinone, polyaniline and polythiophene-based conductive polymer, and the like, but are not limited thereto.

Hole Transport Layer

The hole transport layer used in the present disclosure is a layer that receives holes from a hole injection layer formed on the anode, or from the anode, and transports the holes to the light emitting layer. The hole transport material is suitably a material having large mobility to the holes, which can receive holes from the anode or the hole injection layer and transfer the holes to the light emitting layer. Specific examples thereof can include an arylamine-based organic material, a conductive polymer, a block copolymer in which a conjugate portion and a non-conjugate portion are present together, and the like, but are not limited thereto.

Light Emitting Layer

The light emitting material used in the present disclosure is preferably a material which can receive holes and electrons transported from a hole transport layer and an electron transport layer, respectively, and combine the holes and the electrons to emit light in a visible ray region, and has good quantum efficiency to fluorescence or phosphorescence.

The light emitting layer can include a host material and a dopant material. In particular, in the present disclosure, the compound of Chemical Formula 1 and the compound of Chemical Formula 2 are used simultaneously as the host material.

In one embodiment, the compound of Chemical Formula 1 can be any one of the following Chemical Formula 1-1 to Chemical Formula 1-6:

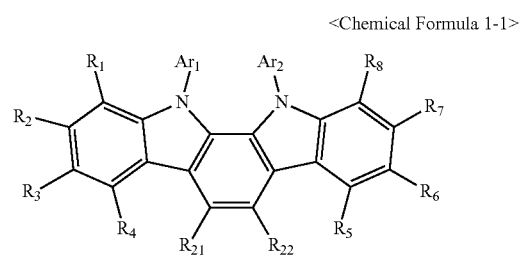

<Chemical Formula 1-1>

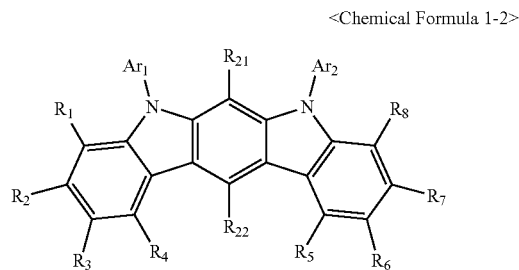

<Chemical Formula 1-2>

-continued

<Chemical Formula 1-3>

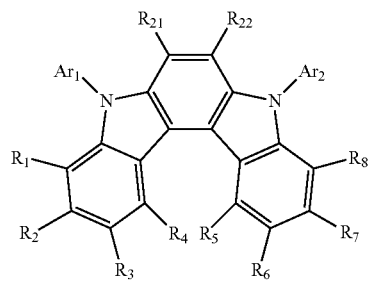

<Chemical Formula 1-4>

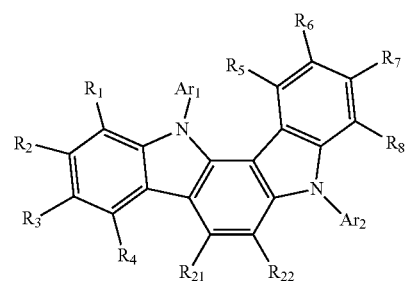

<Chemical Formula 1-5>

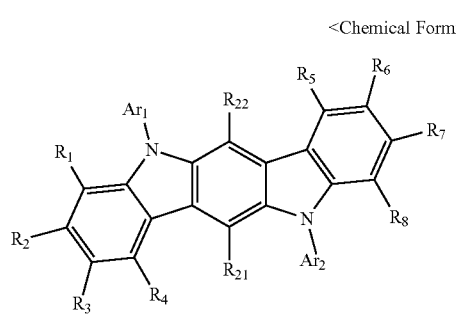

<Chemical Formula 1-6>

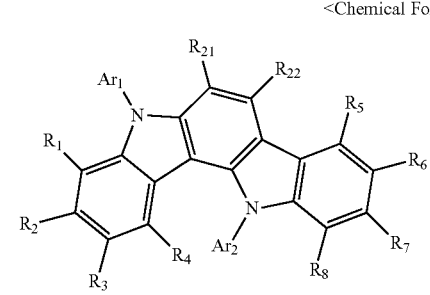

wherein in Chemical Formulas 1-1 to 1-6, $R_1$ to $R_8$, $Ar_1$ and $Ar_2$ are as defined in Chemical Formula 1, and $R_{21}$ and $R_{22}$ are each independently hydrogen or deuterium.

Preferably, the $Ar_1$ and $Ar_2$ are each independently a substituted or unsubstituted $C_{6-20}$ aryl or a substituted or unsubstituted $C_{2-20}$ heteroaryl containing any one or more selected from the group consisting of N, O and S.

More preferably, the $Ar_1$ and $Ar_2$ are each independently phenyl, biphenylyl, terphenylyl, quaterphenylyl, 3',5'-diphenylbiphenylyl, or dibenzofuranyl.

Specifically, $Ar_1$ and $Ar_2$ can be each independently any one selected from the group consisting of the following:

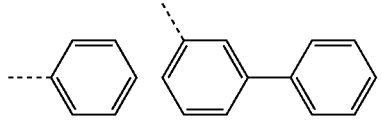

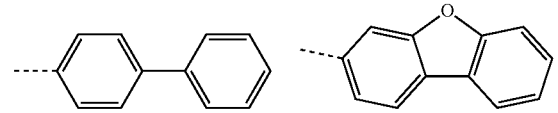

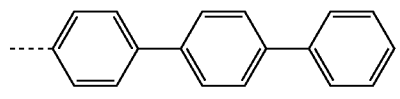

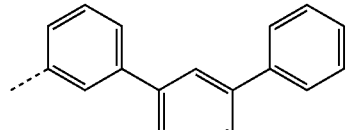

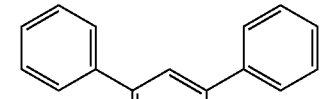

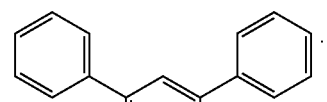

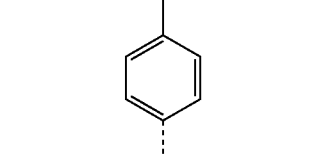

Preferably, the compound of Chemical Formula 1 can be any one selected from the group consisting of the following:
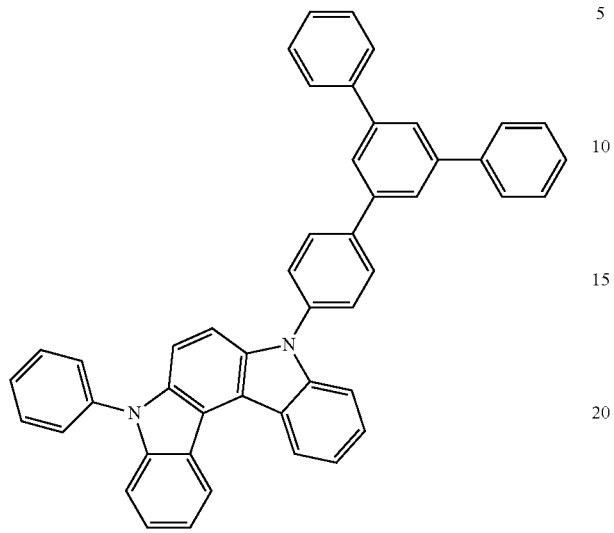
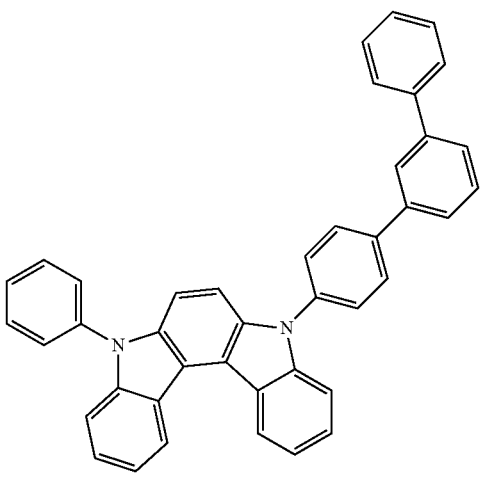
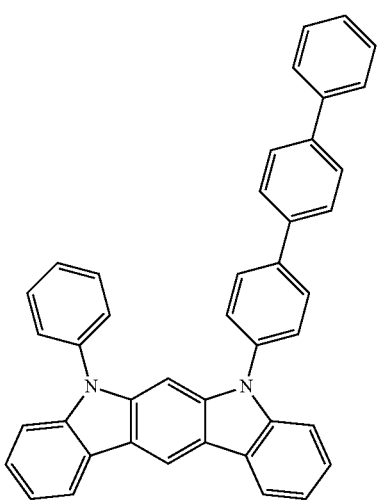
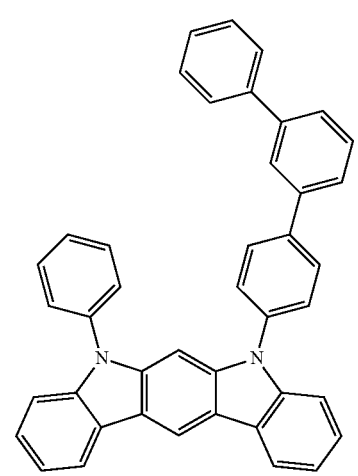

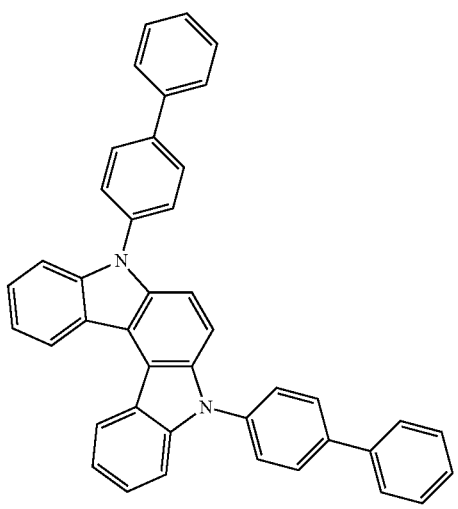
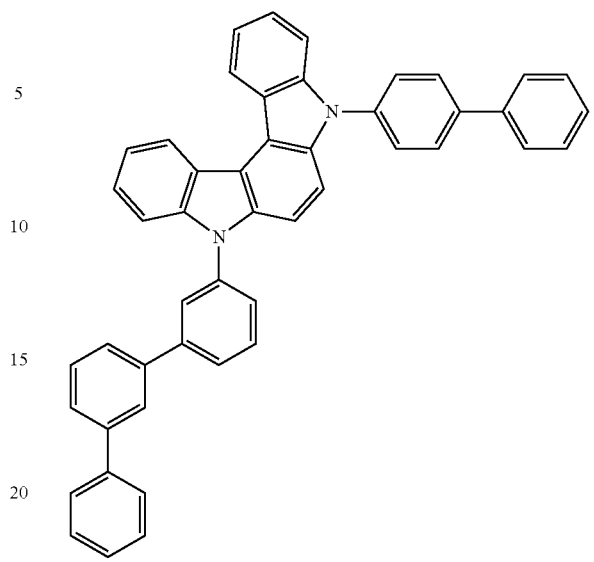
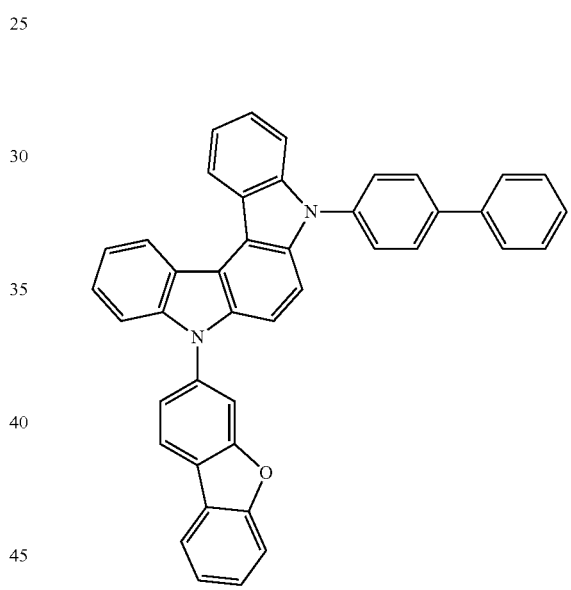
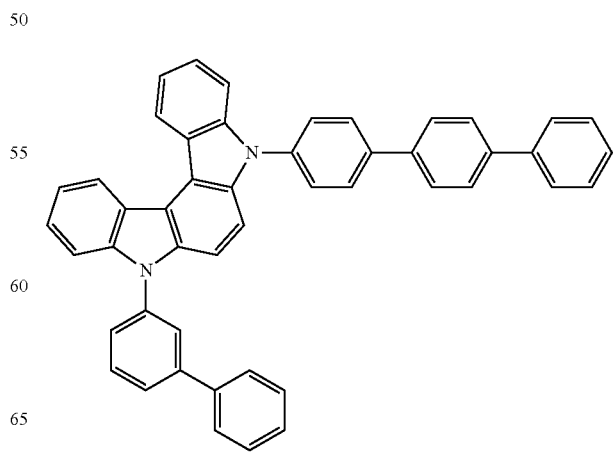
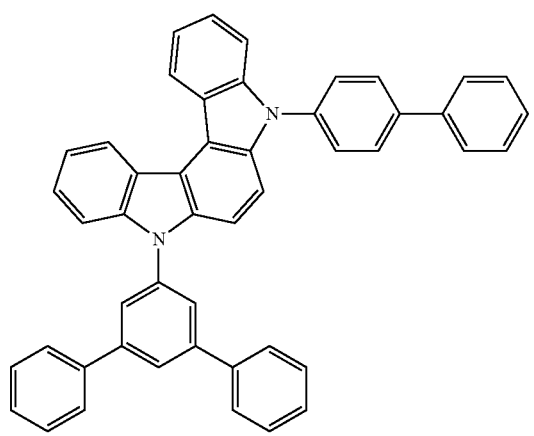

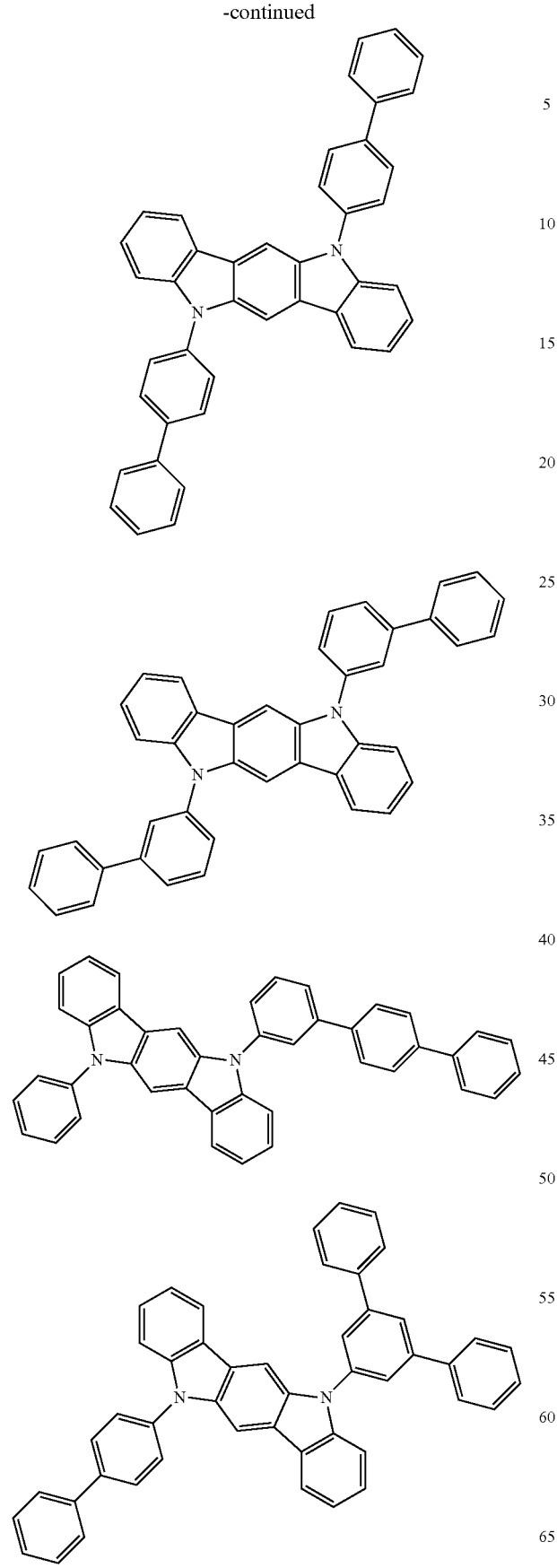
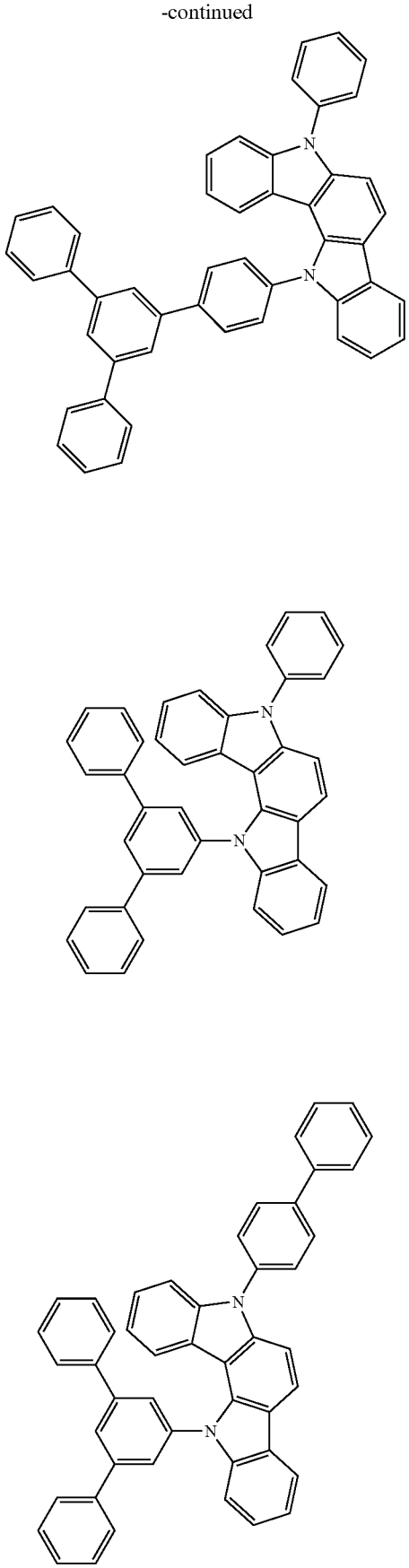

-continued

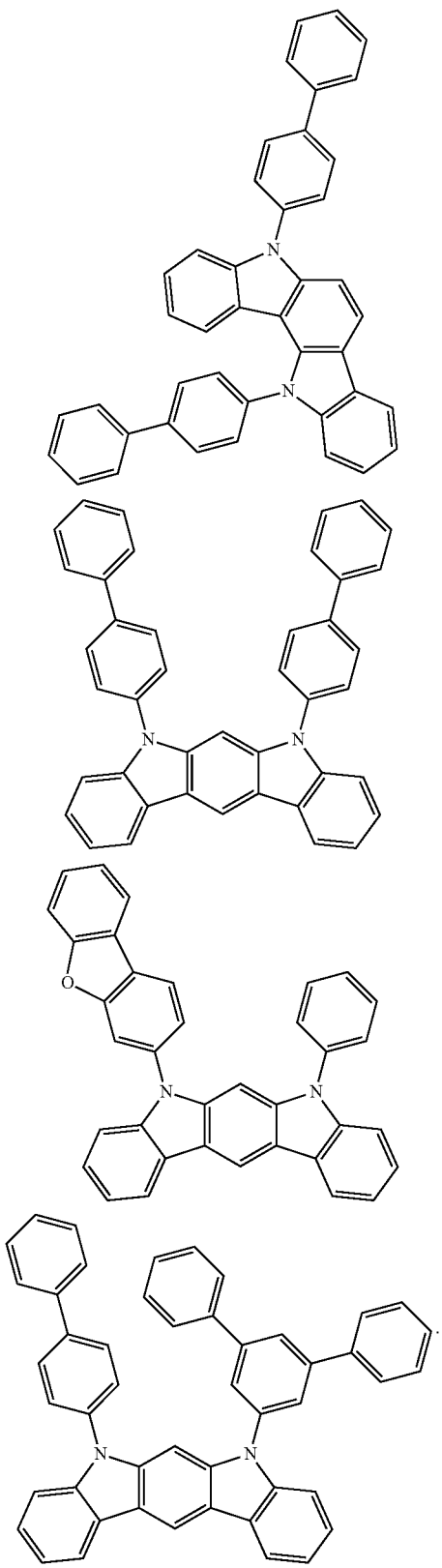

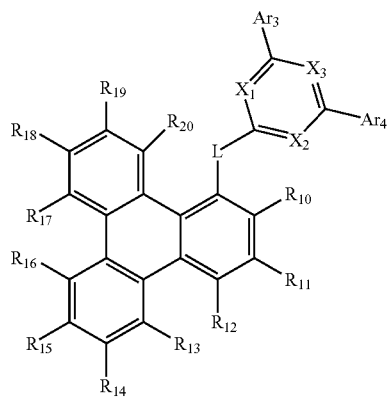

<Chemical Formula 2-1>

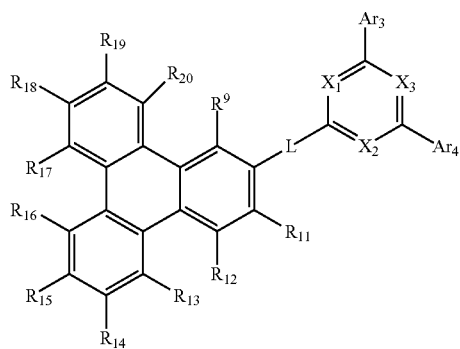

<Chemical Formula 2-2> wherein in Chemical Formulas 2-1 and 2-2, $X_1$ to $X_3$, L, $Ar_3$, $Ar_4$, and $R_9$ to $R_{20}$ are as defined in Chemical Formula 2.

Wherein, the remaining $R_9$ to $R_{12}$ other than a bond with L are each independently hydrogen or deuterium. Preferably, all the remaining $R_9$ to $R_{12}$ other than a bond with L are each independently are hydrogen.

Preferably, $R_{13}$ to $R_{20}$ are each independently hydrogen or deuterium, and more preferably, all are hydrogen.

Preferably, the Chemical Formula 2 is Chemical Formula 2-2, wherein $R_9$ and $R_{11}$ to $R_{20}$ all are hydrogen.

Preferably, L can be any one selected from the group consisting of the following:

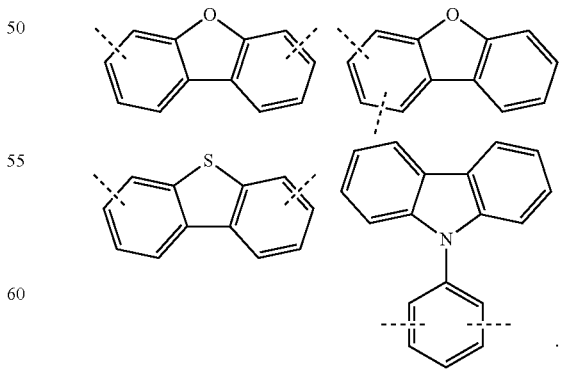

In Chemical Formula 2, any one of $R_9$ to $R_{12}$ is a bond with L. Specifically, the Chemical Formula 2 is the following Chemical Formula 2-1 or Chemical Formula 2-2:

Preferably, $Ar_3$ and $Ar_4$ can be each independently phenyl, phenyl substituted with 5 deuteriums, biphenyl, naphthyl, or terphenyl.

Preferably, Ar₃ and Ar₄ can be each independently any one selected from the group consisting of the following:
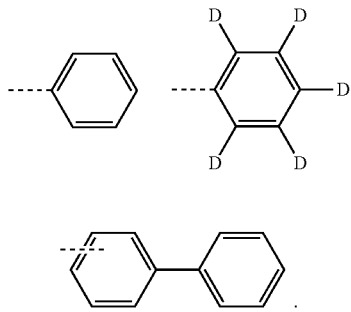
Preferably, $X_1$ to $X_3$ all can be N.
Preferably, the compound of Chemical Formula 2 can be any one selected from the group consisting of the following:
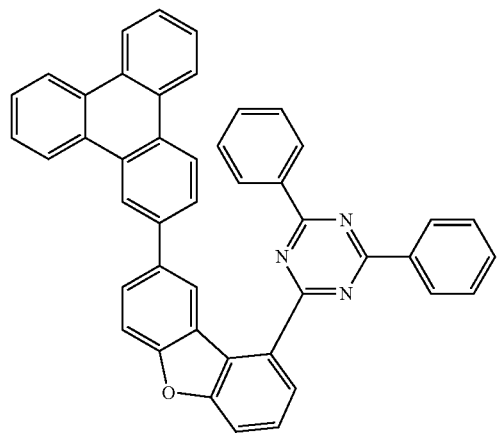
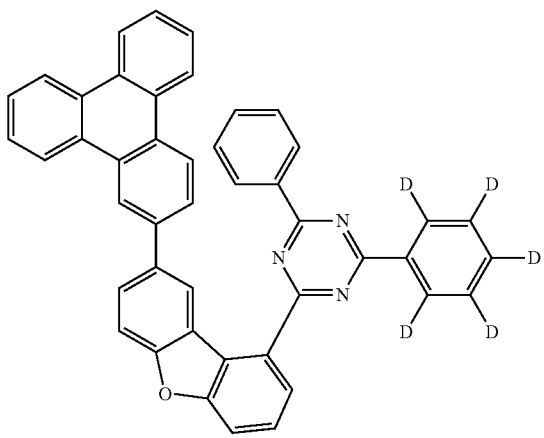
-continued
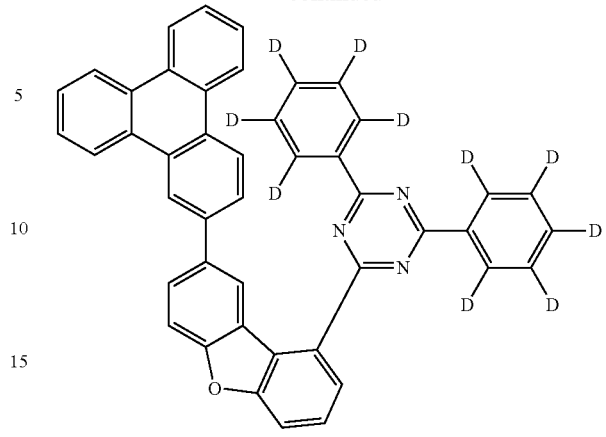
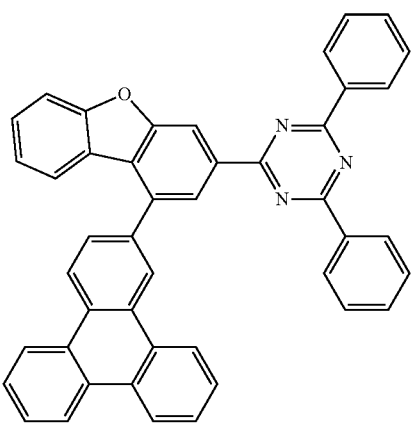
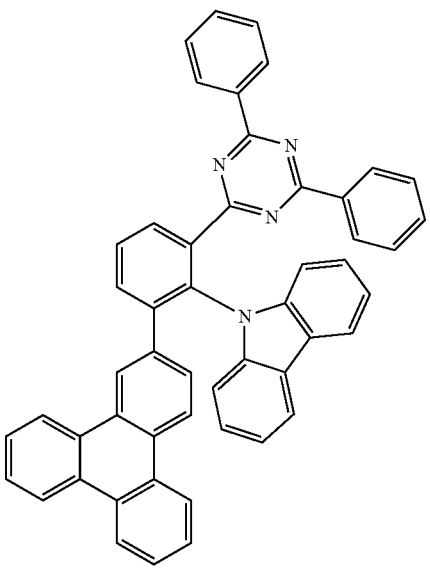

21
-continued
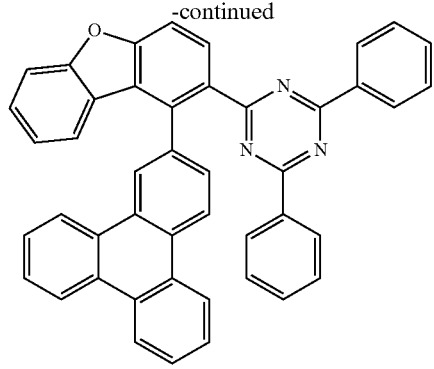
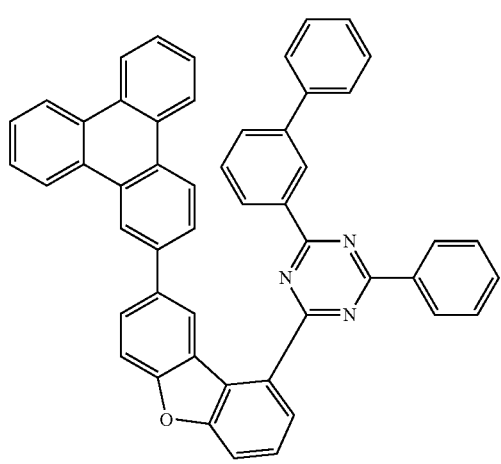
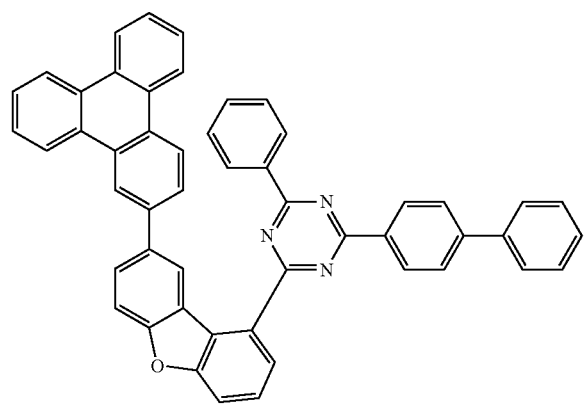
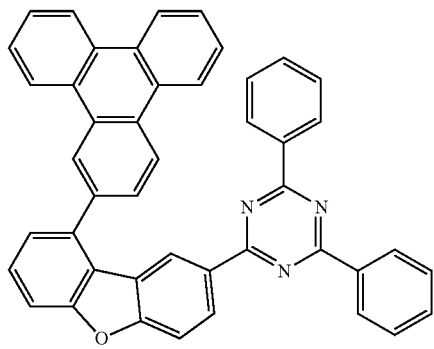
22
-continued
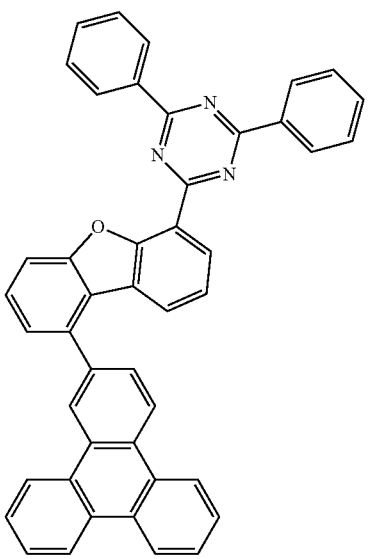
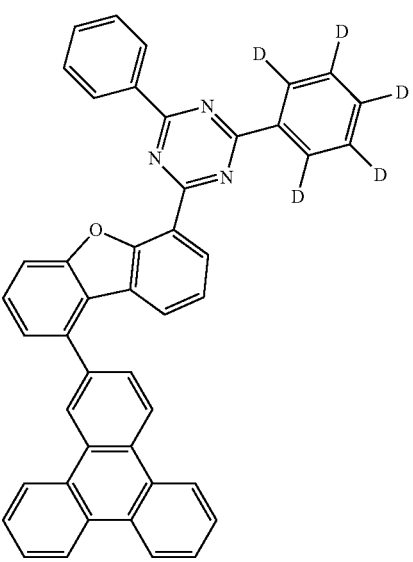
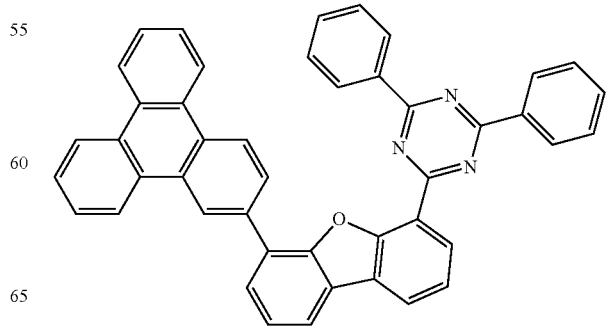

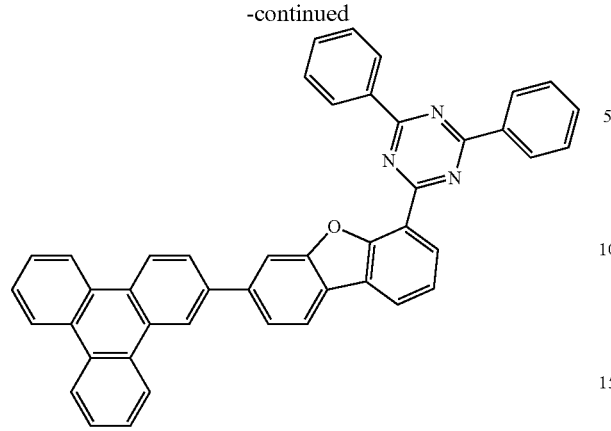
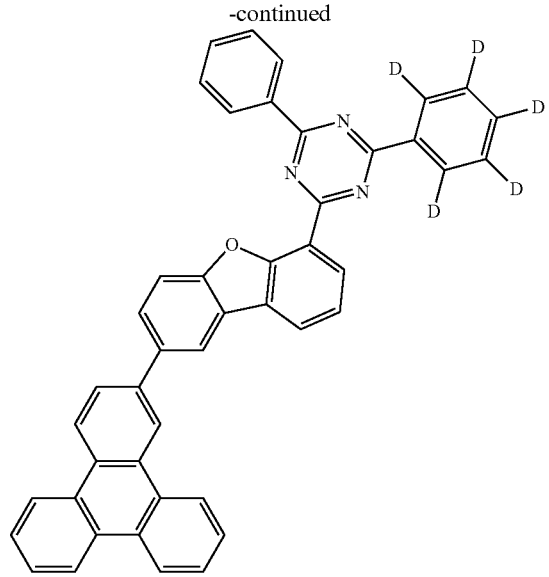
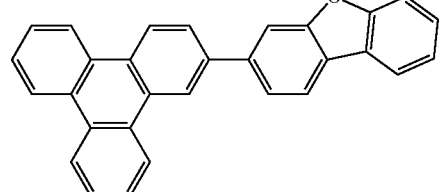
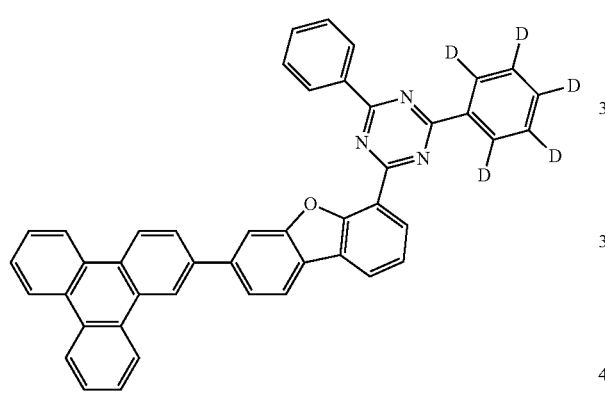
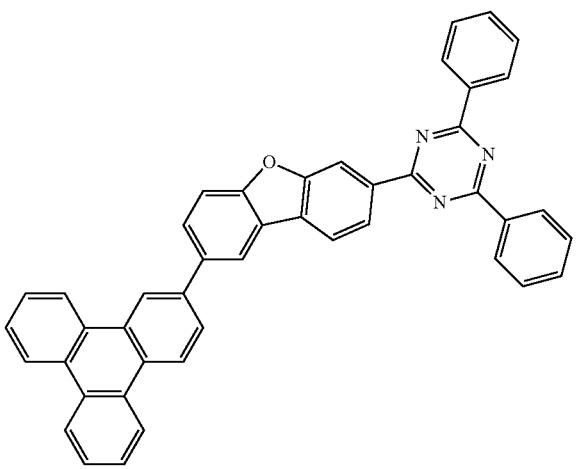
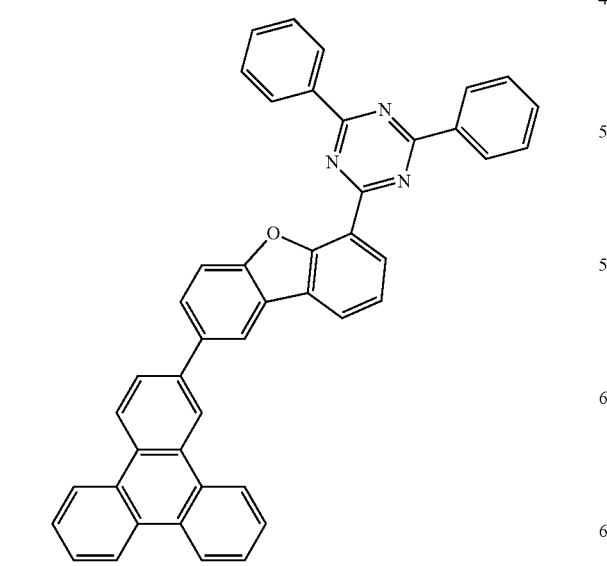
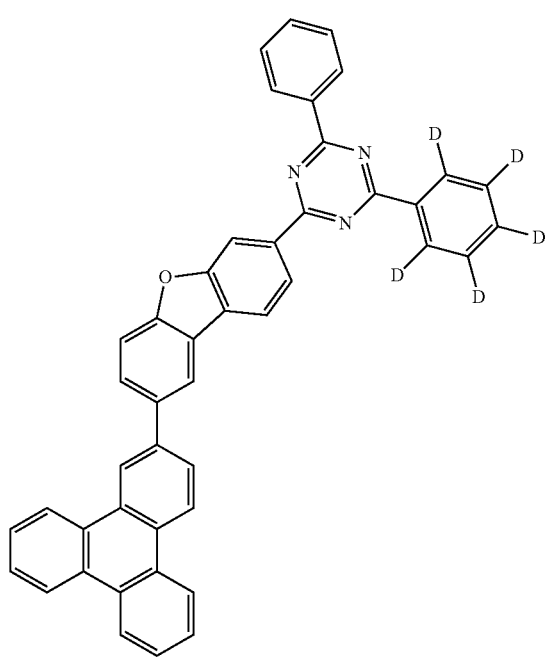

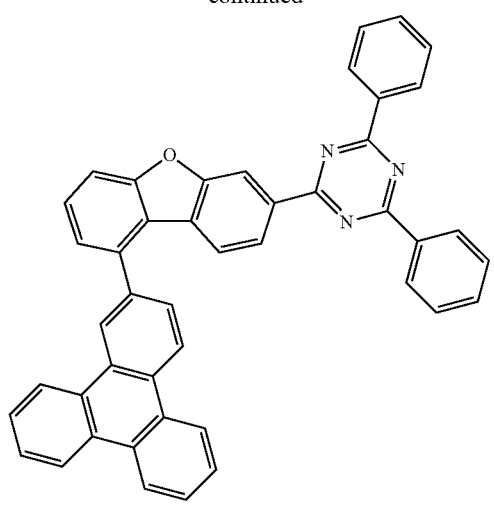
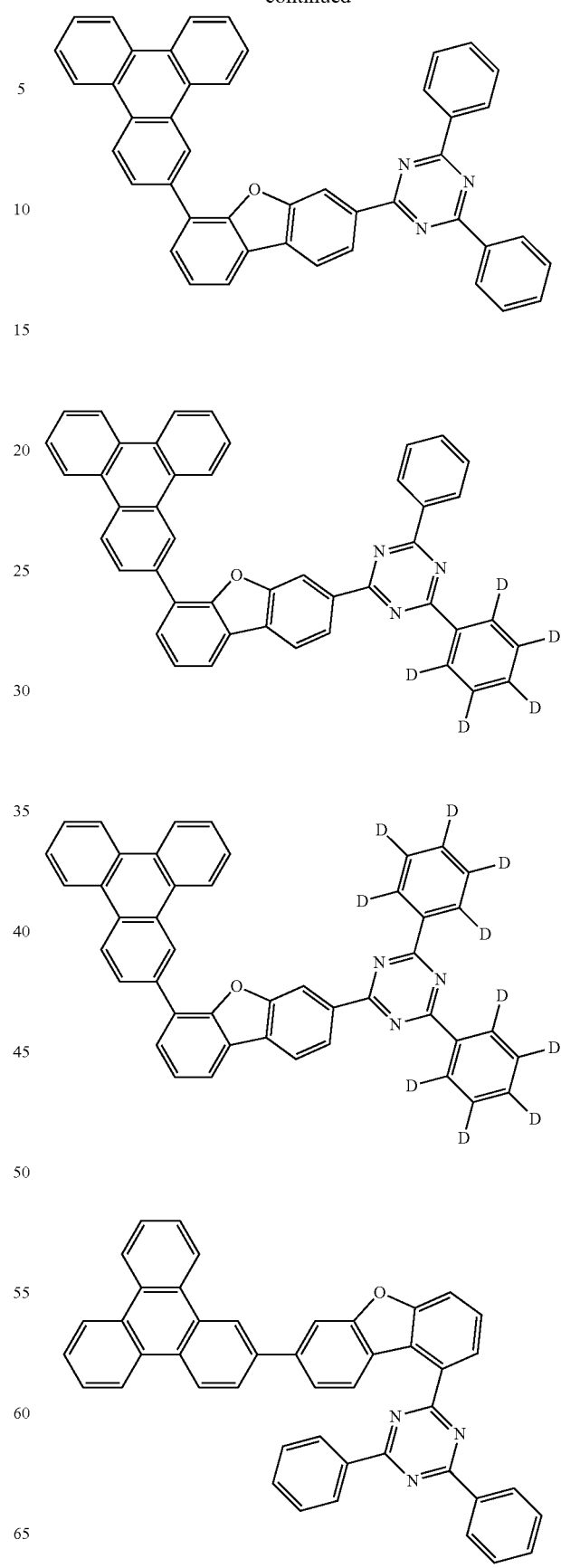

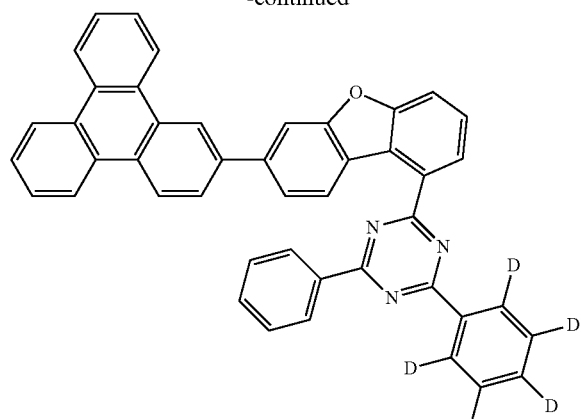
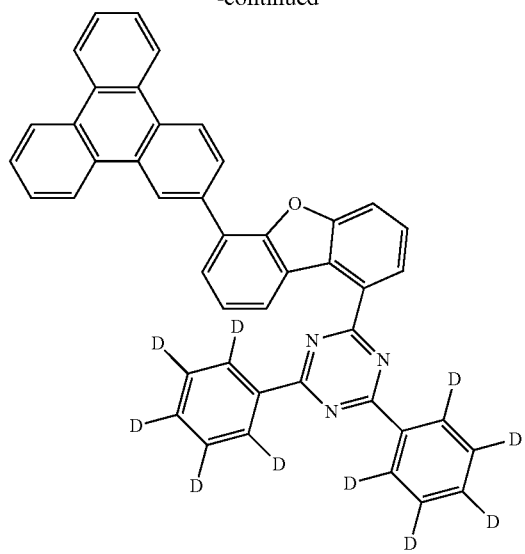
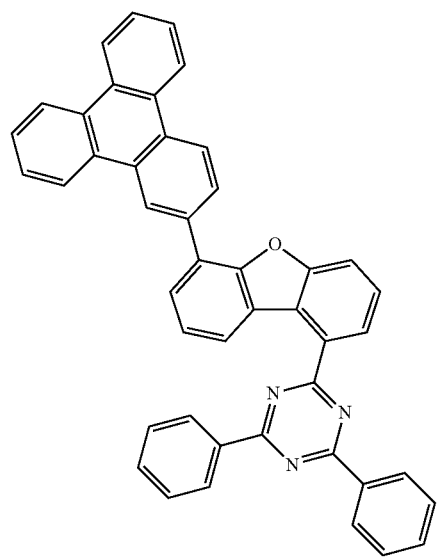
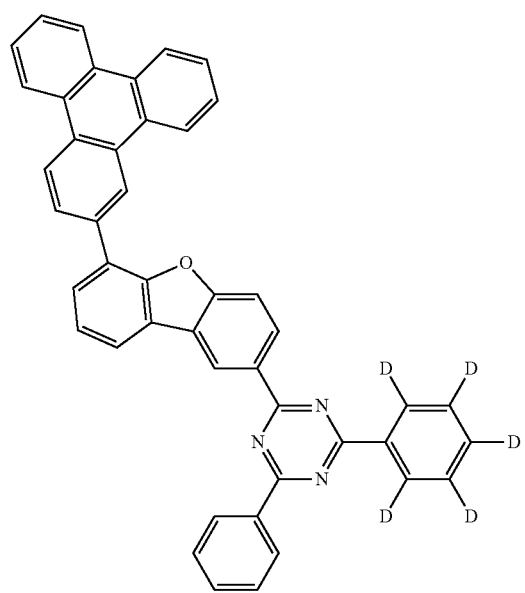

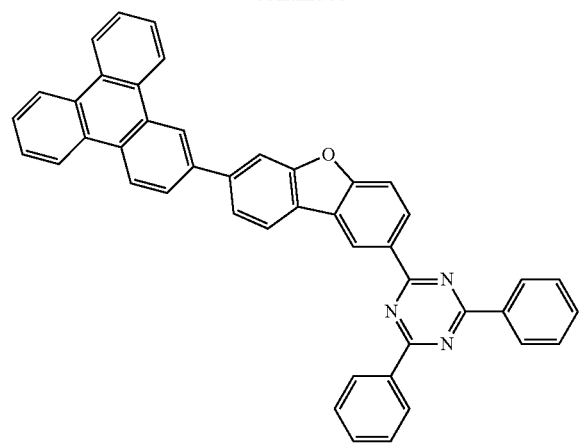

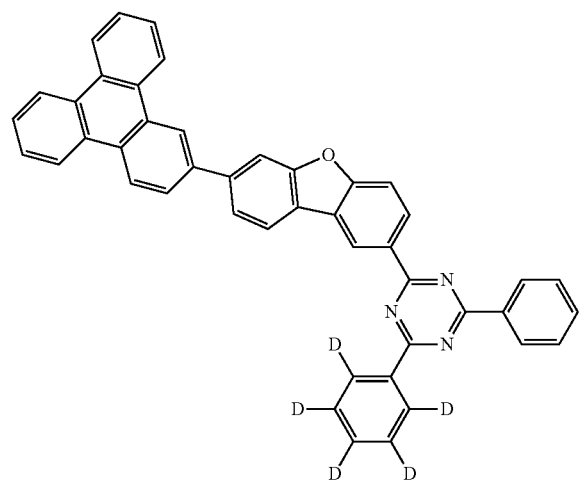

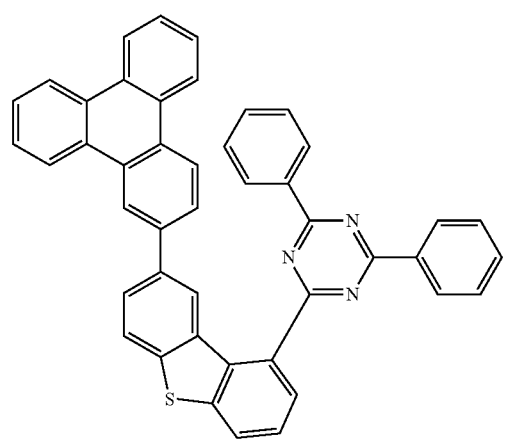

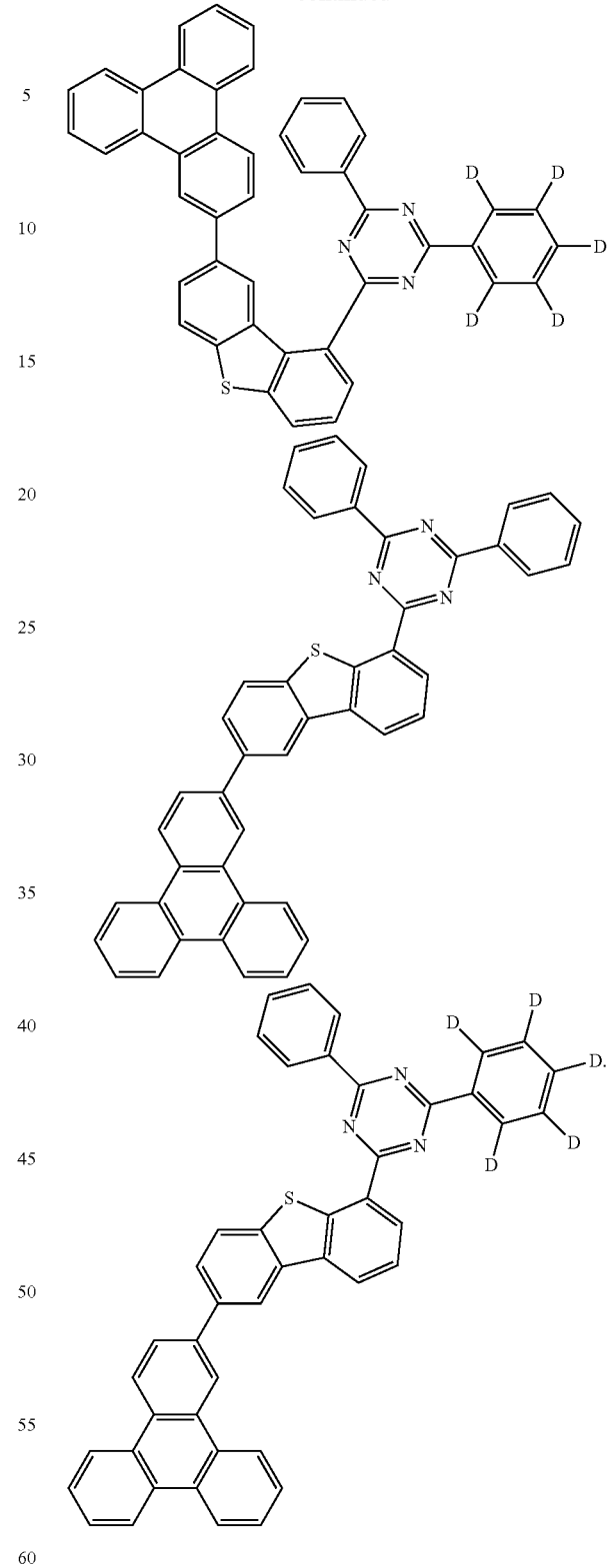

When the compound of Chemical Formula 2 is used as an N-type host in the light emitting layer, the lifetime and current efficiency of the organic light emitting device can be improved. However, since the compound of Chemical Formula 2 has poor hole transport characteristics, the driving voltage is rather increased, and the expected characteristics may not be expressed in terms of power efficiency.

Therefore, in the present disclosure, the compound of Chemical Formula 1 as a P-type host is used together in the light emitting layer, whereby the driving voltage of the device is lowered and the power efficiency characteristic is improved. Therefore, the organic light emitting device of the present disclosure can simultaneously exhibit excellent current efficiency, power efficiency, and lifetime characteristics.

In order to secure the above effect, the weight ratio of the compound of Chemical Formula 1 and the compound of Chemical Formula 2 can be 5:5 or more to less than 8:2, or 5:5 to 7:3.

The compound of Chemical Formula 1 can be prepared by the method as shown in the following Reaction Scheme 1.

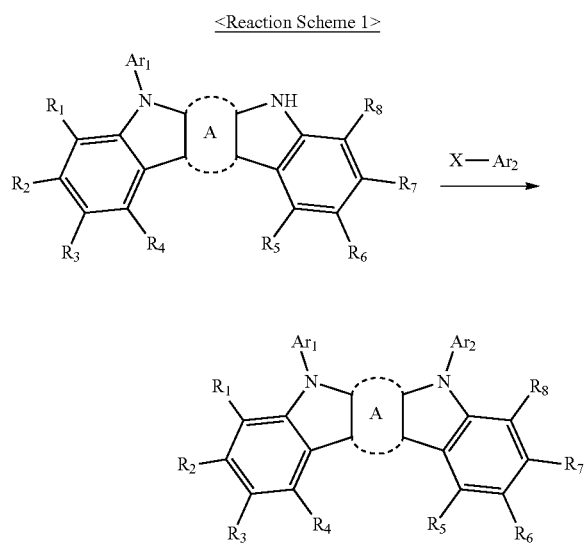

wherein in Reaction Scheme 1, the definition of the remaining substituents except for X are the same as defined above, and X is halogen, more preferably chloro or bromo.

The Reaction Scheme 1 is a Suzuki coupling reaction which is preferably carried out in the presence of a palladium catalyst and a base, and a reactive group for the Suzuki coupling reaction can be modified as known in the art. The above preparation method can be further embodied in Preparation Examples described hereinafter.

The compound of Chemical Formula 2 can be prepared by the method as shown in the following Reaction Scheme 2.

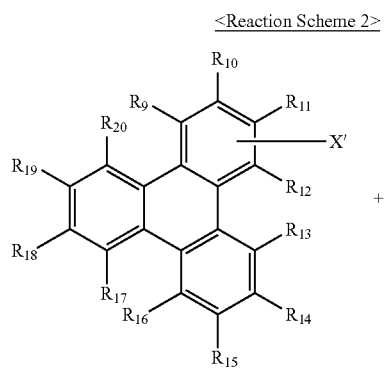

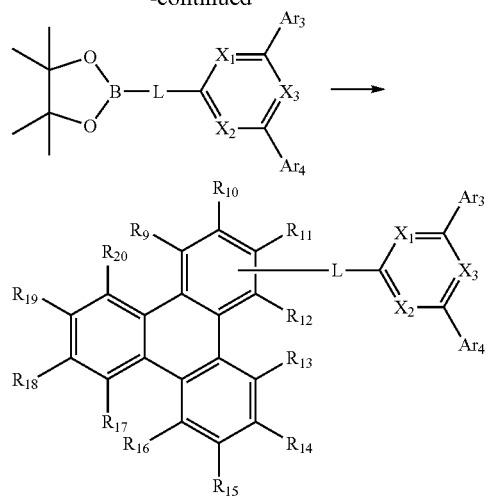

wherein in Reaction Scheme 2, the definition of the remaining substituents except for X' are the same as defined above, and X' is halogen, more preferably chloro or bromo.

The above reaction is a Suzuki coupling reaction which is preferably carried out in the presence of a palladium catalyst and a base, and a reactive group for the Suzuki coupling reaction can be modified as known in the art. The above preparation method can be further embodied in Preparation Examples described hereinafter.

Meanwhile, as the dopant material, an aromatic amine derivative, a styrylamine compound, a boron complex, a fluoranthene compound, a metal complex, and the like can be mentioned. Specific examples of the aromatic amine derivatives include substituted or unsubstituted fused aromatic ring derivatives having an arylamino group, examples thereof include pyrene, anthracene, chrysene, and periflanthene having the arylamino group, and the like. The styrylamine compound is a compound where at least one arylvinyl group is substituted in substituted or unsubstituted arylamine, wherein one or two or more substituent groups selected from the group consisting of an aryl group, a silyl group, an alkyl group, a cycloalkyl group and an arylamino group are substituted or unsubstituted. Specific examples thereof include styrylamine, styryldiamine, styryltriamine, styryltetramine, and the like, but are not limited thereto. Further, examples of the metal complex include an iridium complex, a platinum complex, and the like, but are not limited thereto.

Electron Transport Layer

The organic light emitting device according to the present disclosure can include an electron transport layer on the light emitting layer.

The electron transport layer is a layer that receives electrons from an electron injection layer and transports the electrons to the light emitting layer, and an electron transport material is suitably a material which can receive electrons well from a cathode and transfer the electrons to a light emitting layer, and has a large mobility for electrons. Specific examples thereof include: an Al complex of 8-hydroxyquinoline, a complex including $Alq_3$, an organic radical compound, a hydroxyflavone-metal complex, and the like, but are not limited thereto. The electron transport layer can be used with any desired cathode material, as used according to a conventional technique. In particular, appropriate examples of the cathode material are a typical material which has a low work function, followed by an aluminum layer or a silver layer. Specific examples thereof include cesium, barium, calcium, ytterbium, and samarium, in each case followed by an aluminum layer or a silver layer.

Electron Injection Layer

The organic light emitting device according to the present disclosure can include an electron injection layer between the electron transport layer (or the light emitting layer) and the cathode, if necessary.

The electron injection layer is a layer which injects electrons from an electrode, and is preferably a compound which has a capability of transporting electrons, has an effect of injecting electrons from a cathode and an excellent effect of injecting electrons into a light emitting layer or a light emitting material, prevents excitons produced from the light emitting layer from moving to a hole injection layer, and is also excellent in the ability to form a thin film. Specific examples thereof include fluorenone, anthraquinodimethane, diphenoquinone, thiopyran dioxide, oxazole, oxadiazole, triazole, imidazole, perylenetetracarboxylic acid, fluorenylidene methane, anthrone, and the like, and derivatives thereof, a metal complex compound, a nitrogen-containing 5-membered ring derivative, and the like, but are not limited thereto.

Examples of the metal complex compound include 8-hydroxyquinolinato lithium, bis(8-hydroxyquinolinato)zinc, bis(8-hydroxyquinolinato)copper, bis(8-hydroxyquinolinato)manganese, tris(8-hydroxy-quinolinato)aluminum, tris(2-methyl-8-hydroxy-quinolinato)aluminum, tris(8-hydroxyquinolinato)gallium, bis(10-hydroxybenzo[h]quinolinato)beryllium, bis(10-hydroxy-benzo[h]-quinolinato)zinc, bis(2-methyl-8-quinolinato)-chlorogallium, bis(2-methyl-8-quinolinato)(o-cresolato)gallium, bis(2-methyl-8-quinolinato)-(1-naphtholato)aluminum, bis(2-methyl-8-quinolinato)(2-naphtholato)-gallium, and the like, but are not limited thereto.

Organic Light Emitting Device

The organic light emitting device according to the present disclosure can be a normal type organic light emitting device in which an anode, one or more organic material layers and a cathode are sequentially stacked on a substrate. Further, the organic light emitting device according to the present disclosure can be an inverted type organic light emitting device in which a cathode, one or more organic material layers and an anode are sequentially stacked on a substrate. For example, the structure of an organic light emitting device according to an embodiment of the present disclosure is illustrated in FIGS. 1 and 2.

FIG. 1 shows an example of an organic light emitting device comprising a substrate 1, an anode 2, a hole transport layer 3, a light emitting layer 4, an electron transport layer 5, and a cathode 6. In such a structure, the compounds of Chemical Formula 1 and Chemical Formula 2 can be included in the light emitting layer.

FIG. 2 shows an example of an organic light emitting device comprising a substrate 1, an anode 2, a hole injection layer 7, a hole transport layer 3, a light emitting layer 4, an electron transport layer 5, an electron injection layer 8 and a cathode 6. In such a structure, the compounds of Chemical Formula 1 and Chemical Formula 2 can be included in the light emitting layer.

The organic light emitting device according to the present disclosure can be manufactured by materials and methods known in the art, except that the above-mentioned materials are used.

For example, the organic light emitting device according to the present disclosure can be manufactured by sequentially stacking an anode, an organic material layer and a cathode on a substrate. In this case, the organic light emitting device can be manufactured by depositing a metal, metal oxides having conductivity, or an alloy thereof on the substrate using a PVD (physical vapor deposition) method such as a sputtering method or an e-beam evaporation method to form an anode, forming organic material layers including the hole injection layer, the hole transport layer, the light emitting layer and the electron transport layer thereon, and then depositing a material that can be used as the cathode thereon.

In addition to such a method, the organic light emitting device can be manufactured by sequentially depositing a cathode material, an organic material layer and an anode material on a substrate (International Publication WO2003/012890). However, the manufacturing method is not limited thereto.

The organic light emitting device according to the present disclosure can be a front side emission type, a back side emission type, or a double side emission type according to the used material.

In addition, the compound according to the present disclosure can be included in an organic solar cell or an organic transistor in addition to an organic light emitting device.

The preparation of the organic light emitting device according to the present disclosure will be described in detail in the following examples. However, these examples are presented for illustrative purposes only, and are not intended to limit the scope of the present disclosure.

SYNTHESIS EXAMPLE

Synthesis Example 1-1: Synthesis of Compound 1-2

Step 1) Synthesis of Intermediate B

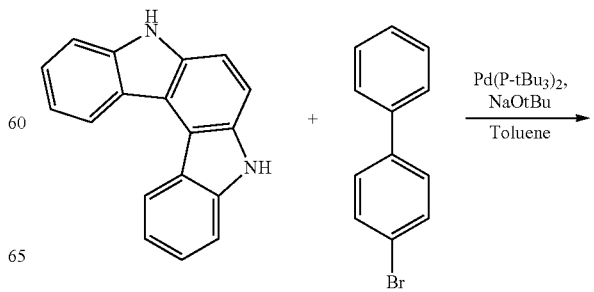

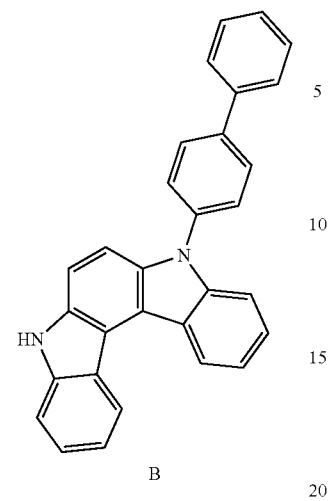

B

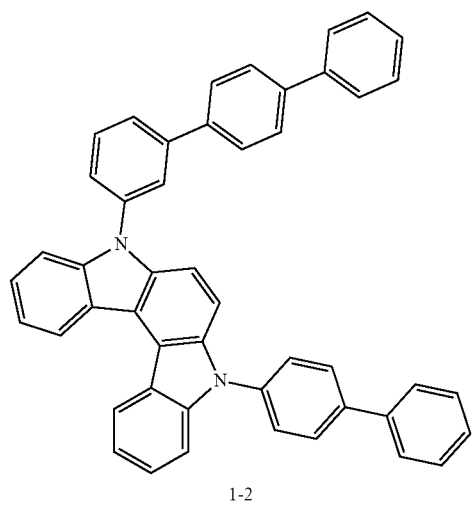

1-2

Compound 5,8-dihydroindolo[2,3-c]carbazole (20 g, 78.0 mmol), 4-bromo-1,1'-biphenyl (18.2 g, 78.0 mmol), bis(tri-t-butylphosphine)-palladium(0) (1.19 g, 2.3 mmol), and sodium t-butoxide (15.00 g, 156 mmol) were added to 450 mL of toluene under a nitrogen atmosphere, and the mixture was heated and stirred for 5 hours. The temperature of the mixture was lowered to room temperature, and the resulting solid was filtered and then washed with water and ethyl acetate. The solid was dissolved in chloroform, washed with water, and magnesium sulfate and acidic white clay were added, stirred, filtered and concentrated under reduced pressure. Then, the resultant was recrystallized using chloroform and ethyl acetate to prepare intermediate B (20.0 g, 63%, MS: [M+H]$^+$=409).

Step 2) Synthesis of Compound 1-2

Compound B (20 g, 49 mmol), Compound a2 (15.1 g, 49 mmol), bis(tri-t-butylphosphine)palladium(0) (0.75 g, 1.45 mmol), and sodium t-butoxide (9.4 g, 97.9 mmol) were added to 400 mL of xylene under a nitrogen atmosphere, and the mixture was heated and stirred for 10 hours. The temperature of the mixture was lowered to room temperature, and the resulting solid was filtered and then washed with water and ethyl acetate. The solid was dissolved in chloroform, washed with water, and magnesium sulfate and acidic white clay were added, stirred, filtered and concentrated under reduced pressure. Then, the resultant was recrystallized using chloroform and ethyl acetate to prepare a white solid compound 1-2 (21.2 g, 68%, MS: [M+H]$^+$= 637.3).

Synthesis Example 1-2: Synthesis of Compound 1

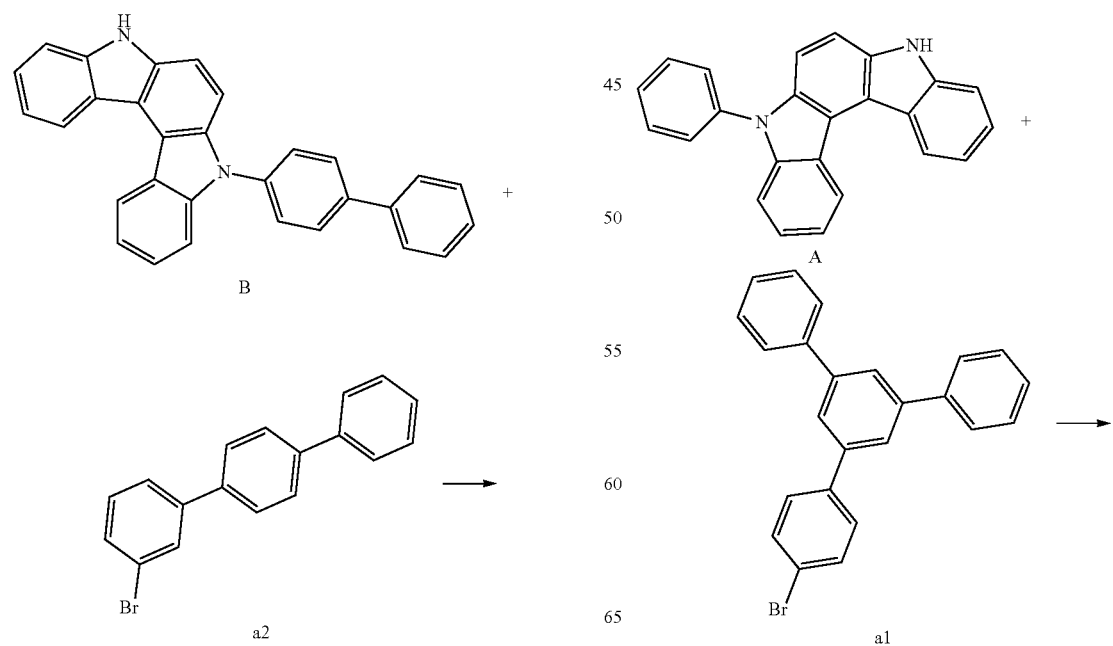

-continued

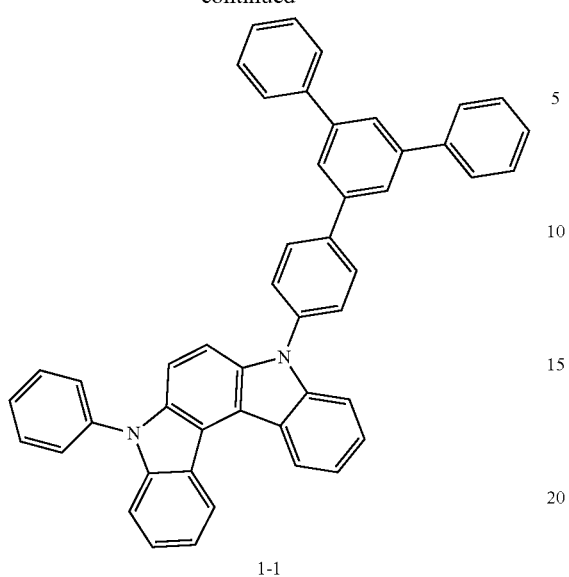

1-1

Compound 1-1 (MS: [M+H]$^+$=637) was synthesized in the same manner as in the Synthesis of Compound 1-2, except that in step 2 of Synthesis Example 1-1, Compound A was used instead of Compound B, and Compound a1 was used instead of Compound a2.

Synthesis Example 1-3: Synthesis of Compound 1-5

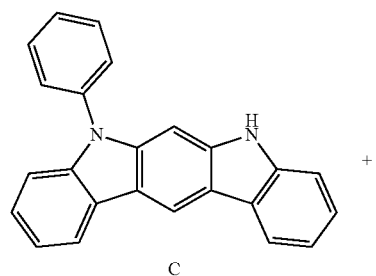

C

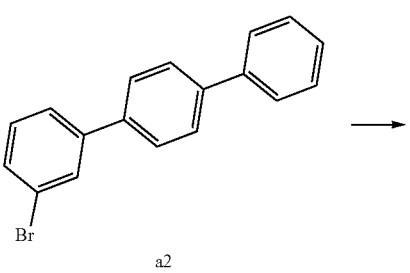

a2

-continued

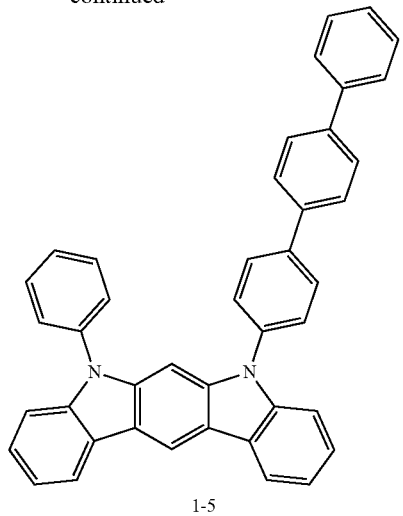

1-5

Compound 1-5 (MS: [M+H]$^+$=561) was synthesized in the same manner as in the Synthesis of Compound 1-2, except that in step 2 of Synthesis Example 1-1, Compound C was used instead of Compound B.

Synthesis Example 1-4: Synthesis of Compound 1-7

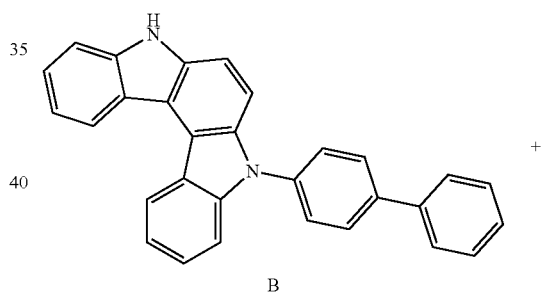

B

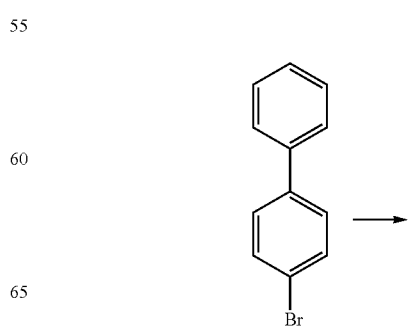

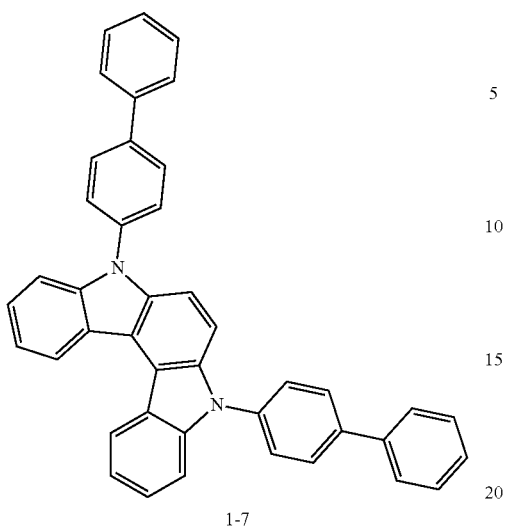

1-7

Compound 1-7 (MS: [M+H]$^+$=561) was synthesized in the same manner as in the Synthesis of Compound 1-2, except that in step 2 of Synthesis Example 1-1, 4-bromo-1,1'-biphenyl was used instead of Compound a2.

Synthesis Example 1-5: Synthesis of Compound 1-8

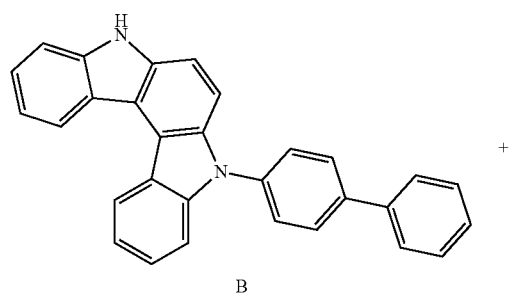

B

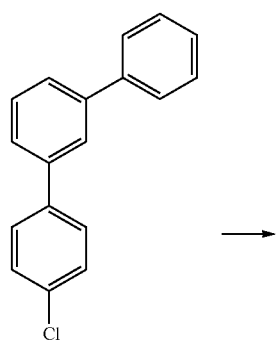

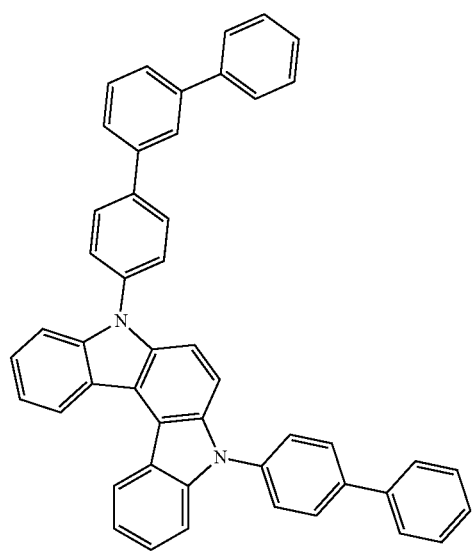

1-8

Compound 1-8 (MS: [M+H]$^+$=637) was synthesized in the same manner as in the Synthesis of Compound 1-2, except that in step 2 of Synthesis Example 1-1, 4-chloro-1,1':3',1''-terphenyl was used instead of Compound a2.

Synthesis Example 1-6: Synthesis of Compound 1-9

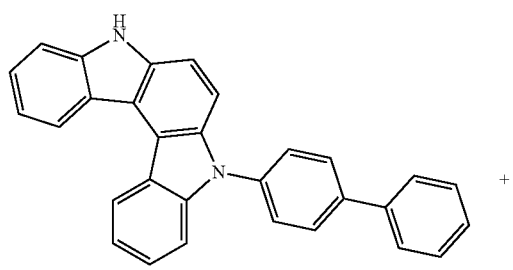

B

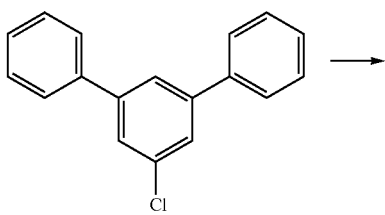

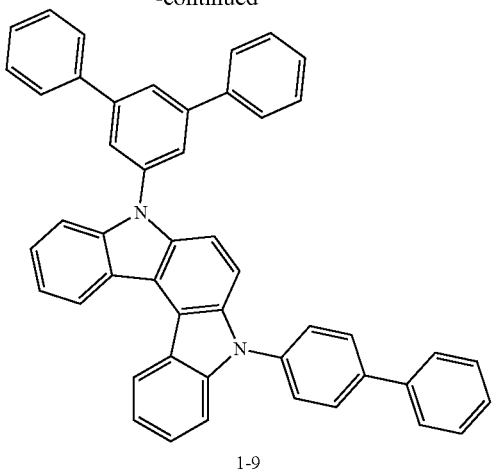

1-9

Compound 1-9 (MS: [M+H]$^+$=637) was synthesized in the same manner as in the Synthesis of Compound 1-2, except that in step 2 of Synthesis Example 1-1, 5'-chloro-1,1':3',1"-terphenyl was used instead of Compound a2.

Synthesis Example 1-7: Synthesis of Compound 1-25

Step 1) Synthesis of Compound D

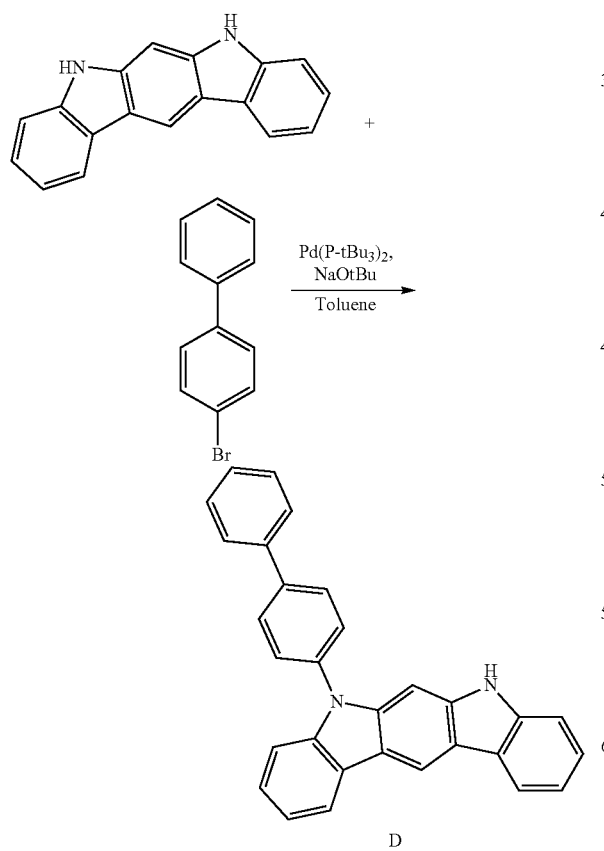

D

Compound D (MS: [M+H]$^+$=409) was synthesized in the same manner as in the Synthesis of Compound B, except that in step 2 of Synthesis Example 1-1, 5,7-dihydroindolo[2,3-b]carbazole was used instead of 5,8-dihydroindolo[2,3-c]carbazole.

Step 2) Synthesis of Compound 1-25

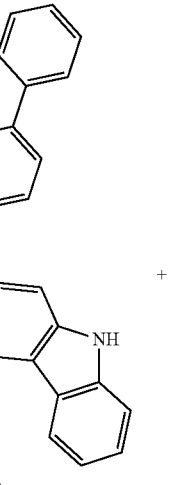

D

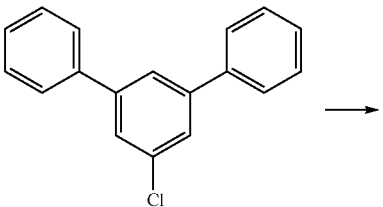

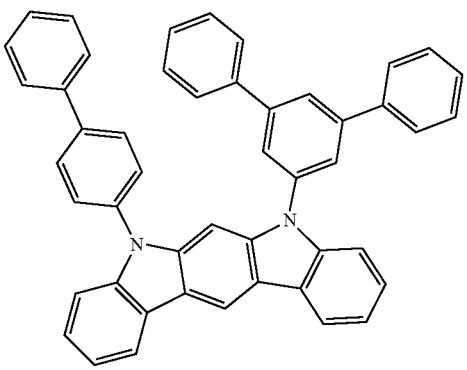

1-25

Compound 1-25 (MS: [M+H]$^+$=637) was synthesized in the same manner as in the Synthesis of Compound 1-2, except that in step 2 of Synthesis Example 1-1. Compound D and 5'-chloro-1,1':3',1"-terphenyl were used instead of Compound B and Compound a2.

Synthesis Example 1-8: Synthesis of Compound 1-15

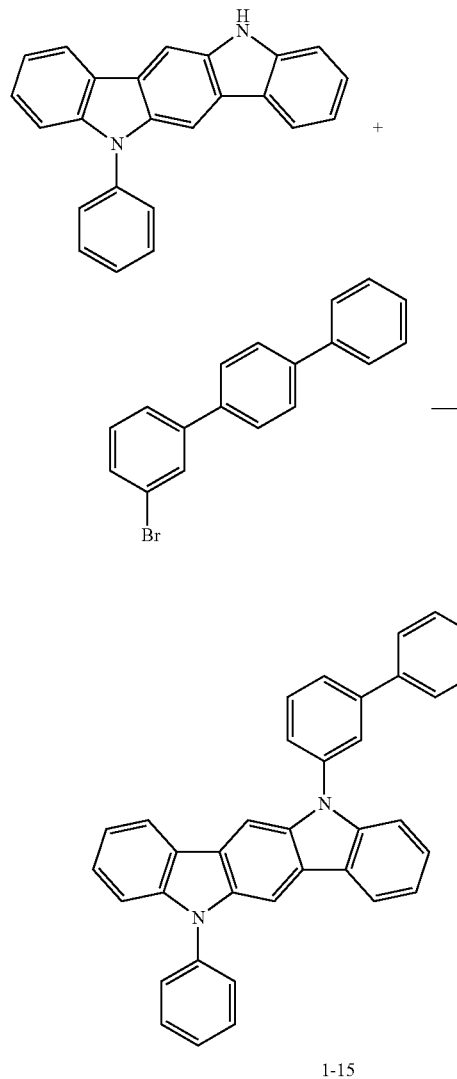

1-15

Compound 1-15 (MS: [M+H]$^+$=561) was synthesized in the same manner as in the Synthesis of Compound 1-2, except that in step 2 of Synthesis Example 1-1, 5-phenyl-5,11-dihydroindolo[3,2-b]carbazole was used instead of Compound B.

Synthesis Example 1-9: Synthesis of Compound 1-13

Step 1) Synthesis of Compound E

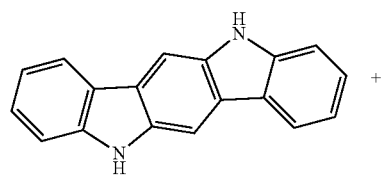

+

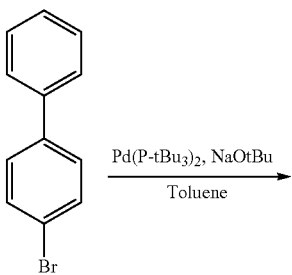

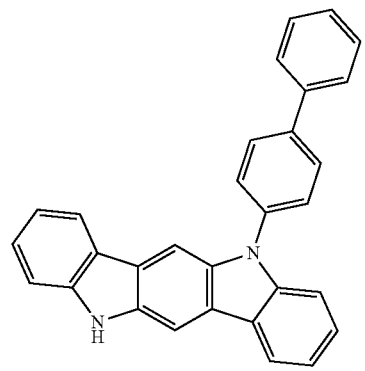

E

Compound E (MS: [M+H]$^+$=409) was synthesized in the same manner as in the Synthesis of Compound B, except that in step 1 of Synthesis Example 1-1, 5,11-dihydroindolo[3,2-b]carbazole was used instead of 5,8-dihydroindolo[2,3-c]carbazole.

Step 2) Synthesis of Compound 1-13

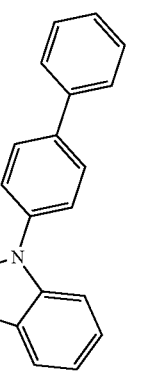

+

E

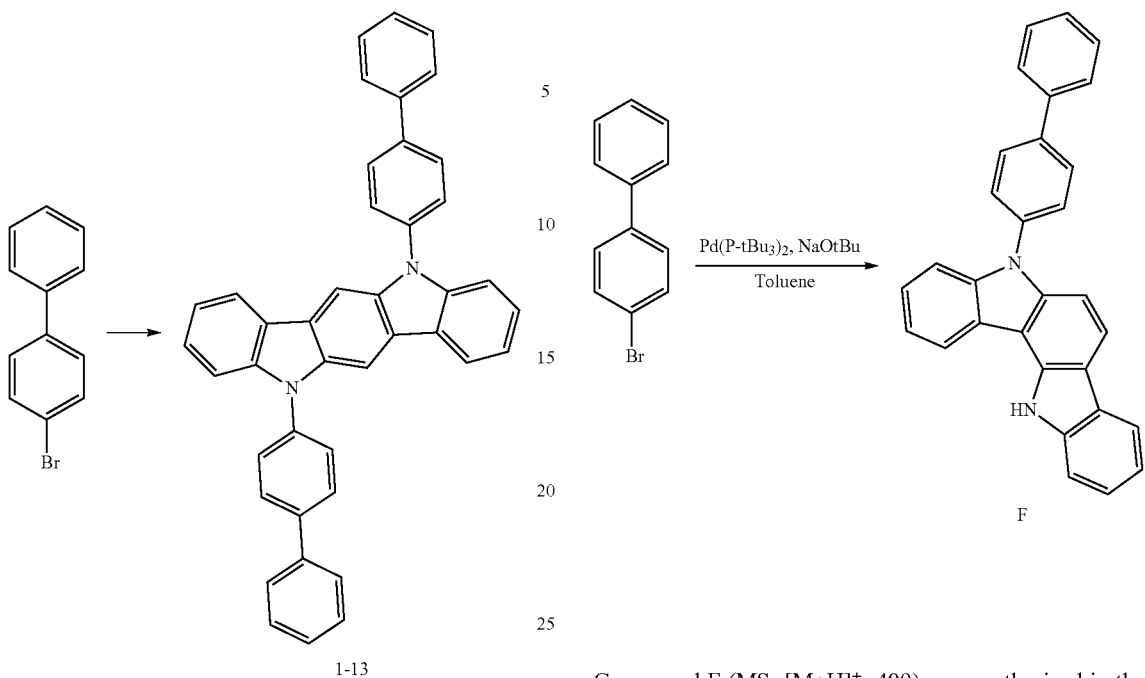

1-13

Compound 1-13 (MS: [M+H]⁺=561) was synthesized in the same manner as in the Synthesis of Compound 1-2, except that in step 2 of Synthesis Example 1-1, Compound E and 4-bromo-1,1'-biphenyl were used instead of Compound B and Compound a2.

Synthesis Example 1-10: Synthesis of Compound 1-20

Step 1) Synthesis of Intermediate F

Compound F (MS: [M+H]⁺=409) was synthesized in the same manner as in the Synthesis of Compound B except that in step 1 of Synthesis Example 1-1, 5,12-dihydroindolo[3,2-a]carbazole was used instead of 5,8-dihydroindolo[2,3-c]carbazole.

Step 2) Synthesis of Compound 1-20

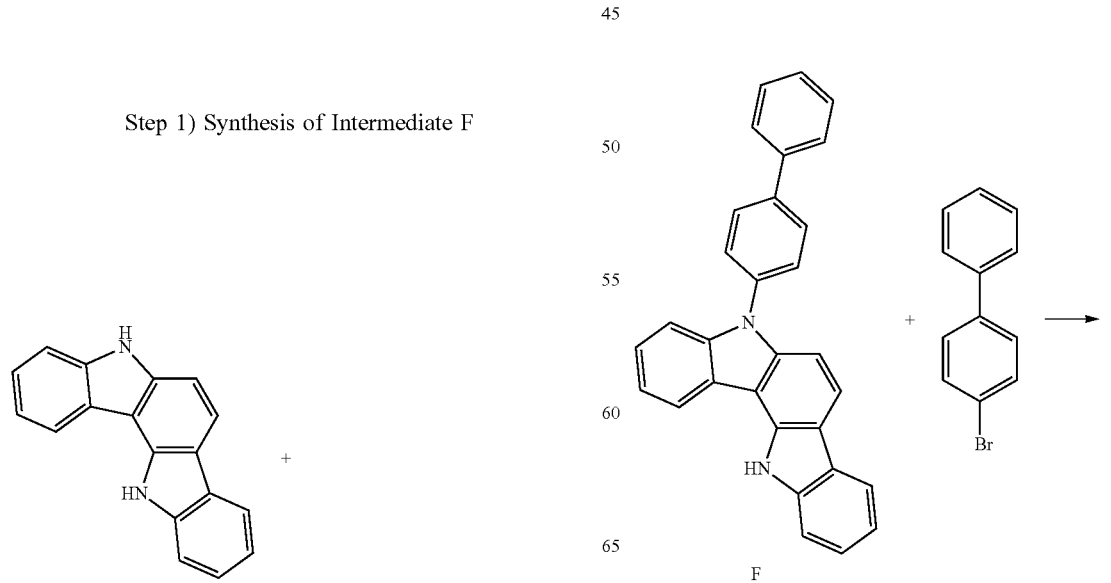

-continued

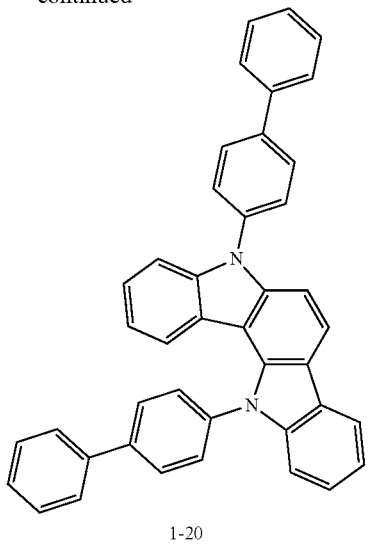

1-20

Compound 1-20 (MS: [M+H]$^+$=561) was synthesized in the same manner as in the Synthesis of Compound 1-2, except that in step 2 of Synthesis Example 1-1, Compound F and 4-bromo-1,1'-biphenyl were used instead of Compound B and Compound a2.

Synthesis Example 2-1: Synthesis of Compound 2-1

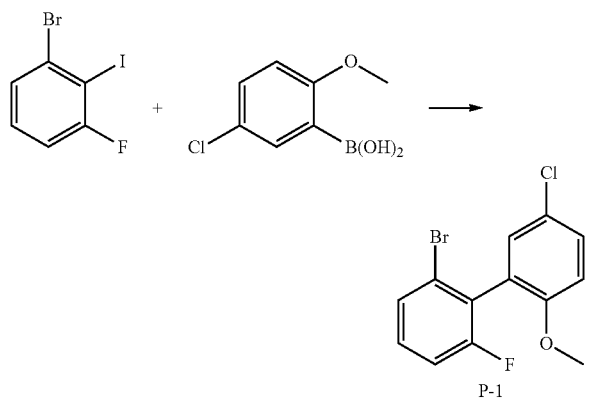

Step 1) Synthesis of Compound P-1

1-Bromo-3-fluoro-2-iodobenzene (100 g, 333.5 mmol), and (5-chloro-2-methoxyphenyl)boronic acid)(62.2 g, 333.5 mmol) were dissolved in 800 mL of tetrahydrofuran (THF). Sodium carbonate (Na$_2$CO$_3$) 2M solution (500 mL) and tetrakis(triphenylphosphine)-palladium(0)[Pd(PPh$_3$)$_4$] (7.7 g, 6.7 mmol) were added thereto, and the mixture was refluxed for 12 hours. After completion of the reaction, the temperature of the mixture was cooled to room temperature, and the resulting mixture was extracted three times with water and toluene. The toluene layer was separated, dried over magnesium sulfate, filtered, and the filtrate was distilled under reduced pressure. The resulting mixture was recrystallized three times using chloroform and ethanol to obtain Compound P-1 (53.7 g, yield: 51%; MS[M+H]-=314).

Step 2) Synthesis of Compound P-2

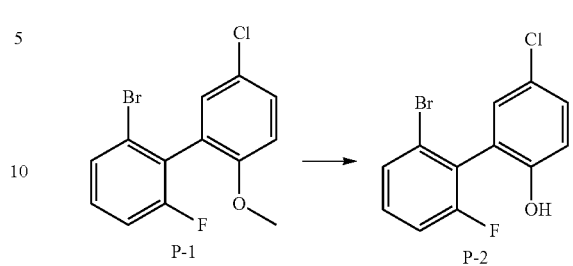

Compound P-1 (50.0 g, 158.5 mmol) was dissolved in dichloromethane (600 mL) and then cooled to 0° C. Boron tribromide (15.8 mL, 166.4 mmol) was slowly added dropwise thereto, and then the mixture was stirred for 12 hours. After completion of the reaction, the mixture was washed three times with water, dried over magnesium sulfate, filtered, and the filtrate was distilled under reduced pressure and purified by column chromatography to obtain Compound P-2 (47.4 g, yield: 99%; MS: [M+H]$^+$=300).

Step 3) Synthesis of Compound P-3

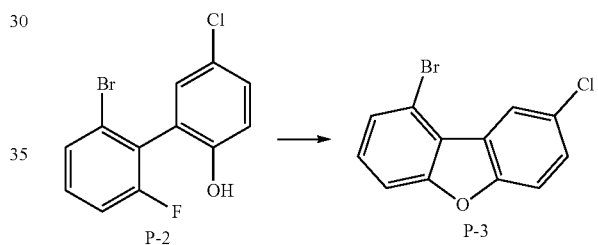

Compound P-2 (40.0 g, 132.7 mmol) was dissolved in distilled dimethylformamide (DMF) (400 mL). This was cooled to 0° C., and sodium hydride (3.5 g, 145.9 mmol) was slowly added dropwise thereto. After stirring for 20 minutes, the mixture was stirred at 100° C. for 1 hour. After completion of the reaction, the temperature of the mixture was cooled to room temperature, and 100 mL of ethanol was slowly added thereto. The mixture was distilled under reduced pressure and recrystallized from chloroform and ethyl acetate to obtain Compound P-3 (30.3 g, yield: 81%; MS: [M+H]$^+$=280).

Step 4) Synthesis of Compound P-4

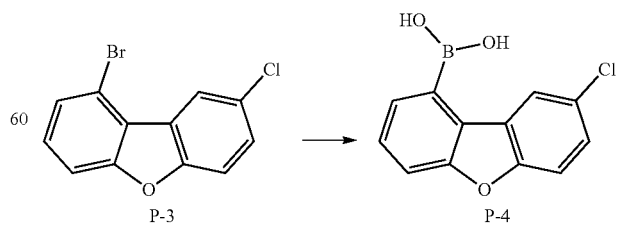

Compound P-3 (30.0 g, 106.6 mmol) was dissolved in tetrahydrofuran (300 mL), and then the temperature was lowered to −78° C., to which 1.7M tert-butyllithium (t-BuLi) (62.7 mL, 106.6 mmol) was added slowly. The mixture was stirred at the same temperature for one hour, and then triisopropylborate (B(OiPr)$_3$) (28.3 mL, 213.1 mmol) was added thereto. The mixture was stirred for 3 hours while gradually raising the temperature to room temperature. 2 N aqueous hydrochloric acid solution (200 mL) was added to the reaction mixture and stirred at room temperature for 1.5 hours. The resulting precipitate was filtered, washed sequentially with water and ethyl ether, and then vacuum dried. After drying, the resultant was dispersed in ethyl ether, stirred for two hours, filtered and dried to prepare Compound P-4 (24.4 g, yield: 93%; MS: [M+H]$^+$=247).

Step 5) Synthesis of Compound P-5

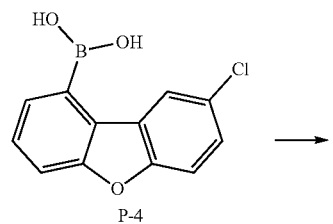

P-4

Compound P-4 (20.0 g, 81.2 mmol) and 2-chloro-4,6-diphenyl-1,3,5-triazine (21.8 g, 81.2 mmol) were dispersed in tetrahydrofuran (250 mL), and then 2M aqueous potassium carbonate solution (aq. K$_2$CO$_3$) (33.6 mL, 243.5 mmol) was added, and tetrakistriphenylphosphino-palladium [Pd(PPh$_3$)$_4$] (1.9 g, 2 mol %), and then the mixture was stirred and refluxed for 4 hours. The temperature of the mixture was lowered to room temperature, and the resulting solid was filtered. The filtered solid was recrystallized from tetrahydrofuran and ethyl acetate, filtered, and then dried to prepare Compound P-5 (32.4 g, yield: 92%; MS: [M+H]$^+$=434).

Step 6) Synthesis of Compound P-6

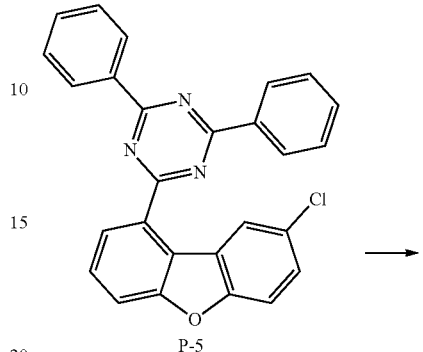

P-5

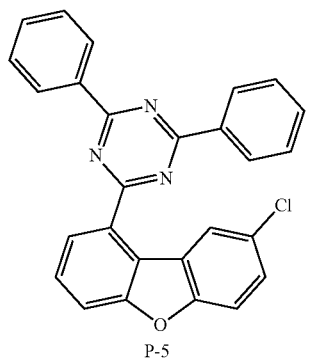

P-6

Compound P-5 (30 g, 69.2 mmol), bis(pinacolato)diborone (19.3 g, 76.1 mmol), potassium acetate (20.4 g, 207.5 mmol), tetrakistriphenylphosphinopalladium(0) [Pd(PPh$_3$)$_4$] (1.6 g, 2 mol %) were added to tetrahydrofuran (300 mL), and the mixture was refluxed for 12 hours. After completion of the reaction, the mixture was cooled to room temperature, and distilled under reduced pressure to remove a solvent. This was dissolved in chloroform, washed three times with water, and the organic layer was separated and dried over magnesium sulfate. The resultant was distilled under reduced pressure to prepare Compound P-6 (34.5 g, yield: 95%; MS: [M+H]$^+$=526).

Step 7) Synthesis of Compound 2-1

Synthesis Example 2-2: Synthesis of Compound 2-2

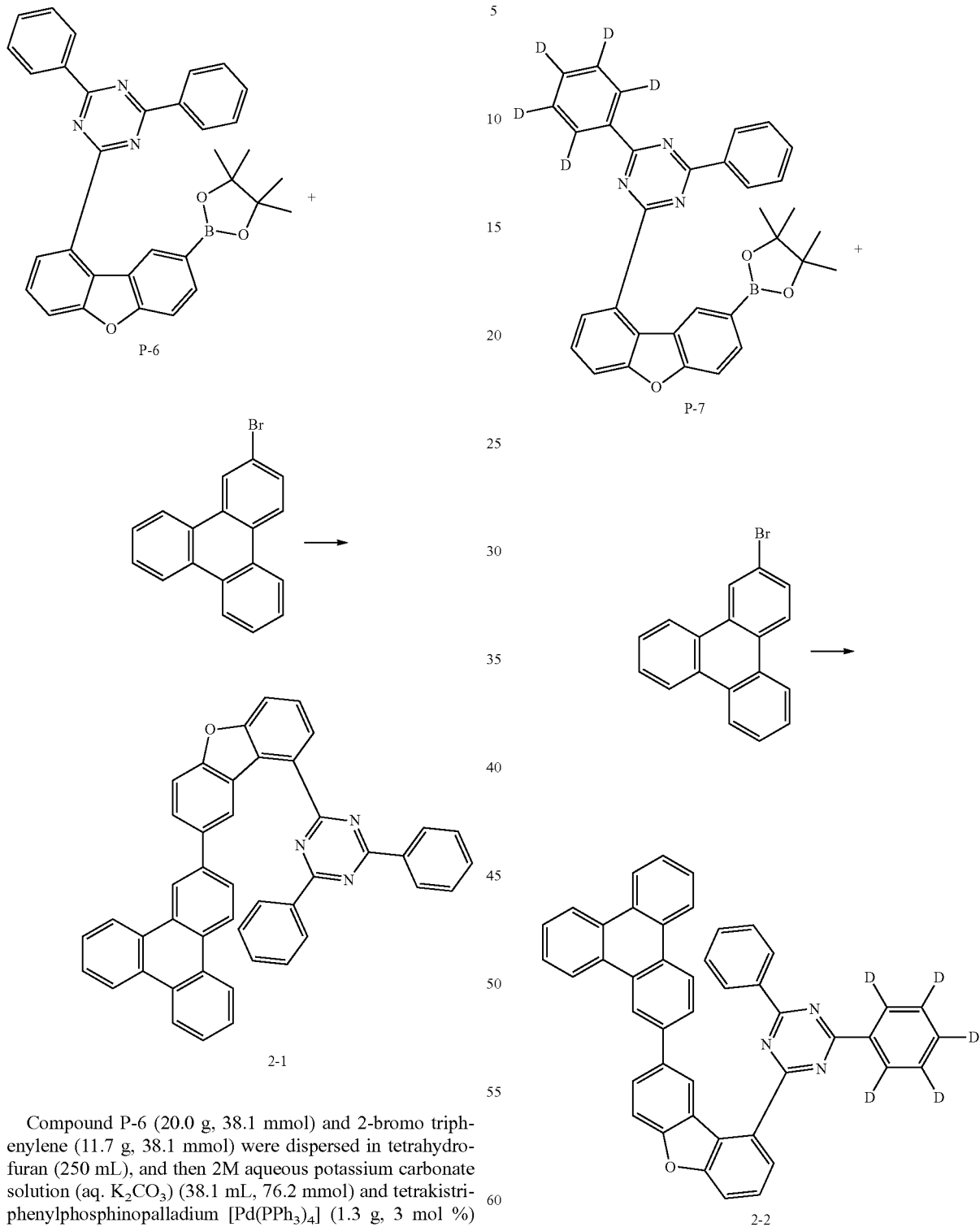

Compound P-6 (20.0 g, 38.1 mmol) and 2-bromo triphenylene (11.7 g, 38.1 mmol) were dispersed in tetrahydrofuran (250 mL), and then 2M aqueous potassium carbonate solution (aq. $K_2CO_3$) (38.1 mL, 76.2 mmol) and tetrakistriphenylphosphinopalladium [$Pd(PPh_3)_4$] (1.3 g, 3 mol %) were added, and the mixture was stirred and refluxed for 4 hours. The temperature of the mixture was lowered to room temperature and the resulting solid was filtered. The filtered solid was recrystallized from tetrahydrofuran and ethyl acetate, filtered, and then dried to prepare Compound 2-1 (14.5 g, yield: 61%; MS: [M+H]$^+$=626).

Compound 2-2 (MS: [M+H]$^+$=631) was synthesized in the same manner as in step 7 of Synthesis Example 2-1, except that Compound P-7 was used instead of Compound P-6.

Synthesis Example 2-3: Synthesis of Compound 2-6

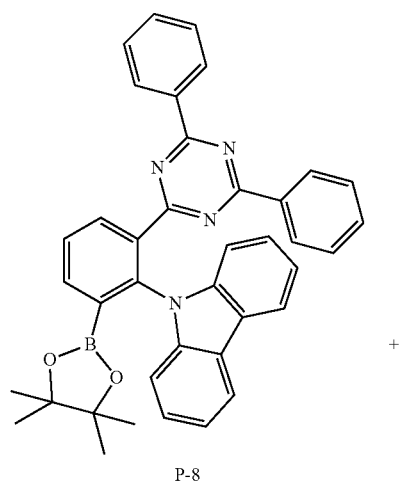

P-8

+

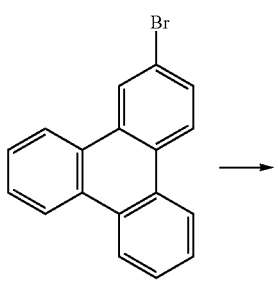

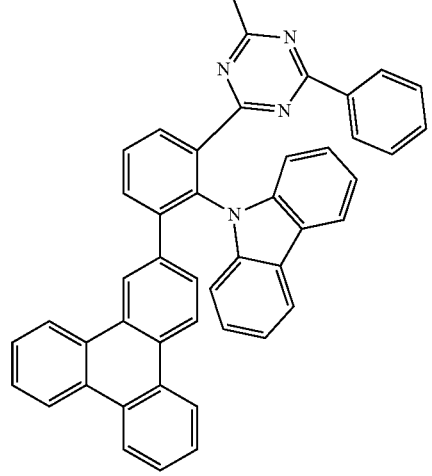

2-6

Compound 2-6 (MS: [M+H]$^+$=701) was synthesized in the same manner as in step 7 of Synthesis Example 2-1, except that Compound P-8 was used instead of Compound P-6.

Synthesis Example 2-4: Synthesis of Compound 2-17

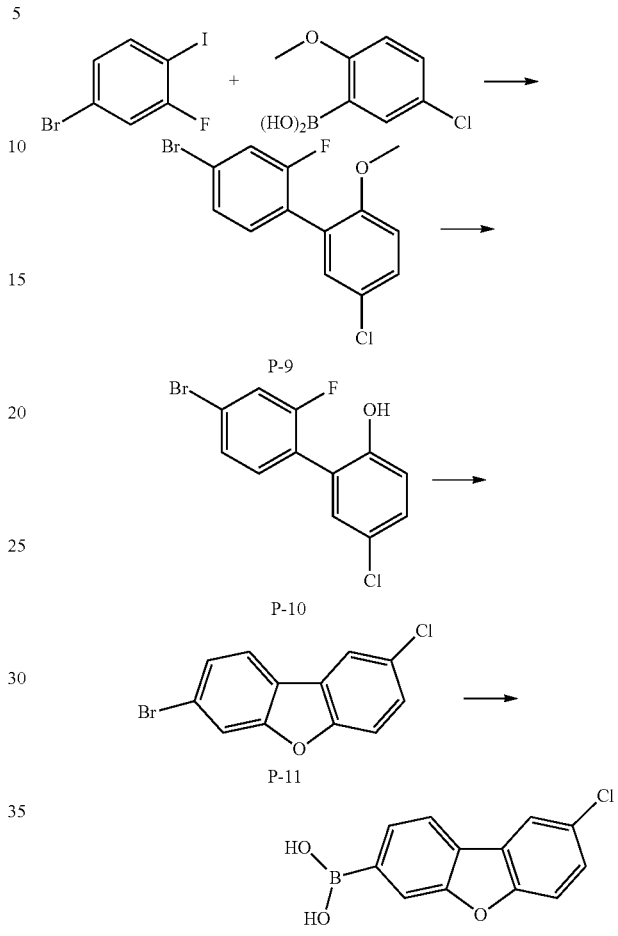

Step 1) Synthesis of Compound P-9

Compound P-9 (62.3 g, yield: 79%; MS: [M+H]$^+$=315) was prepared in the same manner as in the Synthesis of Compound P-1 in step 1 of Synthesis Example 2-1, except that in step 1 of Synthesis Example 2-1, 1-bromo-3-fluoro-2-iodobenzene was changed to 4-bromo-2-fluoro-1-iodobenzene.

Step 2) Synthesis of Compound P-10

Compound P-10 (51.7 g, yield: 87%; MS: [M+H]$^+$=300) was synthesized in the same manner as in the Synthesis of Compound P-2 in step 2 of Synthesis Example 2-1, except that in step 2 of Synthesis Example 2-1, Compound P-9 was used instead of Compound P-1.

Step 3) Synthesis of Compound P-11

Compound P-11 (41.8 g, yield: 87%; MS: [M+H]$^+$=280) was synthesized in the same manner as in the Synthesis of Compound P-3 in step 3 of Synthesis Example 2-1, except that in step 3 of Synthesis Example 2-1, Compound P-10 was used instead of Compound P-2.

Step 4) Synthesis of Compound P-12

Compound P-12 (31.2 g, yield: 85%; MS: [M+H]$^+$=247) was synthesized in the same manner as in the Synthesis of Compound P-4 in step 4 of Synthesis Example 2-1, except that in step 4 of Synthesis Example 2-1, Compound P-11 was used instead of Compound P-3.

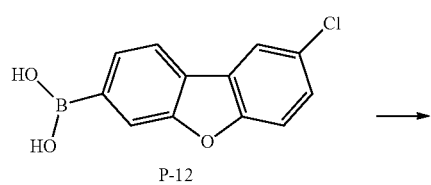

P-12

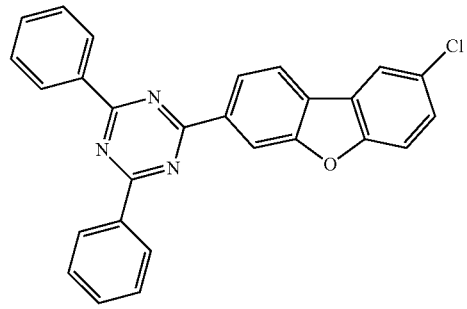

P-13

Step 5) Synthesis of Compound P-13

Compound P-13 (MS: [M+H]$^+$=434) was synthesized in the same manner as in the Synthesis of Compound P-5 in step 5 of Synthesis Example 2-1, except that in step 5 of Synthesis Example 2-1, Compound P-12 was used instead of Compound P-4.

Step 6) Synthesis of Compound P-14

Compound P-14 (MS: [M+EH]=434) was synthesized in the same manner as in the Synthesis of Compound P-6 in step 6 of Synthesis Example 2-1, except that in step 6 of Synthesis Example 2-1, Compound P-13 was used instead of Compound P-5.

Step 7) Synthesis of Compound 2-17

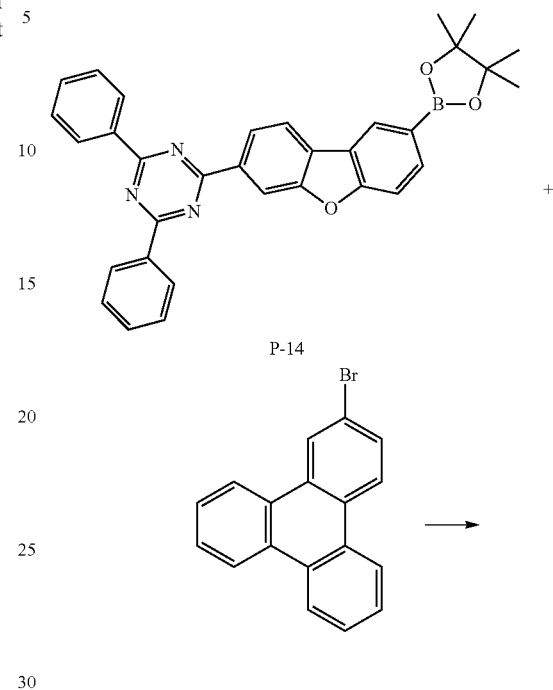

P-14

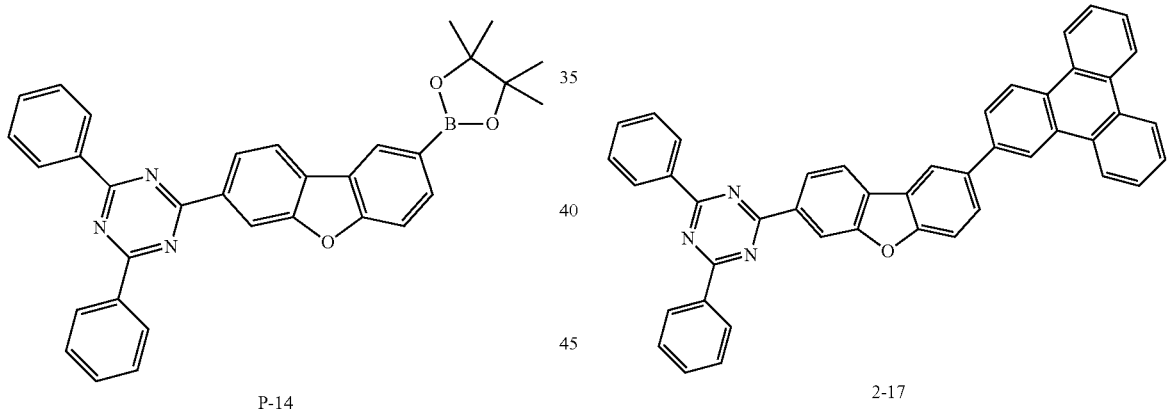

2-17

Compound 2-17 (MS: [M+H]$^+$=626) was synthesized in the same manner as in the Synthesis of Compound 2-1 in step 7 of Synthesis Example 2-1, except that in step 7 of Synthesis Example 2-1, Compound P-14 was used instead of Compound P-6.

Synthesis Example 2-5: Synthesis of Compound 2-20

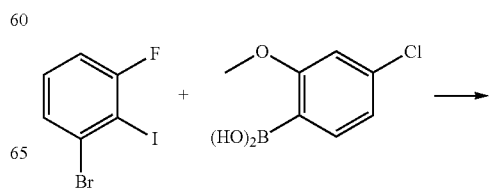

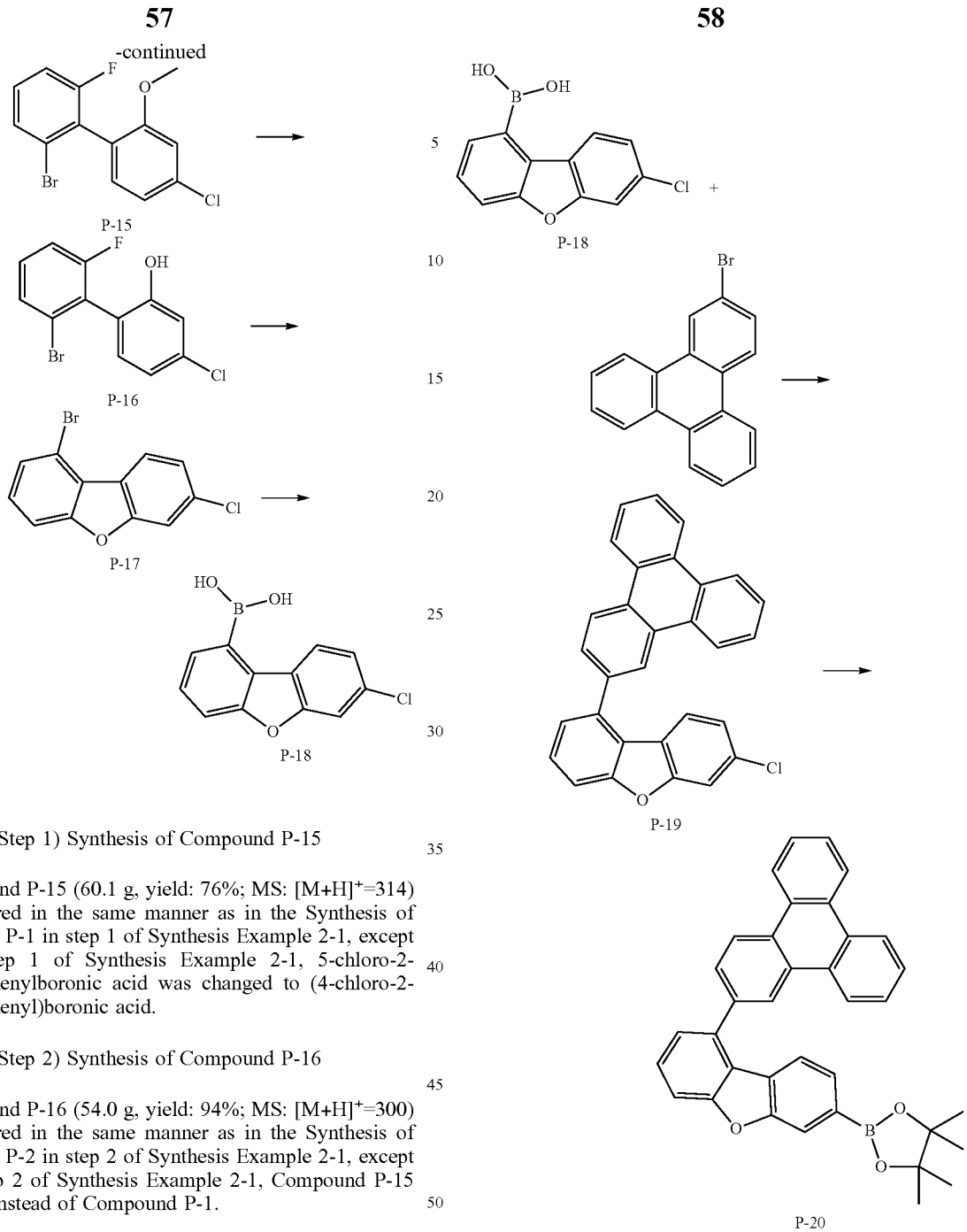

Step 1) Synthesis of Compound P-15

Compound P-15 (60.1 g, yield: 76%; MS: [M+H]$^+$=314) was prepared in the same manner as in the Synthesis of Compound P-1 in step 1 of Synthesis Example 2-1, except that in step 1 of Synthesis Example 2-1, 5-chloro-2-methoxyphenylboronic acid was changed to (4-chloro-2-methoxyphenyl)boronic acid.

Step 2) Synthesis of Compound P-16

Compound P-16 (54.0 g, yield: 94%; MS: [M+H]$^+$=300) was prepared in the same manner as in the Synthesis of Compound P-2 in step 2 of Synthesis Example 2-1, except that in step 2 of Synthesis Example 2-1, Compound P-15 was used instead of Compound P-1.

Step 3) Synthesis of Compound P-17

Compound P-17 (42.2 g, yield: 83%; MS: [M+H]$^+$=280) was prepared in the same manner as in the Synthesis of Compound P-3 in step 3 of Synthesis Example 2-1, except that in step 3 of Synthesis Example 2-1, Compound P-16 was used instead of Compound P-2.

Step 4) Synthesis of Compound P-18

Compound P-18 (34.1 g, yield: 92%; MS: [M+H]$^+$=247) was prepared in the same manner as in the Synthesis of Compound P-4 in step 4 of Synthesis Example 2-1, except that in step 4 of Synthesis Example 2-1, Compound P-17 was used instead of Compound P-3.

Step 5) Synthesis of Compound P-19

Compound P-18 (20 g, 81.1 mmol) and 2-bromotriphenylene (24.9 g, 81.1 mmol) were added to 400 mL of tetrahydrofuran under a nitrogen atmosphere, and the mixture was stirred and refluxed. Then, potassium carbonate (22.4 g, 162.3 mmol) was dissolved in 100 mL of water, added thereto, sufficiently stirred, and then tetrakistriphenylphosphinopalladium (0.9 g, 0.8 mmol) was added. After the reaction for 5 hours, the reaction mixture was cooled to room temperature, and the organic layer and the aqueous layer were separated and then the organic layer was distilled. This was again added to and dissolved in 424 ml of chloroform, washed twice with water, and then the organic layer was separated, anhydrous magnesium sulfate was added thereto, stirred, and then filtered, and the filtrate was distilled under reduced pressure. The concentrated compound was recrystallized from chloroform and ethyl acetate to prepare a solid Compound P-19 (28.1 g, 81%, MS: [M+H]$^+$=429).

Step 6) Synthesis of Compound P-20

Compound P-20 (MS: [M+H]$^+$=521) was prepared in the same manner as in the Synthesis of Compound P-6 in step 6 of Synthesis Example 2-1, except that in step 6 of Synthesis Example 2-1, Compound P-19 was used instead of Compound P-5.

Step 7) Synthesis of Compound 2-20

Compound P-20 (20 g, 38.4 mmol) and 2-chloro-4-phenyl-6-(phenyl-d5)-1,3,5-triazine (10.5 g, 38.4 mmol) were added to 500 mL of tetrahydrofuran under a nitrogen atmosphere, and the mixture was stirred and refluxed. Then, potassium carbonate (15.9 g, 115 mmol) was dissolved in 80 mL of water, added thereto, sufficiently stirred, and then bis(tri-tertiary-butylphosphine)palladium (0.2 g, 0.4 mmol) was added. After the reaction for 1 hour, the reaction mixture was cooled to room temperature, and the organic layer and the aqueous layer were separated and then the organic layer was distilled. This was again added to and dissolved in dichlorobenzene, washed twice with water, and then the organic layer was separated, anhydrous magnesium sulfate was added thereto, stirred, and then filtered, and the filtrate was distilled under reduced pressure. The concentrated compound was recrystallized from dichlorobenzene and tetrahydrofuran to prepare a solid Compound 2-20 (15.3 g, 63%, MS: [M+H]$^+$=631).

Synthesis Example 2-6: Synthesis of Compound 2-23

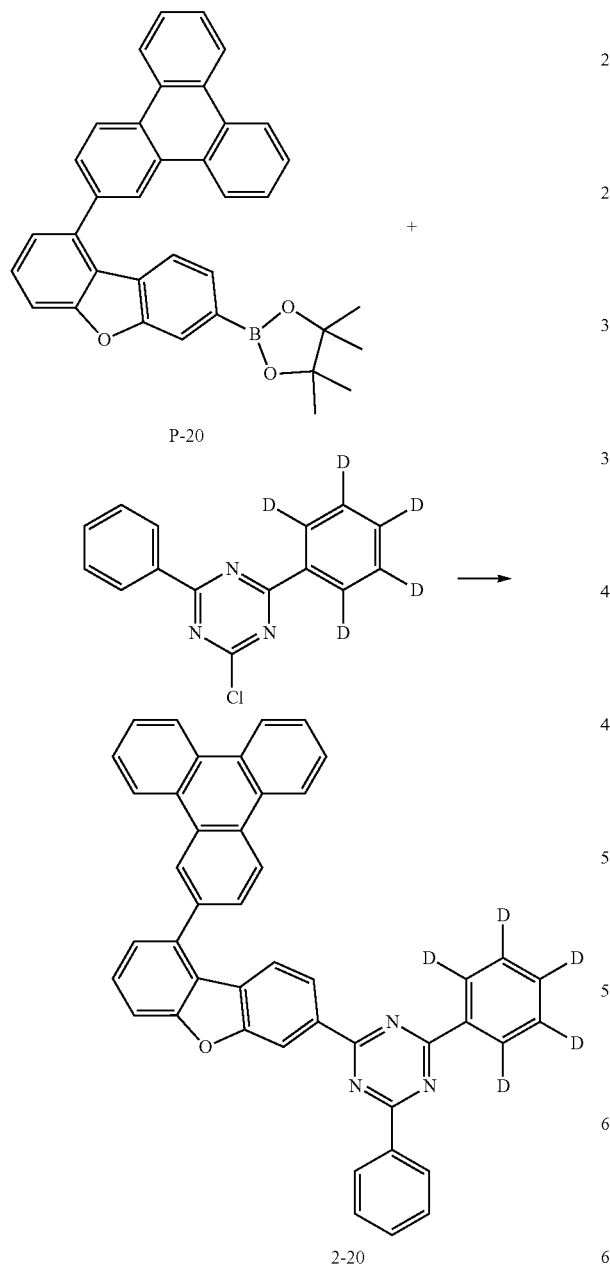

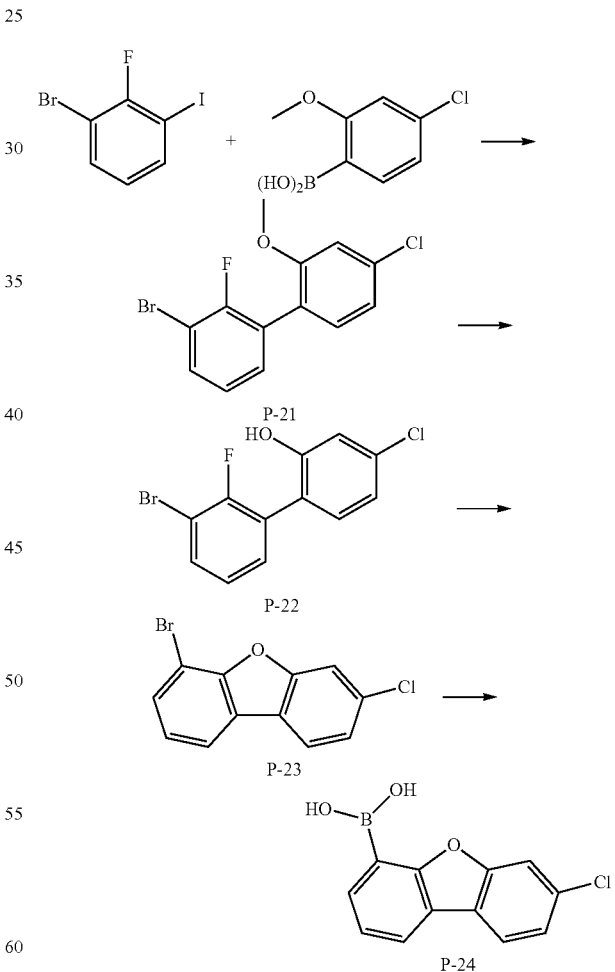

Step 1) Synthesis of Compound P-21

Compound P-21 (78.7 g, 75%, MS: [M+H]$^+$=314) was prepared in the same manner as in the Synthesis of Compound P-1 in step 1 of Synthesis Example 2-1, except that in step 1 of Synthesis Example 2-1, 1-bromo-3-fluoro-2-iodobenzene and 5-chloro-2-methoxyphenyiboronic acid were changed to 1-bromo-2-fluoro-3-iodobenzene and (4-chloro-2-methoxyphenyl)boronic acid.

Step 2) Synthesis of Compound P-22

Compound P-22 (72.9 g, yield: 97%, MS: [M+H]⁺=300) was prepared in the same manner as in the Synthesis of Compound P-2 in step 2 of Synthesis Example 2-1, except that in step 2 of Synthesis Example 2-1, Compound P-21 was used instead of Compound P-1.

Step 3) Synthesis of Compound P-23

Compound P-23 (57.1 g, yield: 84%, MS: [M+H]⁺=280) was prepared in the same manner as in the Synthesis of Compound P-3 in step 3 of Synthesis Example 2-1, except that in step 3 of Synthesis Example 2-1, Compound P-22 was used instead of Compound P-2.

Step 4) Synthesis of Compound P-24

Compound P-24 (44.9 g, yield: 90%, MS: [M+H]⁺=247) was prepared in the same manner as in the Synthesis of Compound P-4 in step 4 of Synthesis Example 2-1, except that in step 4 of Synthesis Example 2-1, Compound P-23 was used instead of Compound P-3.

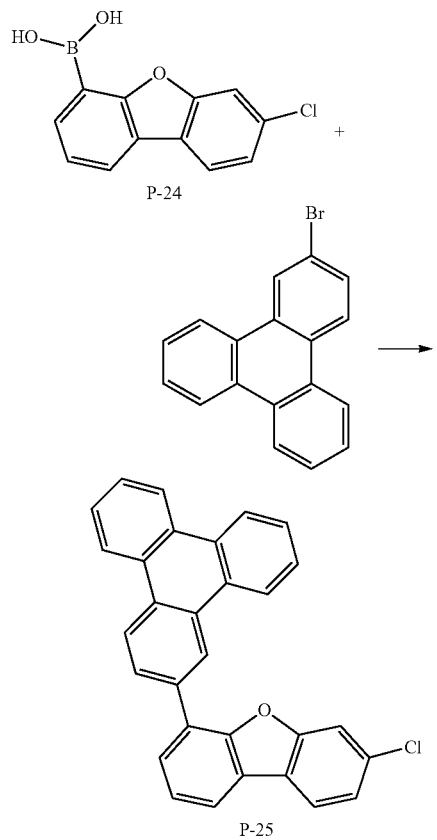

Step 5) Synthesis of Compound P-25

Compound P-25 (MS: [M+H]⁺=429) was prepared in the same manner as in the Synthesis of Compound P-19 in step 5 of Synthesis Example 2-5, except that in step 5 of Synthesis Example 2-5, Compound P-24 was used instead of Compound P-18.

Step 6) Synthesis of Compound P-26

Compound P-26 (MS: [M+H]⁺=521) was prepared in the same manner as in the Synthesis of Compound P-6 in step 6 of Synthesis Example 2-1, except that in step 6 of Synthesis Example 2-1, Compound P-25 was used instead of Compound P-5.

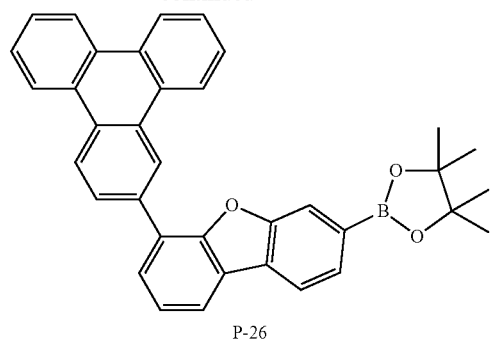

Step 7) Synthesis of Compound 2-23

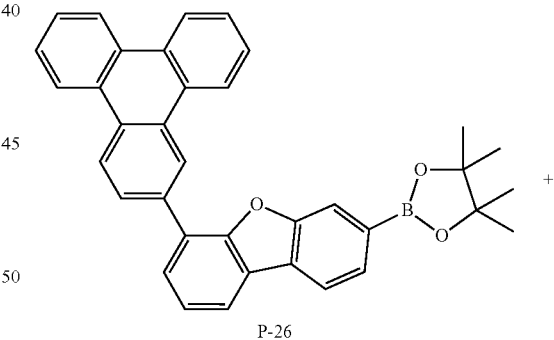

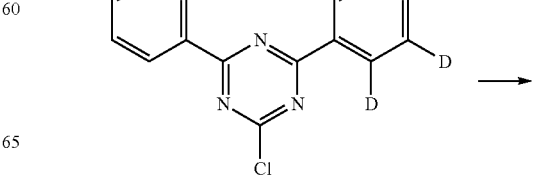

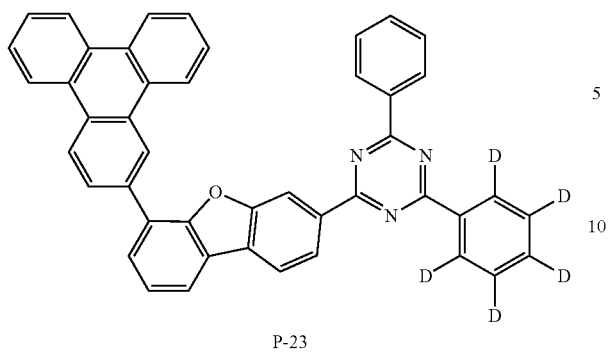

P-23

Compound 2-23 (MS: [M+H]$^+$=631) was prepared in the same manner as in the Synthesis of Compound 2-20 in step 7 of Synthesis Example 2-5, except that in step 7 of Synthesis Example 2-5, Compound P-26 was used instead of Compound P-20.

Synthesis Example 2-7: Synthesis of Compound 2-27

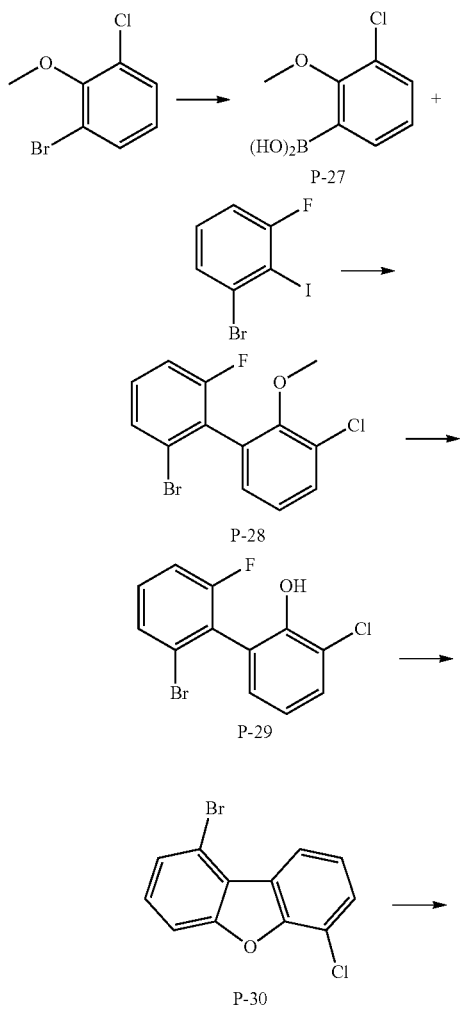

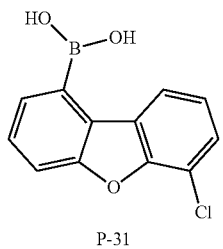

P-31

Step 1) Synthesis of Compound P-27

1-Bromo-3-chloro-2-methoxybenzene (100.0 g, 451.5 mmol) was dissolved in tetrahydrofuran (1000 mL), and then the temperature was lowered to −78° C., to which 2.5M tert-butyllithium (t-BuLi) (182.4 mL, 456.0 mmol) was added slowly. The mixture was stirred at the same temperature for one hour, and then triisopropylborate (B(OiPr)$_3$) (156.3 mL, 677.3 mmol) was added thereto. The mixture was stirred for 3 hours while gradually raising the temperature to room temperature. 2 N aqueous hydrochloric acid solution (150 mL) was added to the reaction mixture and stirred at room temperature for 1.5 hours. The resulting precipitate was filtered, washed sequentially with water and ethyl ether, and then vacuum dried. After drying, the resultant was recrystallized from chloroform and ethyl acetate and dried to prepare Compound P-27 (84.2 g, yield: 90%; MS: [M+H]$^+$=230).

Step 2) Synthesis of Compound P-28

Compound P-28 (74.6 g, yield: 52%; MS: [M+H]$^+$=314) was prepared in the same manner as in the Synthesis of Compound P-1 in step 1 of Synthesis Example 2-1, except that in step 1 of Synthesis Example 2-1, 5-chloro-2-methoxyphenylboronic acid was changed to Compound P-27.

Step 3) Synthesis of Compound P-29

Compound P-29 (60.3 g, yield: 85%; MS: [M+H]$^+$=300) was prepared in the same manner as in the Synthesis of Compound P-2 in step 2 of Synthesis Example 2-1, except that in step 2 of Synthesis Example 2-1, Compound P-28 was used instead of Compound P-1.

Step 4) Synthesis of Compound P-30

Compound P-30 (48.1 g, yield: 85%; MS: [M+H]$^+$=280) was prepared in the same manner as in the Synthesis of Compound P-3 in step 3 of Synthesis Example 2-1, except that in step 3 of Synthesis Example 2-1, Compound P-29 was used instead of Compound P-2.

Step 5) Synthesis of Compound P-31

Compound P-31 (40.1 g, yield: 95%; MS: [M+H]$^+$=247) was prepared in the same manner as in the Synthesis of Compound P-4 in step 4 of Synthesis Example 2-1, except that in step 4 of Synthesis Example 2-1, Compound P-30 was used instead of Compound P-3.

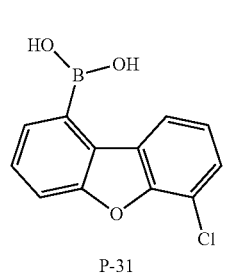

P-31

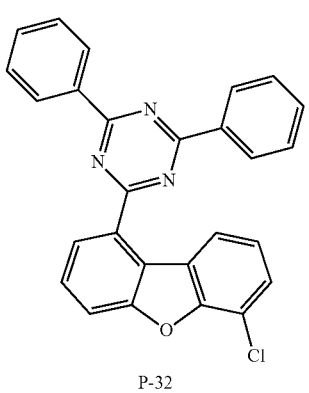

P-32

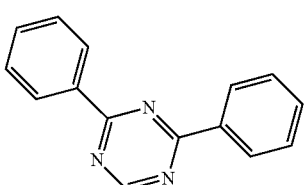
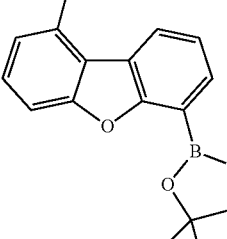

P-33

Step 6) Synthesis of Compound P-32

Compound P-32 (MS: [M+H]⁺=434) was prepared in the same manner as in the Synthesis of Compound P-5 in step 5 of Synthesis Example 2-1, except that in step 5 of Synthesis Example 2-1, Compound P-31 was used instead of Compound P-4.

Step 7) Synthesis of Compound P-33

Compound P-33 (MS: [M+H]⁺=434) was prepared in the same manner as in the Synthesis of Compound P-6 in step 6 of Synthesis Example 2-1, except that in step 6 of Synthesis Example 2-1, Compound P-32 was used instead of Compound P-5.

Step 8) Synthesis of Compound 2-27

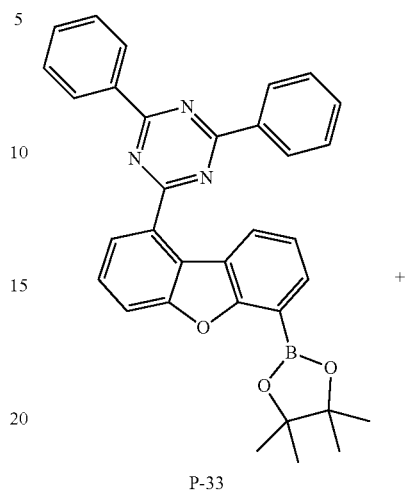

P-33

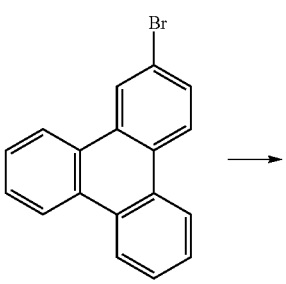

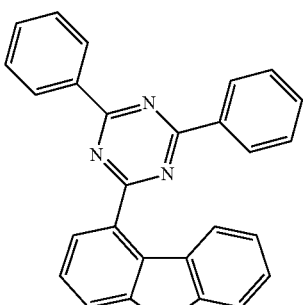

2-27

Compound 2-27 (MS: [M+H]⁺=626) was prepared in the same manner as in the Synthesis of Compound 2-1 in step 7 of Synthesis Example 2-1, except that in step 7 of Synthesis Example 2-1, Compound P-33 was used instead of Compound P-6.

Synthesis Example 2-8: Synthesis of Compound 2-37

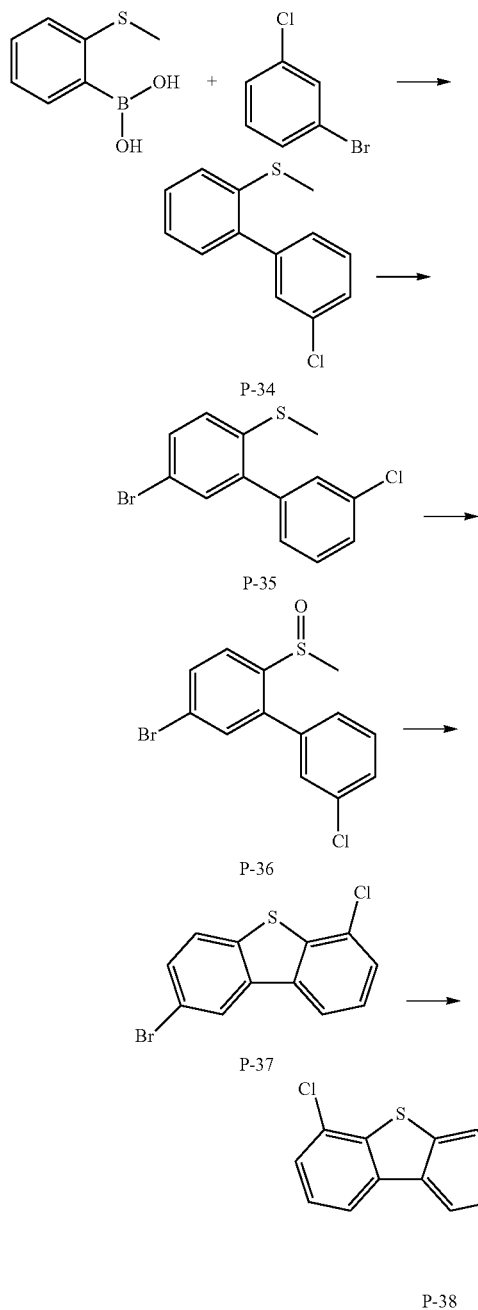

P-34

P-35

P-36

P-37

P-38

Step 1) Synthesis of Compound P-34

Compound P-34 (49 g, yield: 79%; MS: [M+EH]$^+$=235) was prepared in the same manner as in the Synthesis of Compound P-1 in step 1 of Synthesis Example 2-1, except that in step 1 of Synthesis Example 2-1, 1-bromo-3-fluoro-2-iodobenzene and 5-chloro-2-methoxyphenylboronic acid were changed to 1-bromo-3-chlorobenzene and (2-(methylthio)phenyl)boronic acid.

Step 2) Synthesis of Compound P-35

Acetic acid (420 mL) was added to Compound P-34 (49.0 g, 148.5 mmol) under a nitrogen atmosphere, to which bromine (13.9 mL, 271 mmol) was added and stirred at 65° C. for 3 hours. After cooling, water was added to the mixture, and the precipitated solid was filtered and washed three times with water. The filtered filtrate was recrystallized from acetonitrile and toluene to prepare Compound P-35 (50.3 g, yield: 77%; MS: [M+H]$^+$=314).

Step 3) Synthesis of Compound P-36

Acetic acid (530 mL) was added to Compound P-35 (50.3 g, 160 mmol), to which 35% hydrogen peroxide (16.4 g) was added and stirred at room temperature for 5 hours. An aqueous NaOH solution was added to the reaction mixture and stirred for 20 minutes, then ethyl acetate was added and the aqueous layer was removed. The mixture was dried over anhydrous magnesium sulfate and concentrated under reduced pressure. The resultant was recrystallized using a mixed solution of tetrahydrofuran and ethyl acetate, and then dried to prepare Compound P-36 (43.2 g, yield: 87%, MS: [M+H]$^+$=308).

Step 4) Synthesis of Compound P-37

Compound P-36 (43.2 g, 160 mmol) was added to sulfuric acid (220 mL), and the mixture was stirred at room temperature for 5 hours. An aqueous NaOH solution was added to the reaction mixture, stirred for 30 minutes, and then chloroform was added thereto, and the layers were separated and then washed 3 times with water. Ethyl acetate was added and the aqueous layer was removed. The reaction mixture was dried over anhydrous magnesium sulfate and concentrated under reduced pressure. The resultant was recrystallized using a mixed solution of tetrahydrofuran and ethyl acetate, and then dried to Compound P-37 (30.6 g, yield: 74%, MS: [M+H]$^+$=296).

Step 5) Synthesis of Compound P-38

Compound P-38 (20.4 g, yield: 75%; MS: [M+H]$^+$=263) was prepared in the same manner as in the Synthesis of Compound P-4 in step 4 of Synthesis Example 2-1, except that in step 4 of Synthesis Example 2-1, Compound P-37 was used instead of Compound P-3.

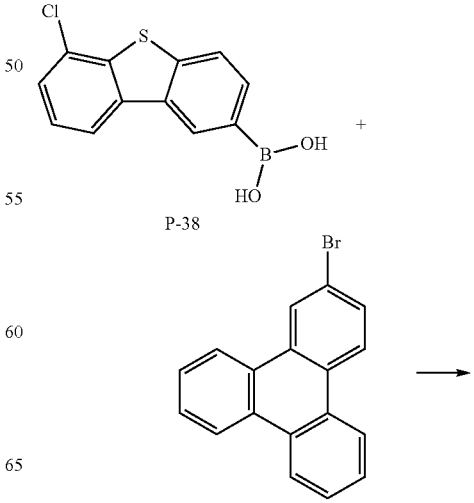

P-38

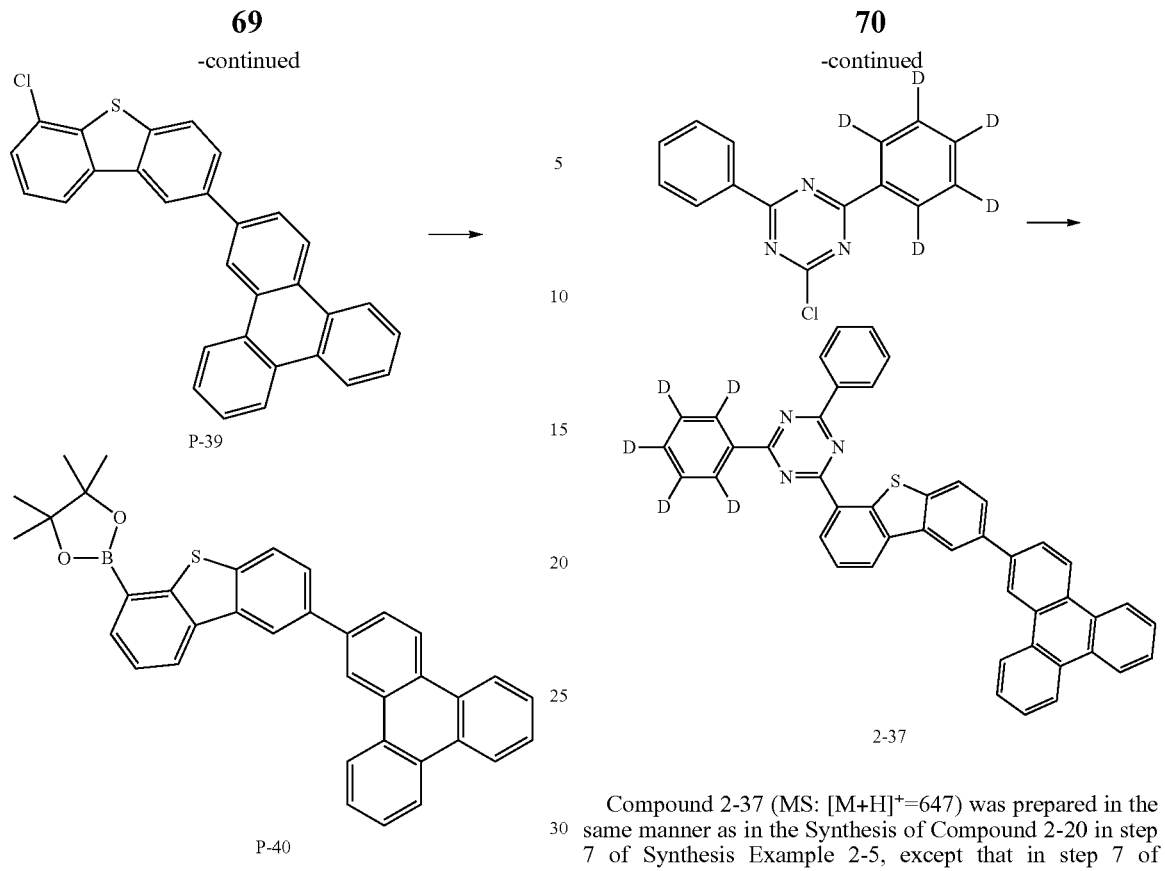

P-39

P-40

Step 6) Synthesis of Compound P-39

Compound P-39 (MS: [M+H]$^+$=445) was prepared in the same manner as in the Synthesis of Compound P-19 in step 5 of Synthesis Example 2-5, except that in step 5 of Synthesis Example 2-5, Compound P-38 was used instead of Compound P-18.

Step 7) Synthesis of Compound P-40

Compound P-40 (MS: [M+H]$^+$=537) was prepared in the same manner as in the Synthesis of Compound P-6 in step 6 of Synthesis Example 2-1, except that in step 6 of Synthesis Example 2-1, Compound P-39 was used instead of Compound P-5.

Step 8) Synthesis of Compound 2-37

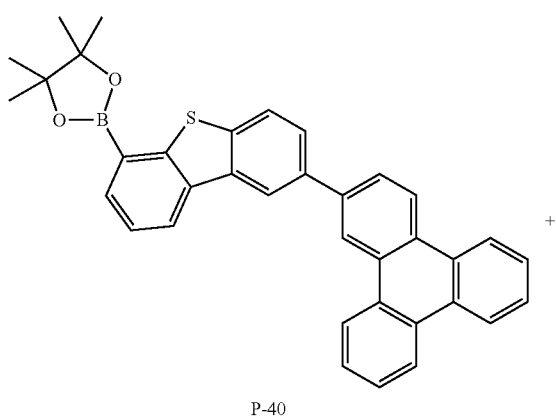

P-40

2-37

Compound 2-37 (MS: [M+H]$^+$=647) was prepared in the same manner as in the Synthesis of Compound 2-20 in step 7 of Synthesis Example 2-5, except that in step 7 of Synthesis Example 2-5, Compound P-40 was used instead of Compound P-20.

EXAMPLES

Example 1

A glass substrate on which a thin film of ITO (indium tin oxide) was coated in a thickness of 1,300 Å was put into distilled water containing the detergent dissolved therein and washed by the ultrasonic wave. In this case, the used detergent was a product commercially available from Fisher Co. and the distilled water was one which had been twice filtered by using a filter commercially available from Millipore Co. The ITO was washed for 30 minutes, and ultrasonic washing was then repeated twice for 10 minutes by using distilled water. After the washing with distilled water was completed, the substrate was ultrasonically washed with isopropyl alcohol and acetone solvent, and dried, after which the substrate was washed for 5 minutes, and the substrate was transported to a glove box maintained at an oxygen concentration of 10 ppm or less and a moisture concentration of 10 ppm or less.

On the ITO transparent electrode thus prepared, a compound HTL1 below and P-dopant below were vacuum-deposited in a weight ratio of 100:2 to a thickness of 100 Å to form a hole injection layer. A compound HTL1 below was vacuum-deposited to a thickness of 1100 Å thereon, and then a compound HTL2 below was vacuum-deposited sequentially to a thickness of 300 Å, and then a compound EBL below was vacuum-deposited to a thickness of 300 Å to form a hole transport layer.

The previously prepared compound 1-1, the previously prepared compound 2-1 and a compound G-D below were vacuum-deposited in a weight ratio of 50:50:6 to a thickness of 350 Å on the hole transport layer to form a light emitting layer.

A compound HBL below was vacuum-deposited to a thickness of 30 Å on the light emitting layer, and a compound ETL below and a compound LiQ below were sequentially vacuum-deposited to have a thickness of 180 Å and 90 Å, thereby forming an electron transport layer. LiF and Yb were vacuum-deposited in a ratio of 1:1 to a thickness of 20 Å to form an electron injection layer thereon. Aluminum was deposited to a thickness of 1000 Å on the electron injection layer to manufacture an organic light emitting device. Subsequently, the final organic light emitting device was manufactured through an aging process of being left in an oven at 110° C. for 40 minutes.

HTL1

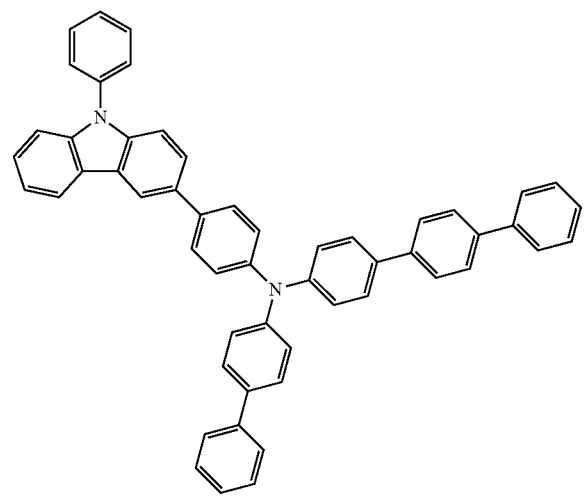

HTL2

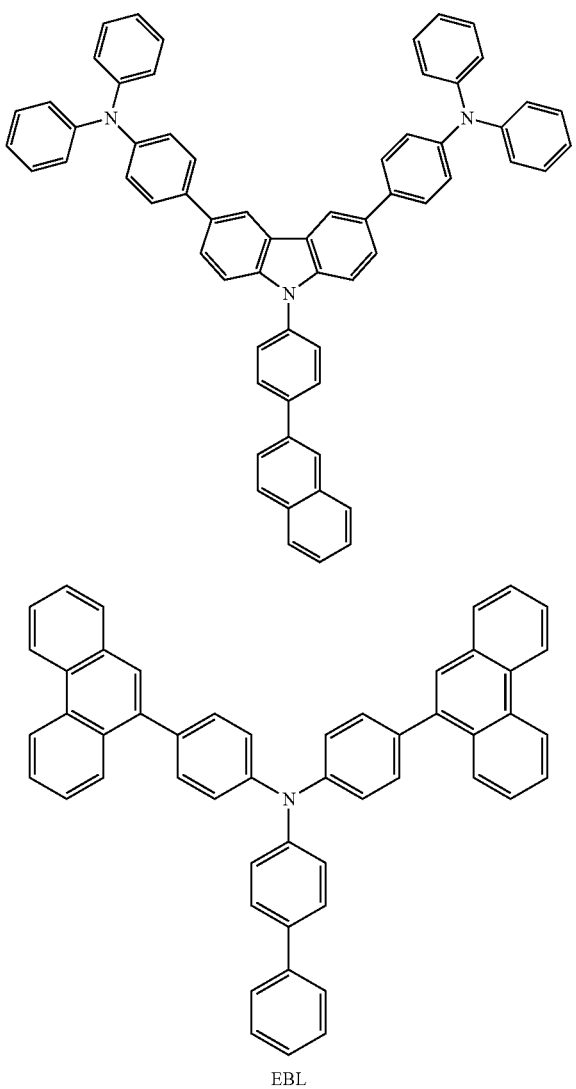

EBL

P-Dopant

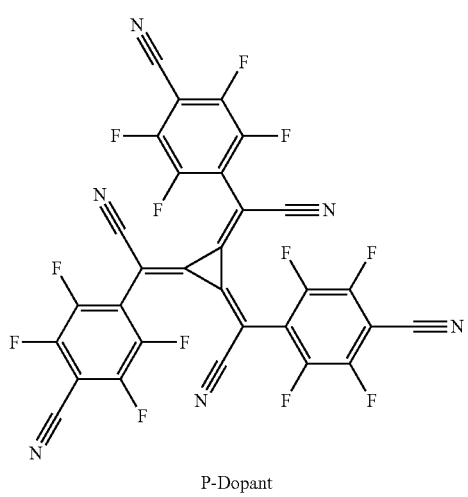

1-1

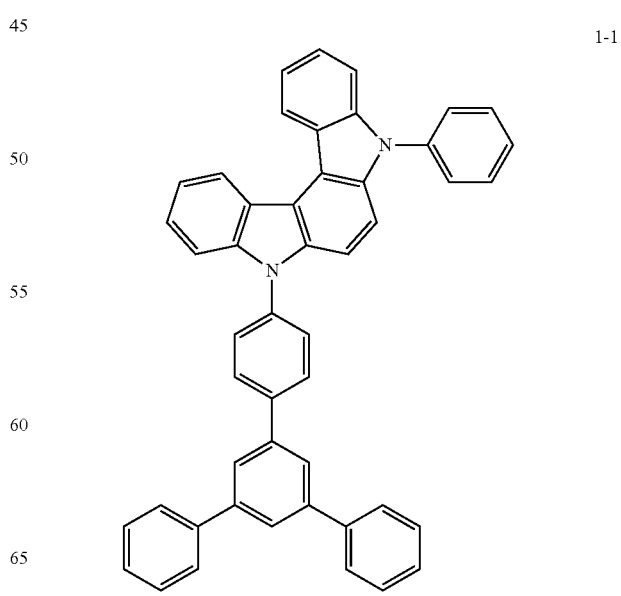

-continued

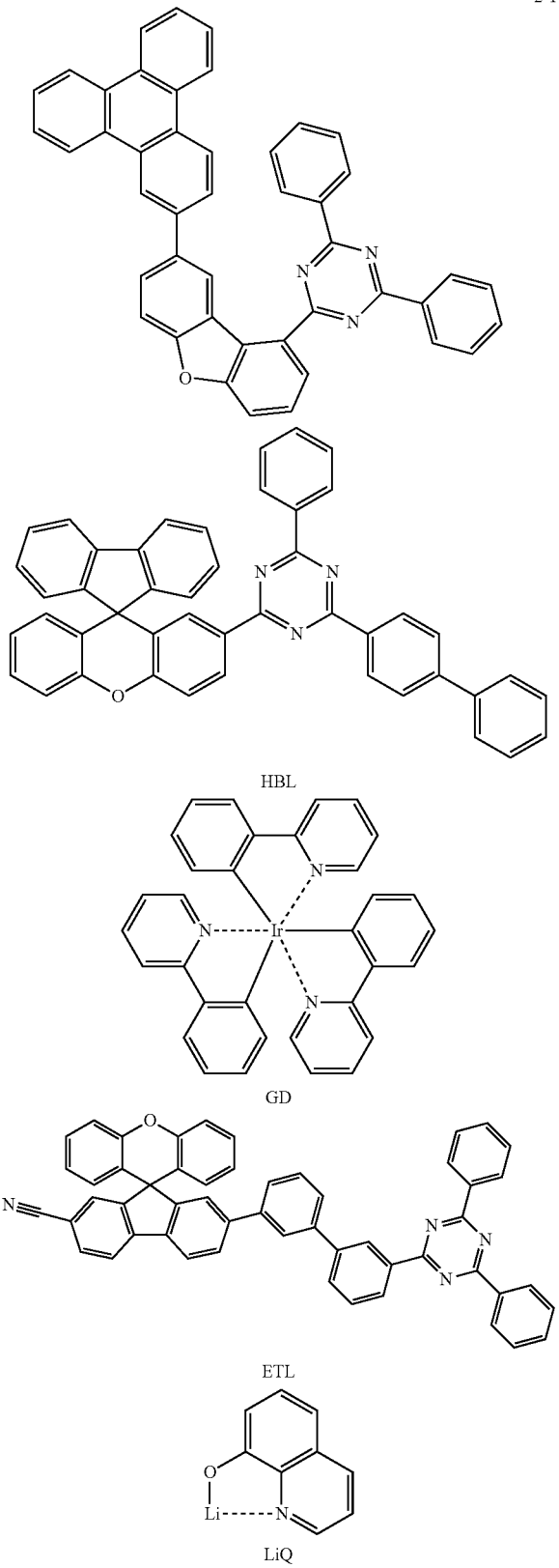

HBL

GD

ETL

LiQ

For the deposition in the above process, a cluster-type vacuum evaporator (Selcos) was used. The vapor deposition rate of the organic material was maintained at 0.4 to 0.7 Å/sec, the deposition rate of aluminum of the cathode was maintained at 2 Å/sec, and the degree of vacuum during the deposition was maintained at $1.0 \times 10^{-7}$ torr.

Examples 2 to 17, and Comparative Examples 1 to 3

The organic light emitting devices were manufactured in the same manner as in Example 1, except that in Example 1, the compounds shown in Table 1 below were used instead of Compounds 1-1 and 2-1 as the host compound of the light emitting layer. In the table below, P-Host and N-Host are as follows.

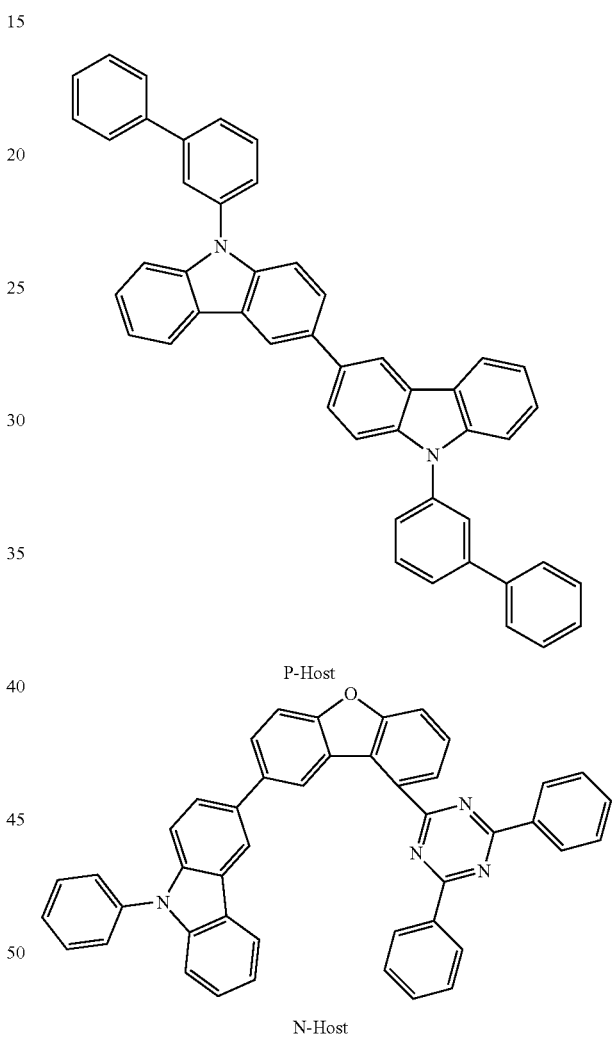

P-Host

N-Host

The driving voltage (V), current efficiency (cd), power efficiency (lm), color coordinates (CIE) and lifetime (LT97) were measured by applying a current of 10 mA/cm² to the organic light emitting devices manufactured in Examples and Comparative Examples, the lifetime LT97 when the current of 20 mA/cm² is applied is measured, and the results are shown in Table 1 below. LT97 means the time required for the luminance to be reduced to 97% of the initial luminance (1600 nit) at a current density of 20 mA/cm².

Photo Research's PR-670 (Power source: 2635B (Keithley)) was used for IVL measuring instrument, and McScience's M6000 was used for lifespan measurement.

TABLE 1

| | Light emitting layer (weight ratio) | V | cd/A | lm/w | CIE-x | CIE-y | LT97 (hr) |
|---|---|---|---|---|---|---|---|
| Comparative example 1 | P-Host & N-Host & GD (50:50:6) | 4.25 | 63.95 | 47.25 | 0.352 | 0.617 | 175.51 |
| Comparative example 2 | P-Host & 2-1 & GD (50:50:6) | 4.29 | 61.18 | 44.78 | 0.357 | 0.612 | 174.68 |
| Comparative example 3 | 1-1 & N-Host & GD (50:50:6) | 4.46 | 65.11 | 45.84 | 0.354 | 0.617 | 166.01 |
| Example 1 | 1-1 & 2-1 & GD (50:50:6) | 3.92 | 65.20 | 52.23 | 0.358 | 0.614 | 218.01 |
| Example 2 | 1-1 & 2-1 & GD (60:40:6) | 3.99 | 66.52 | 52.35 | 0.359 | 0.612 | 236.78 |
| Example 3 | 1-2 & 2-1 & GD (50:50:6) | 3.92 | 61.35 | 49.14 | 0.359 | 0.613 | 187.72 |
| Example 4 | 1-2 & 2-1 & GD (60:40:6) | 4.01 | 62.04 | 48.58 | 0.357 | 0.614 | 222.52 |
| Example 5 | 1-2 & 2-1 & GD (70:30:6) | 4.14 | 63.12 | 47.87 | 0.354 | 0.617 | 215.69 |
| Example 6 | 1-5 & 2-2 & GD (50:50:6) | 3.97 | 70.60 | 55.84 | 0.353 | 0.612 | 192.65 |
| Example 7 | 1-2 & 2-6 & GD (50:50:6) | 3.88 | 74.80 | 60.53 | 0.356 | 0.616 | 203.17 |
| Example 8 | 1-7 & 2-6 & GD (50:50:6) | 3.87 | 68.26 | 55.72 | 0.356 | 0.615 | 200.20 |
| Example 9 | 1-8 & 2-6 & GD (50:50:6) | 3.90 | 65.72 | 54.26 | 0.358 | 0.614 | 197.72 |
| Example 10 | 1-9 & 2-6 & GD (50:50:6) | 3.86 | 69.35 | 58.82 | 0.356 | 0.614 | 200.82 |
| Example 11 | 1-25 & 2-6 & GD (50:50:6) | 3.92 | 67.26 | 57.78 | 0.357 | 0.616 | 199.64 |
| Example 12 | 1-20 & 2-6 & GD (50:50:6) | 3.84 | 68.36 | 58.72 | 0.357 | 0.616 | 200.03 |
| Example 13 | 1-2 & 2-17 & GD (50:50:6) | 3.68 | 72.26 | 57.89 | 0.357 | 0.616 | 200.52 |
| Example 14 | 1-2 & 2-20 & GD (50:50:6) | 3.70 | 71.38 | 56.71 | 0.357 | 0.617 | 210.22 |
| Example 15 | 1-2 & 2-23 & GD (50:50:6) | 3.76 | 73.22 | 58.21 | 0.356 | 0.616 | 202.11 |
| Example 16 | 1-2 & 2-27 & GD (50:50:6) | 3.80 | 72.68 | 57.94 | 0.358 | 0.614 | 203.45 |
| Example 17 | 1-2 & 2-37 & GD (50:50:6) | 3.78 | 71.88 | 56.93 | 0.356 | 0.616 | 205.78 |

As shown in Table 1, the organic light emitting device of the present disclosure, in which the compound of Chemical Formula 1 and the compound of Chemical Formula 2 are included in the light emitting layer, has low driving voltage, high efficiency and long lifetime characteristics as compared with the organic light emitting device of Comparative Examples.

<Explanation of symbols>

1: substrate
2: anode
3: hole transport layer
4: light emitting layer
5: electron transport layer
6: cathode
7: hole injection layer
8: electron injection layer

The invention claimed is:
1. An organic light emitting device, comprising:
an anode, a hole transport layer, a light emitting layer, an electron transport layer, and a cathode,
wherein the light emitting layer comprises a compound of the following Chemical Formula 1 and a compound of the following Chemical Formula 2:

<Chemical Formula 1>

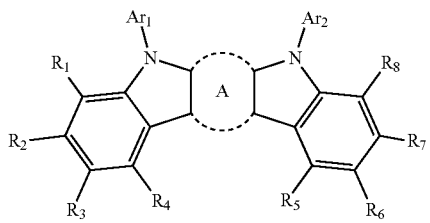

wherein in Chemical Formula 1:
A is a benzene ring fused with two adjacent pentagonal rings;

$R_1$ to $R_8$ are each independently hydrogen, deuterium, a substituted or unsubstituted $C_{1-60}$ alkyl, a substituted or unsubstituted $C_{6-60}$ aryl, or a substituted or unsubstituted $C_{2-60}$ heteroaryl containing any one or more heteroatoms selected from the group consisting of N, O and S;

$Ar_1$ and $Ar_2$ are each independently a substituted or unsubstituted $C_{6-60}$ aryl or a substituted or unsubstituted $C_{2-60}$ heteroaryl containing any one or more heteroatoms selected from the group consisting of N, O and S;

<Chemical Formula 2>

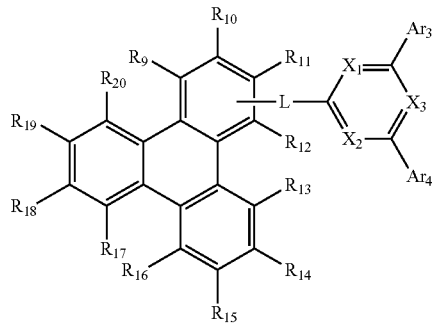

wherein in Chemical Formula 2:
$X_1$ to $X_3$ are each independently N or CH, provided that at least one of them is N;
L is

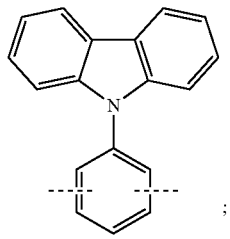

;

$Ar_3$ and $Ar_4$ are each independently a substituted or unsubstituted $C_{6-60}$ aryl or a substituted or unsubstituted $C_{2-60}$ heteroaryl containing any one or more heteroatoms selected from the group consisting of N, O and S;

any one of $R_9$ to $R_{12}$ is a bond with L, and the remaining $R_9$ to $R_{12}$ other than a bond with L are each independently hydrogen, deuterium, a substituted or unsubstituted $C_{1-60}$ alkyl, a substituted or unsubstituted $C_{6-60}$ aryl, or a substituted or unsubstituted $C_{2-60}$ heteroaryl containing any one or more heteroatoms selected from the group consisting of N, O and S; and $R_{13}$ to $R_{20}$ are each independently hydrogen, deuterium, a substituted or unsubstituted $C_{1-60}$ alkyl, a substituted or unsubstituted $C_{6-60}$ aryl, or a substituted or unsubstituted $C_{2-60}$ heteroaryl containing any one or more heteroatoms selected from the group consisting of N, O and S.

2. The organic light emitting device according to claim 1, wherein:
the Chemical Formula 1 is any one of the following Chemical Formula 1-1 to Chemical Formula 1-6:

<Chemical Formula 1-1>

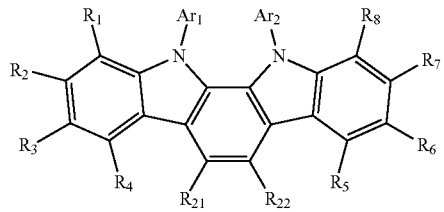

<Chemical Formula 1-2>

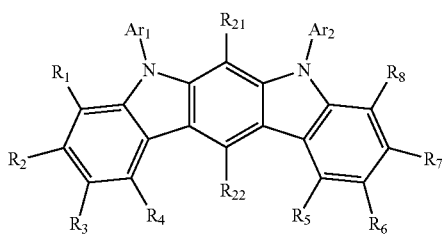

<Chemical Formula 1-3>

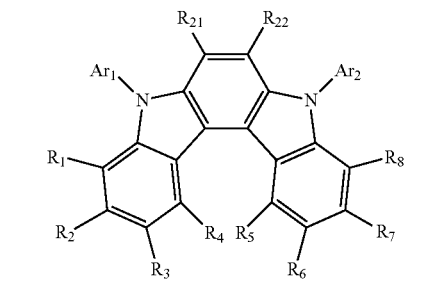

<Chemical Formula 1-4>

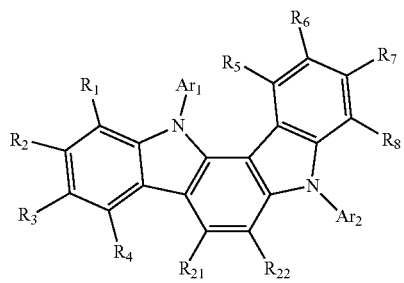

<Chemical Formula 1-5>

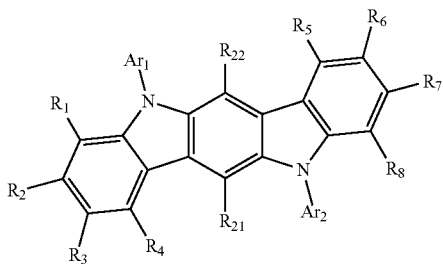

<Chemical Formula 1-6>

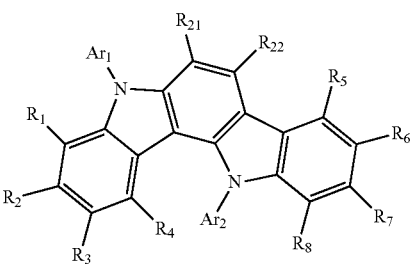

wherein in Chemical Formulas 1-1 to 1-6:
$R_1$ to $R_8$, $Ar_1$ and $Ar_2$ are as defined in claim 1; and
$R_{21}$ to $R_{22}$ are each independently hydrogen or deuterium.

3. The organic light emitting device according to claim 1, wherein:
$Ar_1$ and $Ar_2$ are each independently phenyl, biphenylyl, terphenylyl, quaterphenylyl, 3',5'-diphenylbiphenylyl, or dibenzofuranyl.

4. The organic light emitting device according to claim 1, wherein:
the compound of Chemical Formula 1 is any one compound selected from the group consisting of the following compounds:

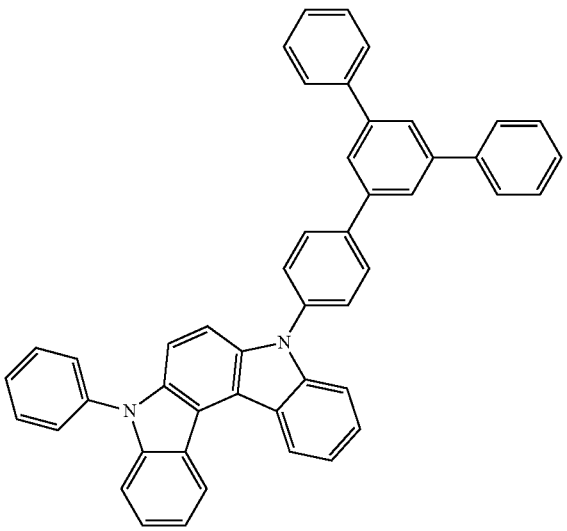

79
-continued
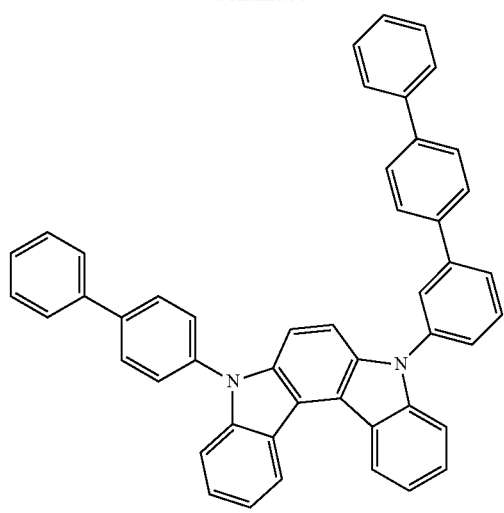
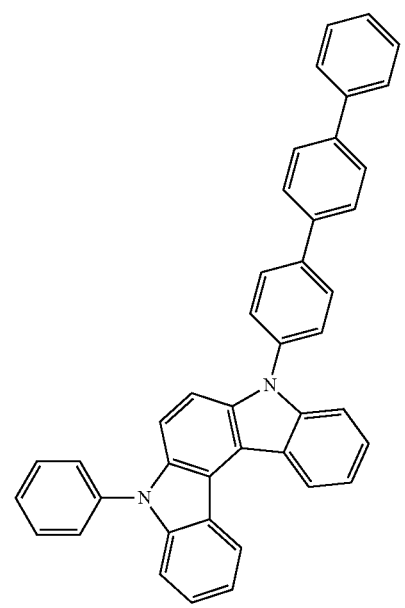
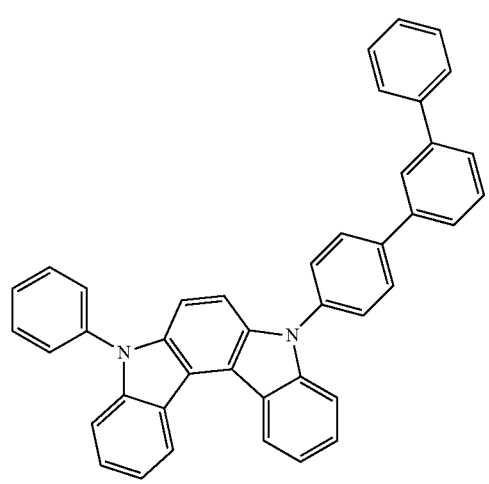
80
-continued
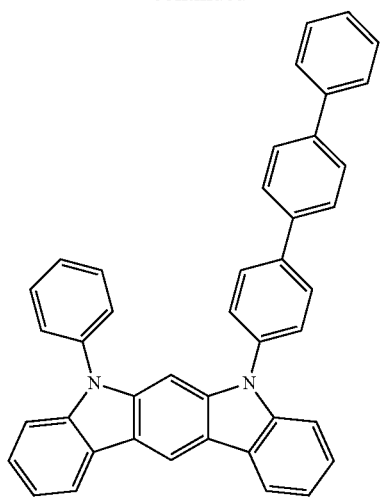
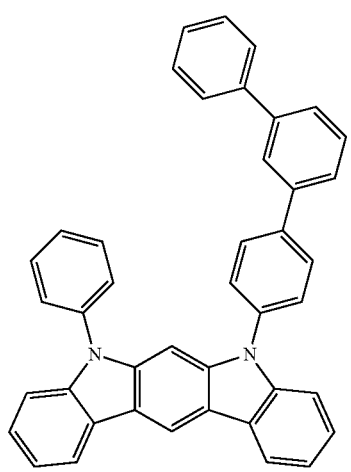
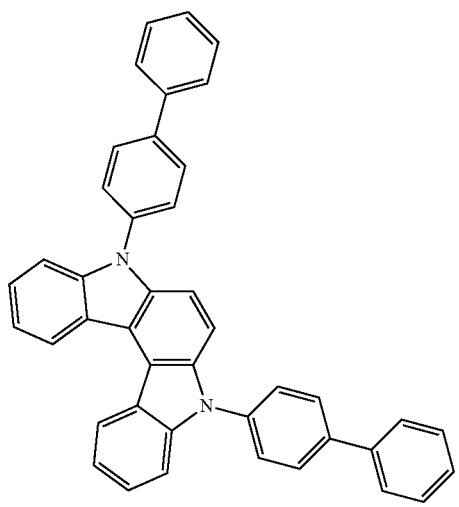

81
-continued
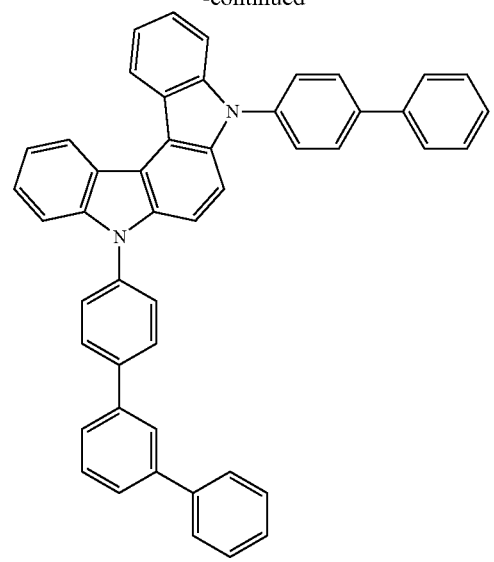
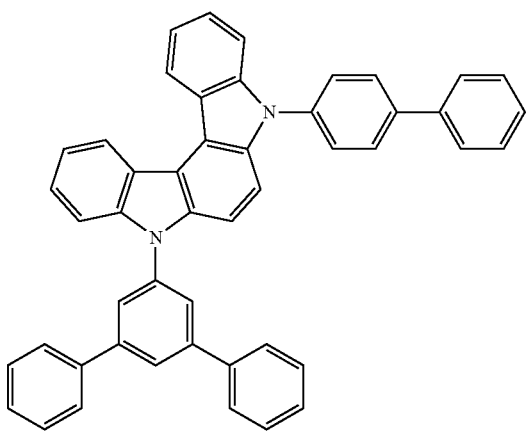
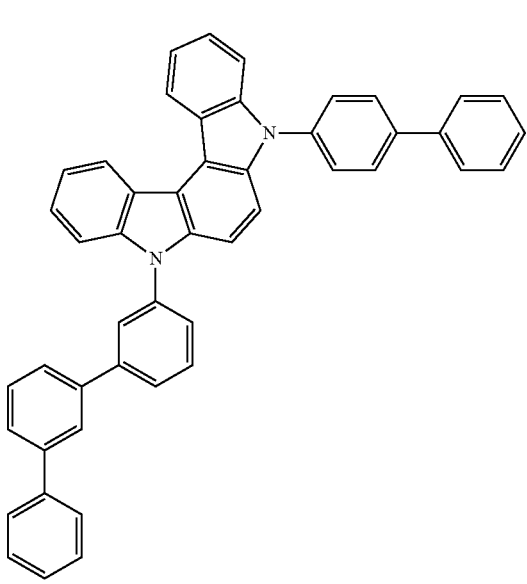
82
-continued
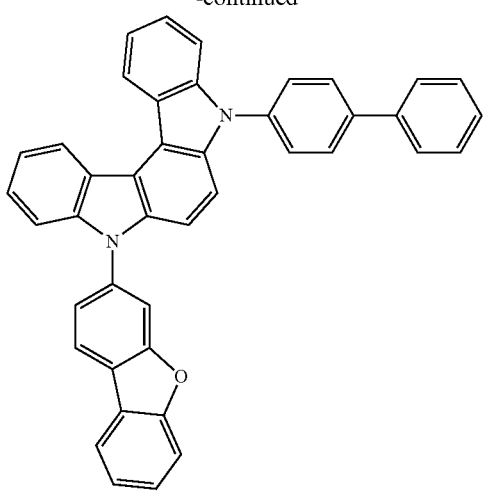
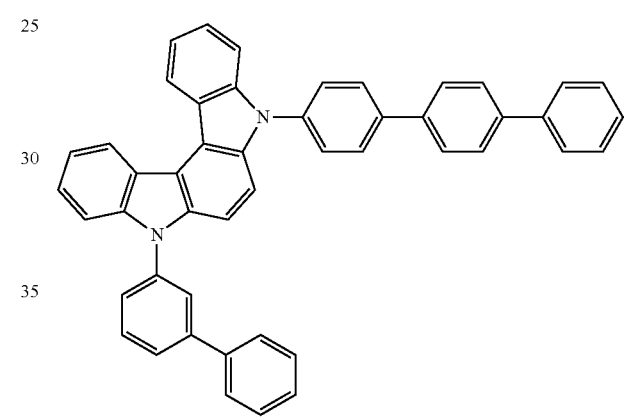
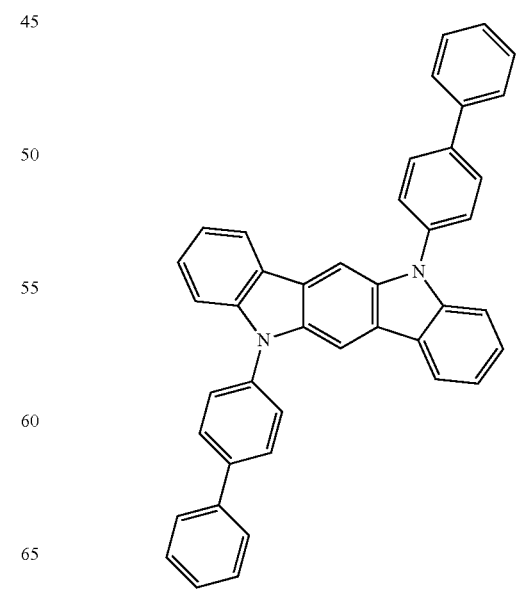

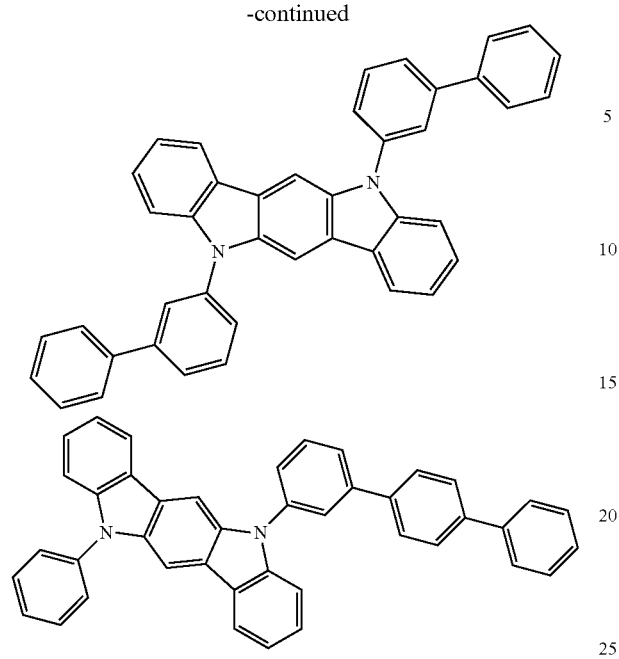
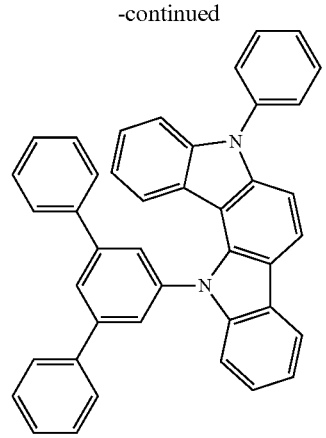
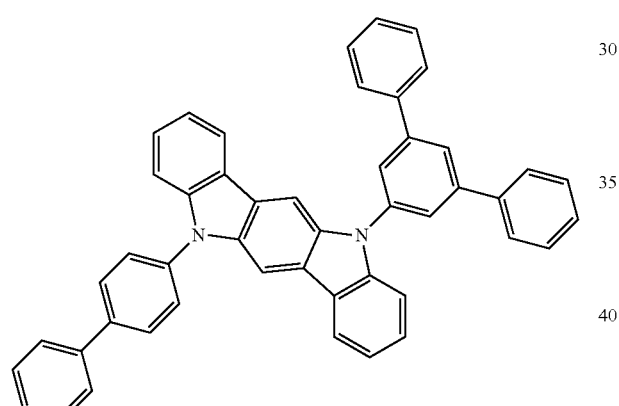
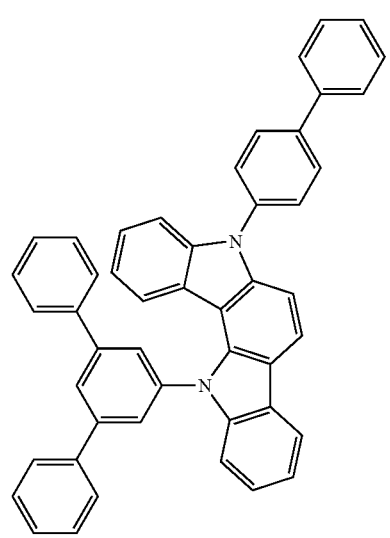
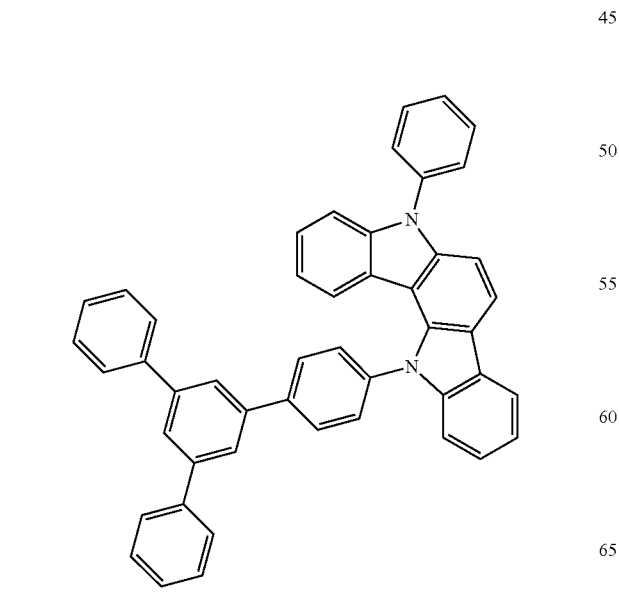
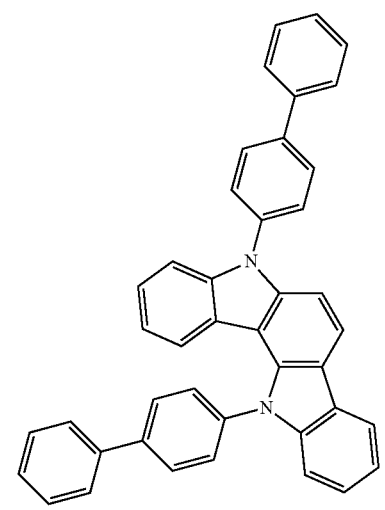

-continued

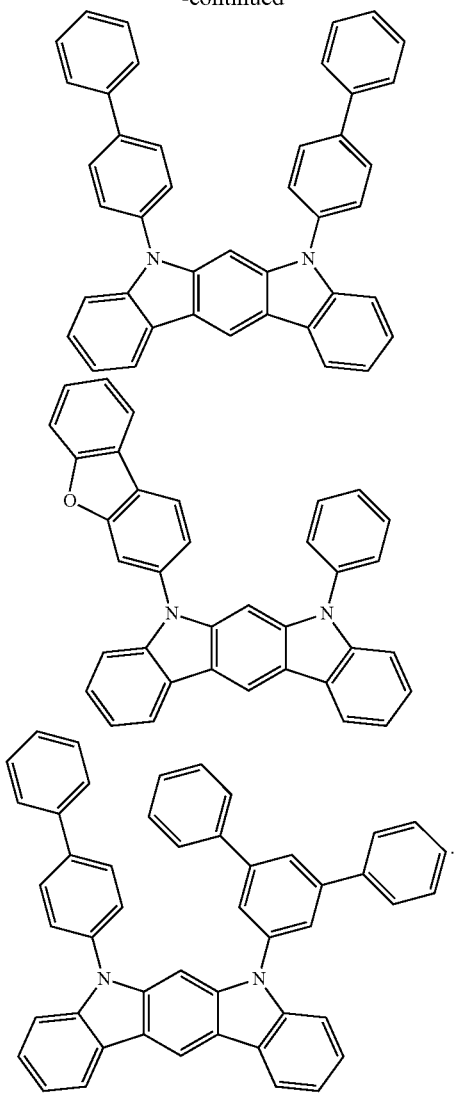

5. The organic light emitting device according to claim 1, wherein:
Ar$_3$ and Ara are each independently any one selected from the group consisting of the following:

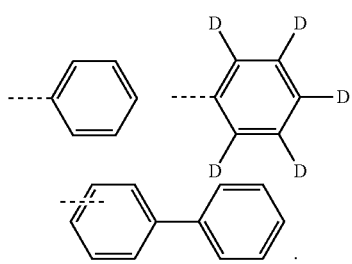

6. The organic light emitting device according to claim 1, wherein:
X$_1$ to X$_3$ all are N.

7. An organic light emitting device, comprising:
an anode, a hole transport layer, a light emitting layer, an electron transport layer, and a cathode,
wherein the light emitting layer comprises a compound of the following Chemical Formula 1 and a compound selected from the group consisting of the following:

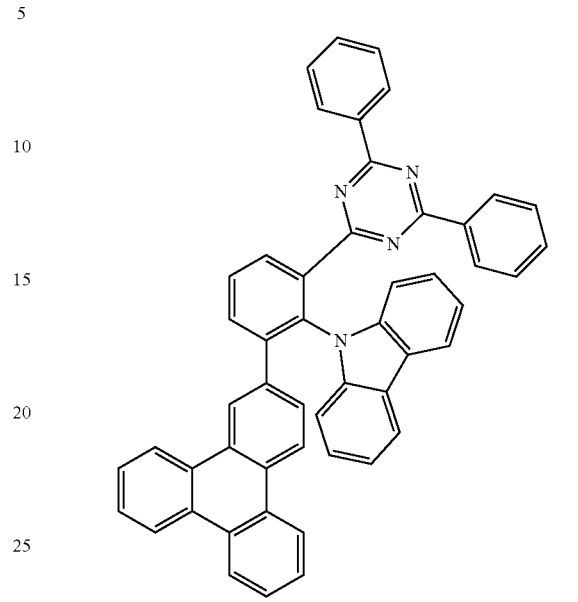

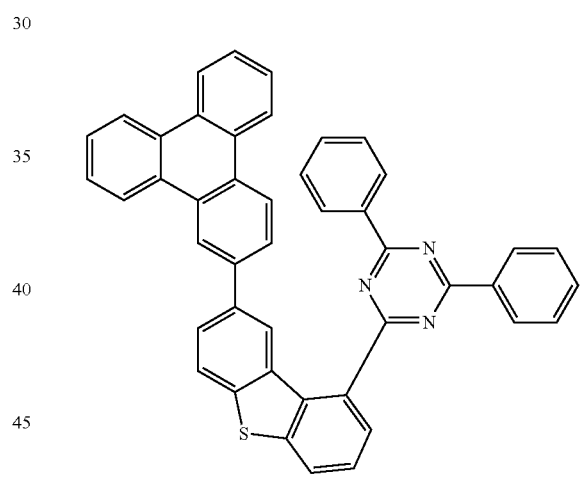

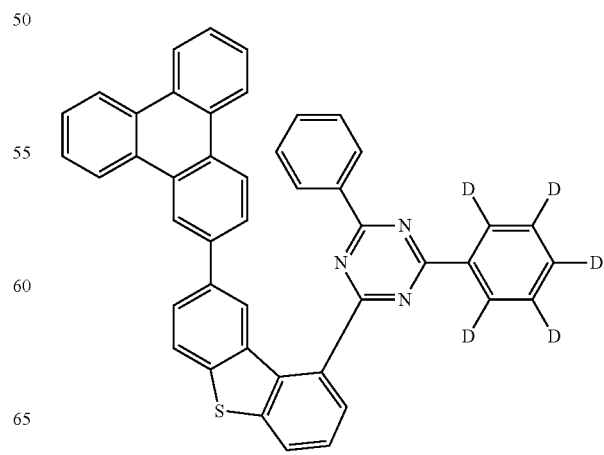

-continued

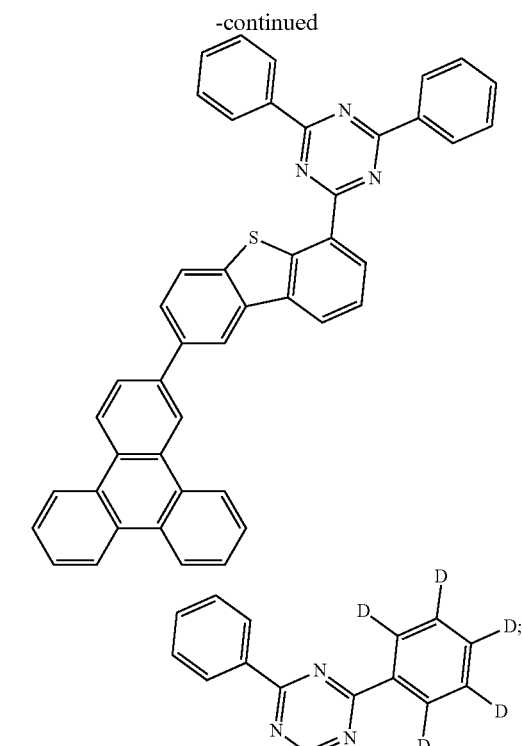

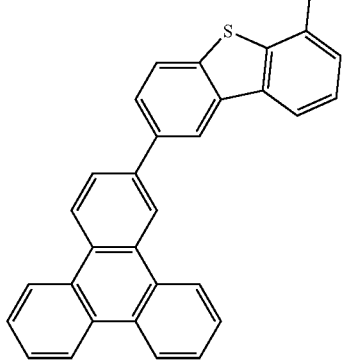

<Chemical Formula 1> wherein in Chemical Formula 1:

A is a benzene ring fused with two adjacent pentagonal rings;

$R_1$ to $R_8$ are each independently hydrogen, deuterium, a substituted or unsubstituted $C_{1-60}$ alkyl, a substituted or unsubstituted $C_{6-60}$ aryl, or a substituted or unsubstituted $C_{2-60}$ heteroaryl containing any one or more heteroatoms selected from the group consisting of N, O and S; and $Ar_1$ and $Ar_2$ are each independently a substituted or unsubstituted $C_{6-60}$ aryl or a substituted or unsubstituted $C_{2-60}$ heteroaryl containing any one or more heteroatoms selected from the group consisting of N, O and S.

8. The organic light emitting device according to claim 1, wherein:

a weight ratio of the compound of Chemical Formula 1 and the compound of Chemical Formula 2 is 5:5 or more and less than 8:2.

9. The organic light emitting device according to claim 7, wherein:

the Chemical Formula 1 is any one of the following Chemical Formula 1-1 to Chemical Formula 1-6:

<Chemical Formula 1-1>

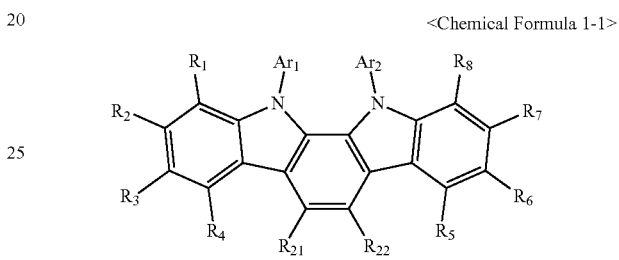

<Chemical Formula 1-2>

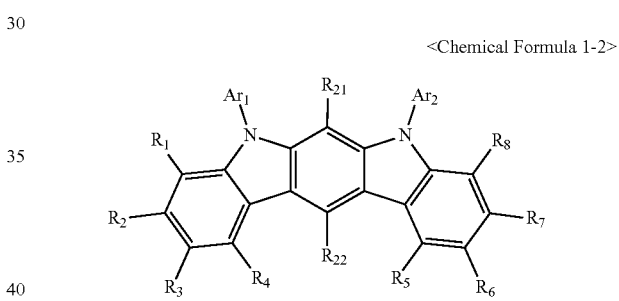

<Chemical Formula 1-3>

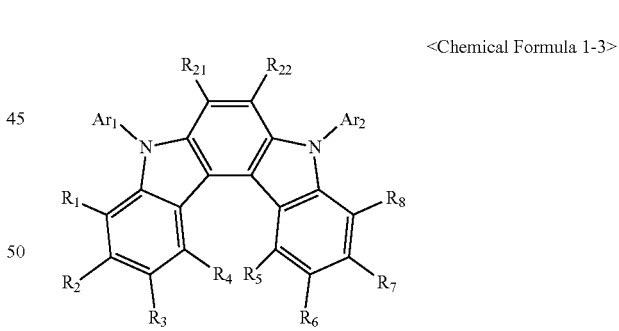

<Chemical Formula 1-4>

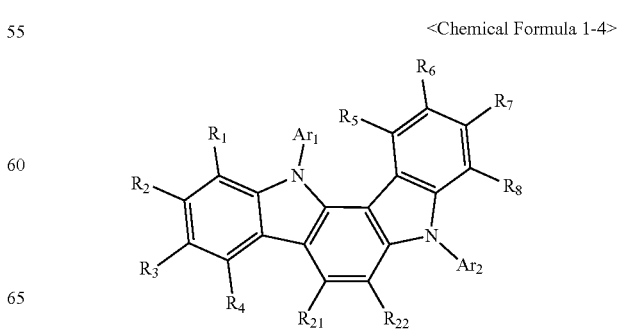

<Chemical Formula 1-5>

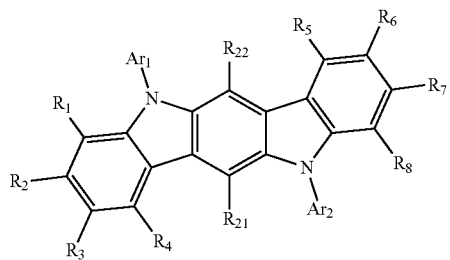

<Chemical Formula 1-6>

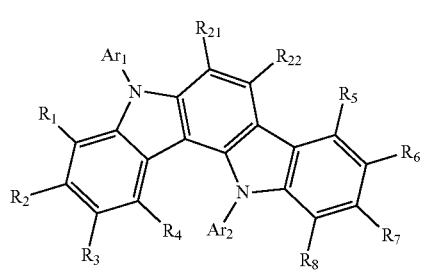

wherein in Chemical Formulas 1-1 to 1-6:

$R_1$ to $R_8$, $Ar_1$ and $Ar_2$ are as defined in claim 1; and $R_{21}$ to $R_{22}$ are each independently hydrogen or deuterium.

10. The organic light emitting device according to claim 7, wherein:

$Ar_1$ and $Ar_2$ are each independently phenyl, biphenylyl, terphenylyl, quaterphenylyl, 3',5'-diphenylbiphenylyl, or dibenzofuranyl.

11. The organic light emitting device according to claim 7, wherein:

the compound of Chemical Formula 1 is any one compound selected from the group consisting of the following compounds:

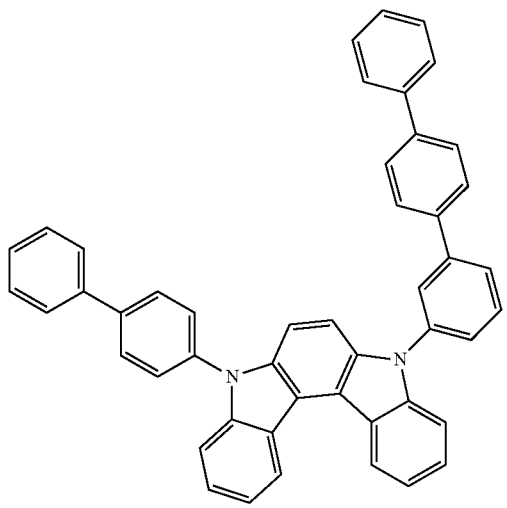

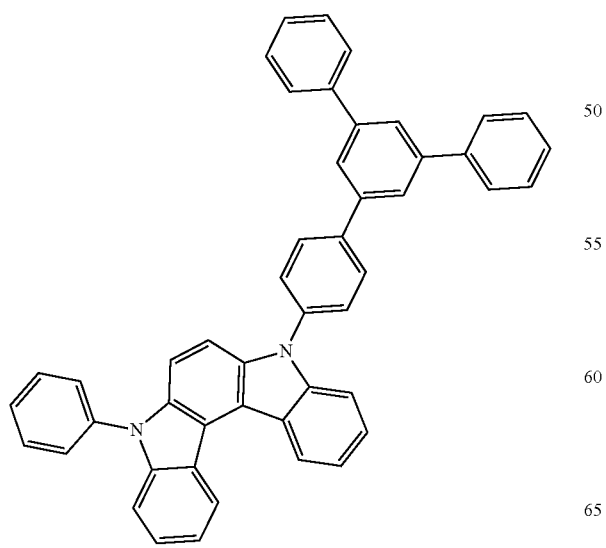

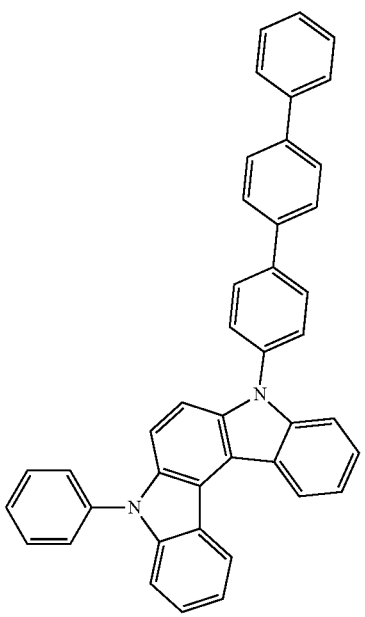

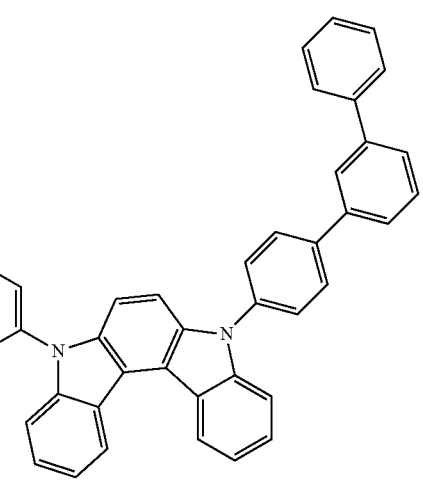

91
-continued
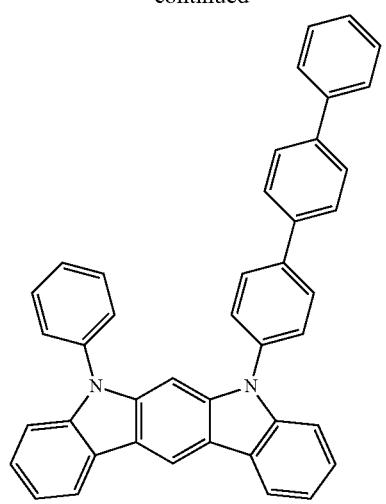
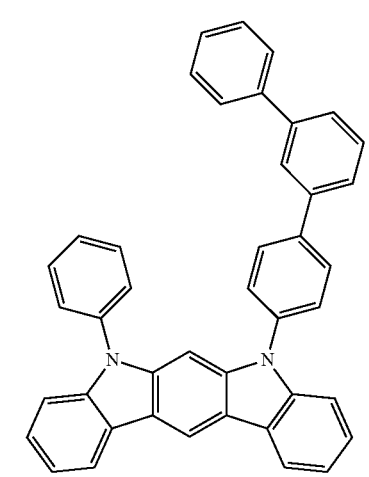
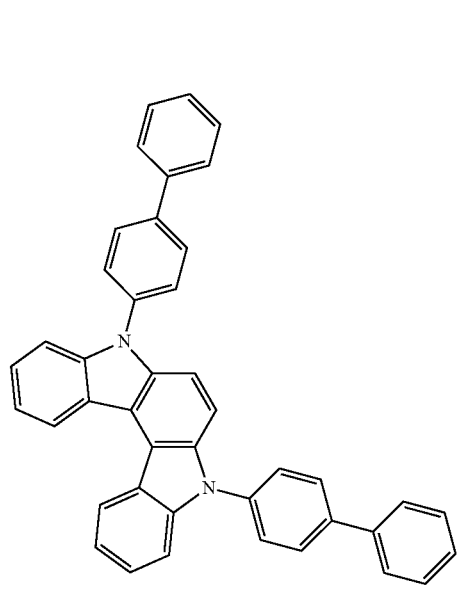
92
-continued
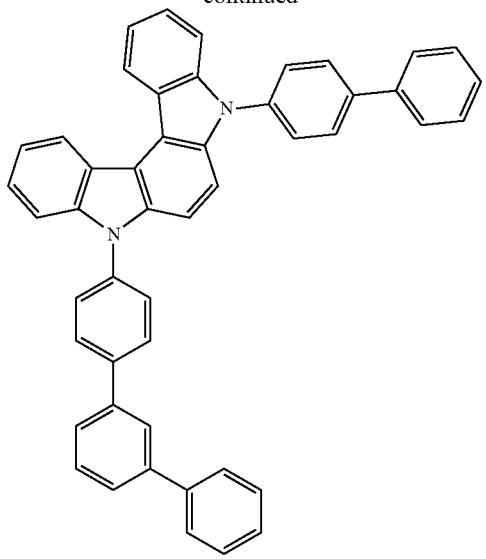
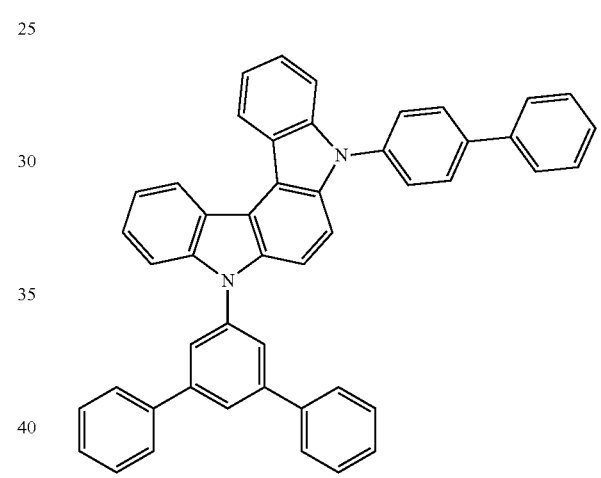
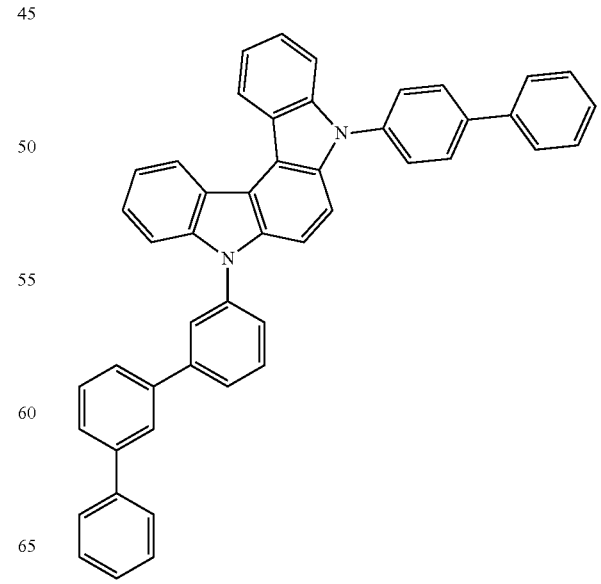

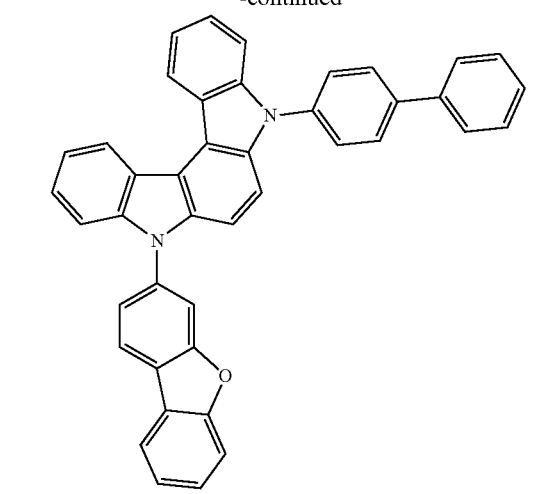
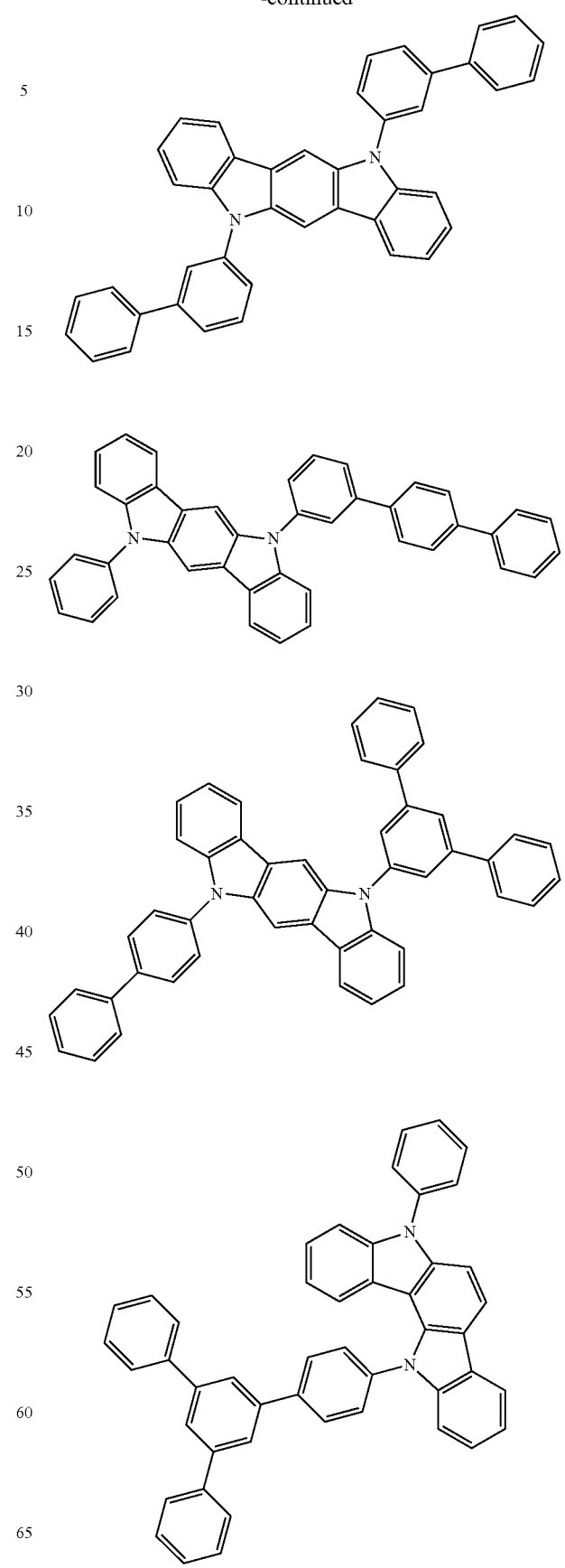

95
-continued
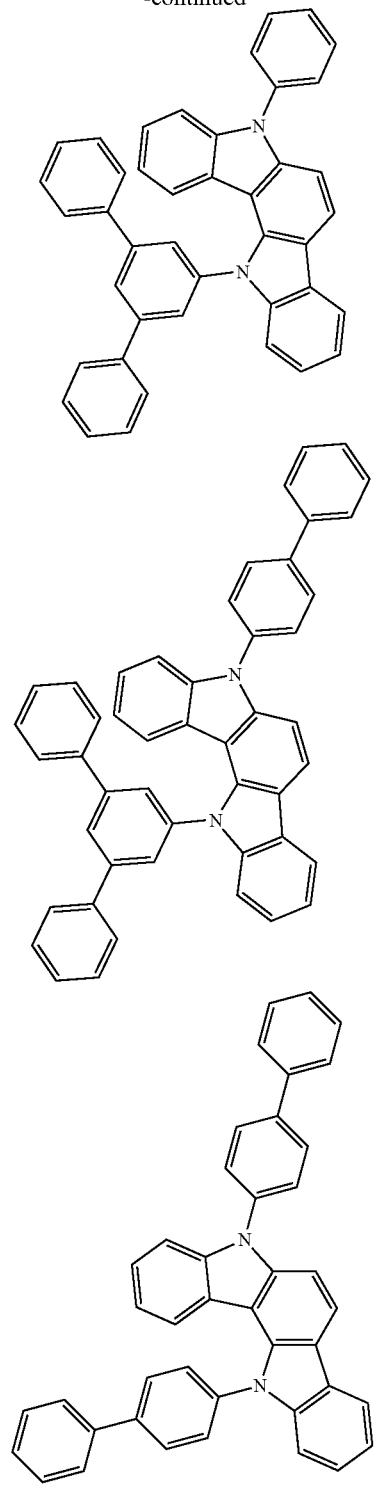
96
-continued
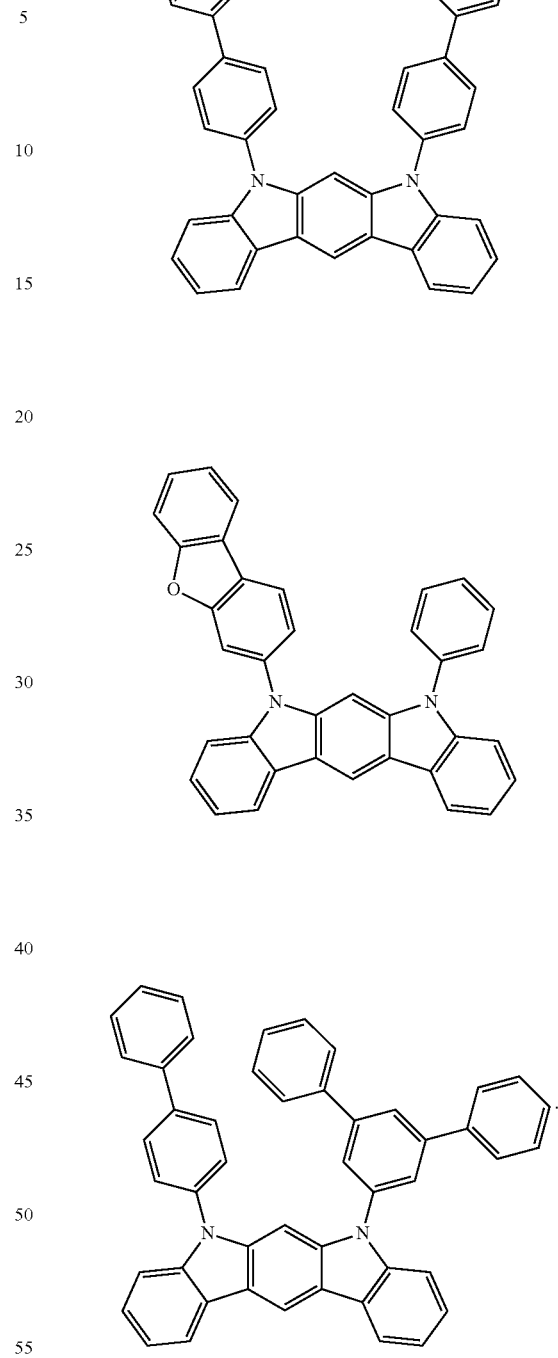
* * * * *